(12) United States Patent
Ren et al.

(10) Patent No.: US 12,297,563 B2
(45) Date of Patent: May 13, 2025

(54) ULTRA-HIGH AMBIPOLAR MOBILITY CUBIC BORON ARSENIDE

(71) Applicant: University of Houston System, Houston, TX (US)

(72) Inventors: Zhifeng Ren, Pearland, TX (US); Jiming Bao, Pearland, TX (US); Shuai Yue, Pearland, TX (US); Fei Tian, Richmond, TX (US); Geethal Amila Udalamatta Gamage, Fremont, CA (US); Gang Chen, Carlisle, MA (US); Jungwoo Shin, Cambridge, MA (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 216 days.

(21) Appl. No.: 18/100,291

(22) Filed: Jan. 23, 2023

(65) Prior Publication Data
US 2023/0257907 A1     Aug. 17, 2023

Related U.S. Application Data

(60) Provisional application No. 63/303,725, filed on Jan. 27, 2022.

(51) Int. Cl.
*C30B 29/40*     (2006.01)
*C01B 35/04*     (2006.01)
(Continued)

(52) U.S. Cl.
CPC .............. *C30B 29/40* (2013.01); *C01B 35/04* (2013.01); *C30B 25/16* (2013.01); *C30B 25/18* (2013.01);
(Continued)

(58) Field of Classification Search
CPC ...... H05K 3/0097; H05K 3/34; H05K 3/3452; C01B 35/04; C01P 2002/72;
(Continued)

(56) References Cited

U.S. PATENT DOCUMENTS 7,709,860 B2     5/2010     Dang et al.

FOREIGN PATENT DOCUMENTS

| EP | 0064370 B1 | 6/1989 |
| WO | 2020/068200 A2 | 4/2020 |

OTHER PUBLICATIONS

Liu, Te-Huan et al., "Simultaneously High Electron and Hole Mobilities in Cubic Boron-V Compounds: BP, BAs, and BSb," Phys. Rev. B 98, 081203(R)—Published Aug. 27, 2018 (19 p.).
Bushick, Kyle et al., "Boron Arsenide Heterostructures: Lattice-Matched Heterointerfaces and Strain Effects on Band Alignments and Mobility," npj Computational Materials, vol. 6, No. 3, 2020 (7 p.).
(Continued)

*Primary Examiner* — Lawrence D Ferguson
(74) *Attorney, Agent, or Firm* — CONLEY ROSE, P.C.

(57) ABSTRACT

Herein provided are cubic boron arsenide (c-BAs) single crystals having an unexpectedly high ambipolar mobility at room temperature, $\mu_a$, at one or more locations thereof that is greater than or equal to 1500, 1600, 1700, 1800, 1900, 2000, 2100, 2200, 2300, 2400, 2500, 2600, 3000, 4000, 5000, 6000, 7000, 8000, 9000, or 10000 $cm^2V^{-1}s^{-1}$, wherein the ambipolar mobility is defined as: $\mu_a = 2\mu_e\mu_h/(\mu_e + \mu_h)$, wherein $\mu_e$ is electron mobility and $\mu_h$ is hole mobility, and having a room temperature thermal conductivity at the one or more locations thereof that is greater than or equal to 1000 $Wm^{-1}K^{-1}$. Methods of making and using the c-BAs single crystals are also provided.

19 Claims, 45 Drawing Sheets

(51) Int. Cl.
    *C30B 25/16* (2006.01)
    *C30B 25/18* (2006.01)
(52) U.S. Cl.
    CPC ...... *C01P 2002/72* (2013.01); *C01P 2002/76* (2013.01); *C01P 2002/82* (2013.01); *C01P 2002/84* (2013.01); *C01P 2004/02* (2013.01); *C01P 2004/03* (2013.01); *C01P 2006/32* (2013.01); *C01P 2006/40* (2013.01); *C01P 2006/80* (2013.01)

(58) Field of Classification Search
    CPC .............. C01P 2002/76; C01P 2002/82; C01P 2002/84; C01P 2004/02; C01P 2004/03; C01P 2006/32; C01P 2006/40; C01P 2006/80; C30B 25/00; C30B 25/16; C30B 25/18; C30B 29/40
    See application file for complete search history.

(56) References Cited

OTHER PUBLICATIONS

Shin, Jungwoo et al., "High Ambipolar Mobility in Cubic Boron Arsenide," Science, vol. 377, pp. 437-440, Jul. 22, 2022 (34 p.).
Yue, Shuai et al., "High Ambipolar Mobility in Cubic Boron Arsenide Revealed by Transient Reflectivity Microscopy," Science, vol. 377, pp. 433-436, Jul. 22, 2022 (15 p.).
PCT/US2023/011346 International Search Report and Written Opinion dated Apr. 17, 2023 (16 p.).
Tian, Fei et al., "Unusual High Thermal Conductivity in Boron Arsenide Bulk Crystals," Science, vol. 361, No. 6402, Jul. 5, 2018 (5 p.).
Gamage, Geethal Amila Udalamatta, "Achieving Ultrahigh Thermal Conductivity and Carrier Mobility in Boron Arsenide Single Crystals," Disseratation, https: //uh-ir.tdl.org/handle/10657/10222, May 1, 2021 (2 p.).
Gamage, Geethal Amila Udalamatta et al., "Effect of Nucleation Sites on the Growth and Quality of Single-Crystal Boron Arsenide," arxiv.org, Cornell University Library, Oct. 4, 2019 (8 p.).

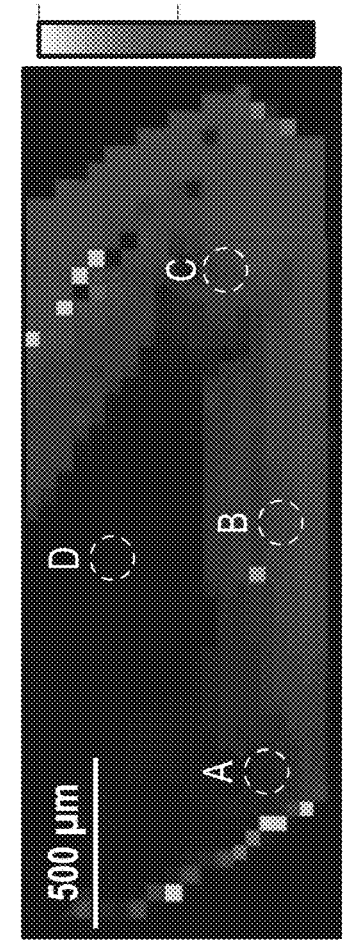
FIG. 1D
FIG. 1E
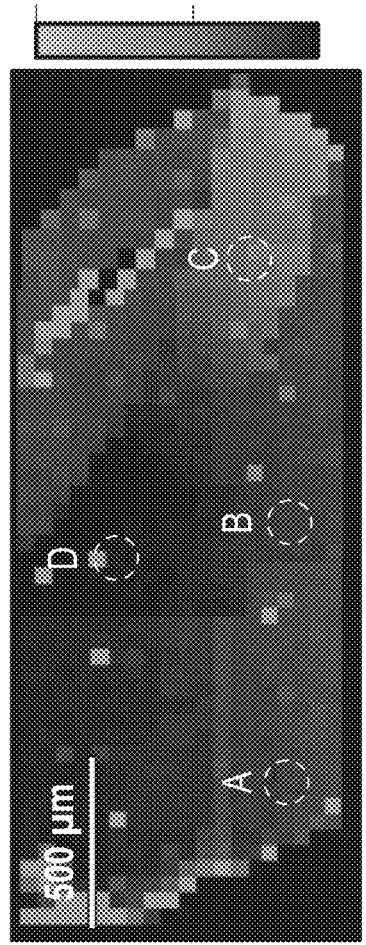
FIG. 1F
FIG. 1G

FIG. 2A
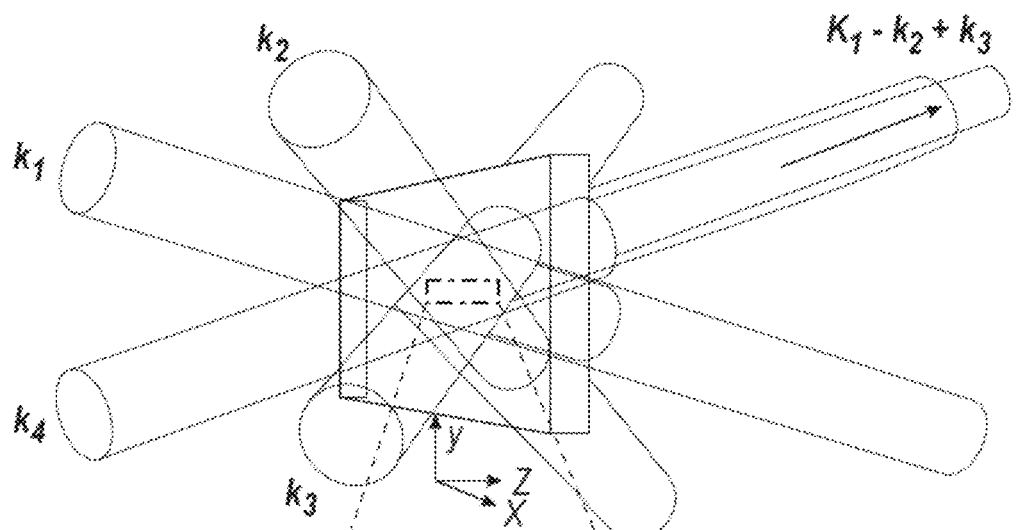
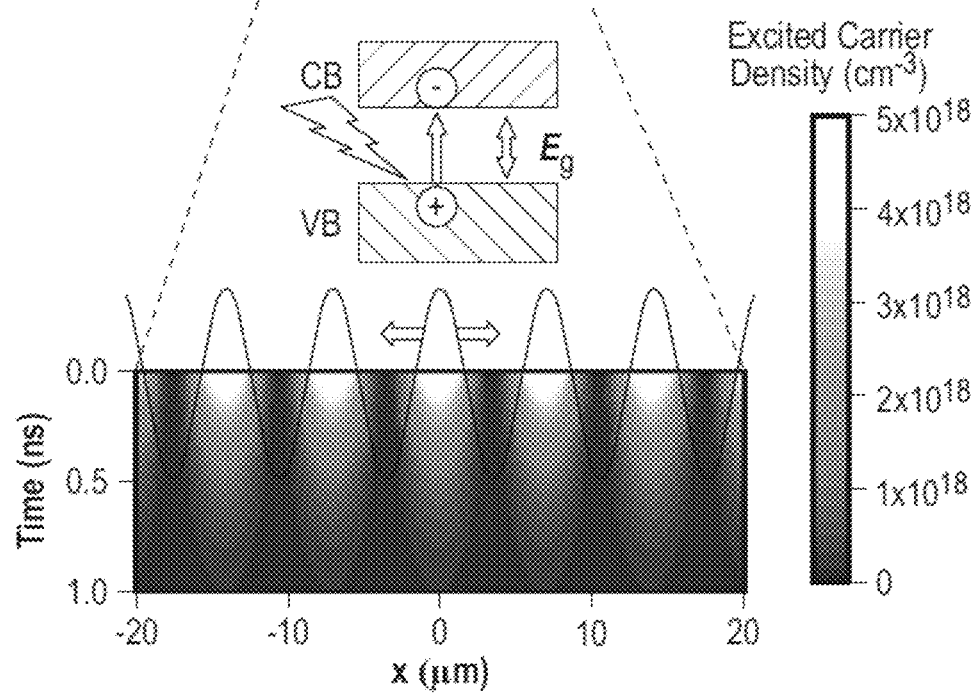
FIG. 2B

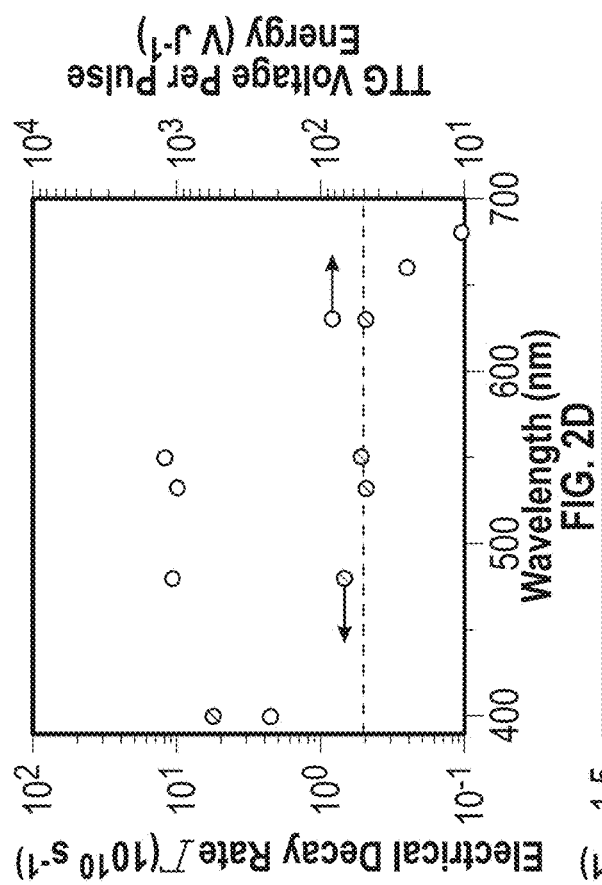
FIG. 2C
FIG. 2D
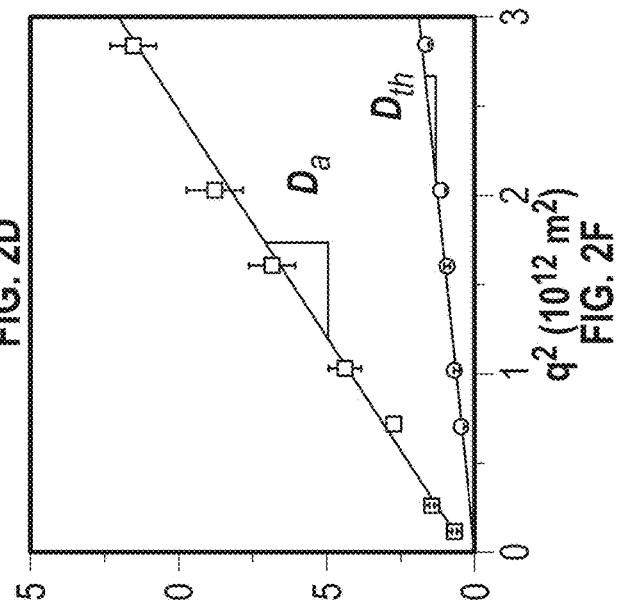
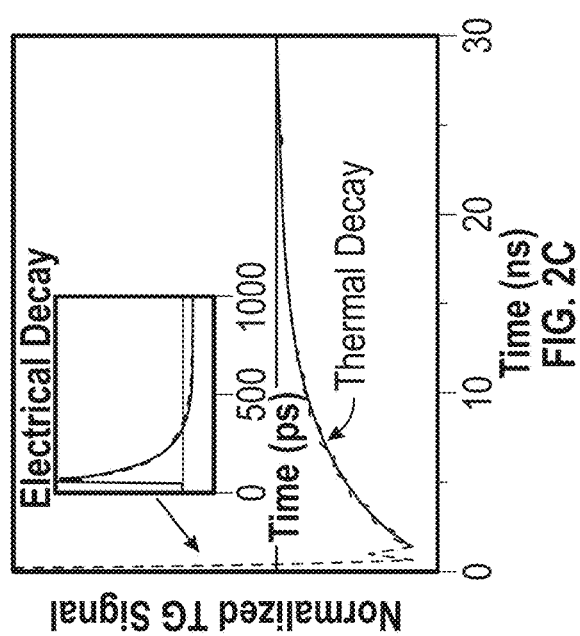
FIG. 2E
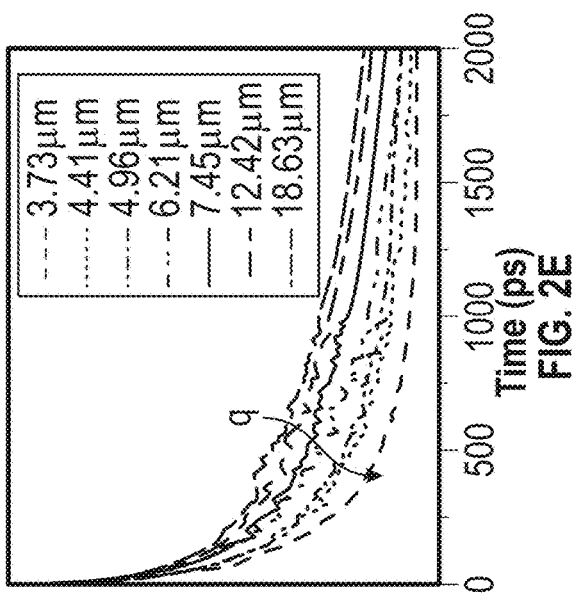
FIG. 2F

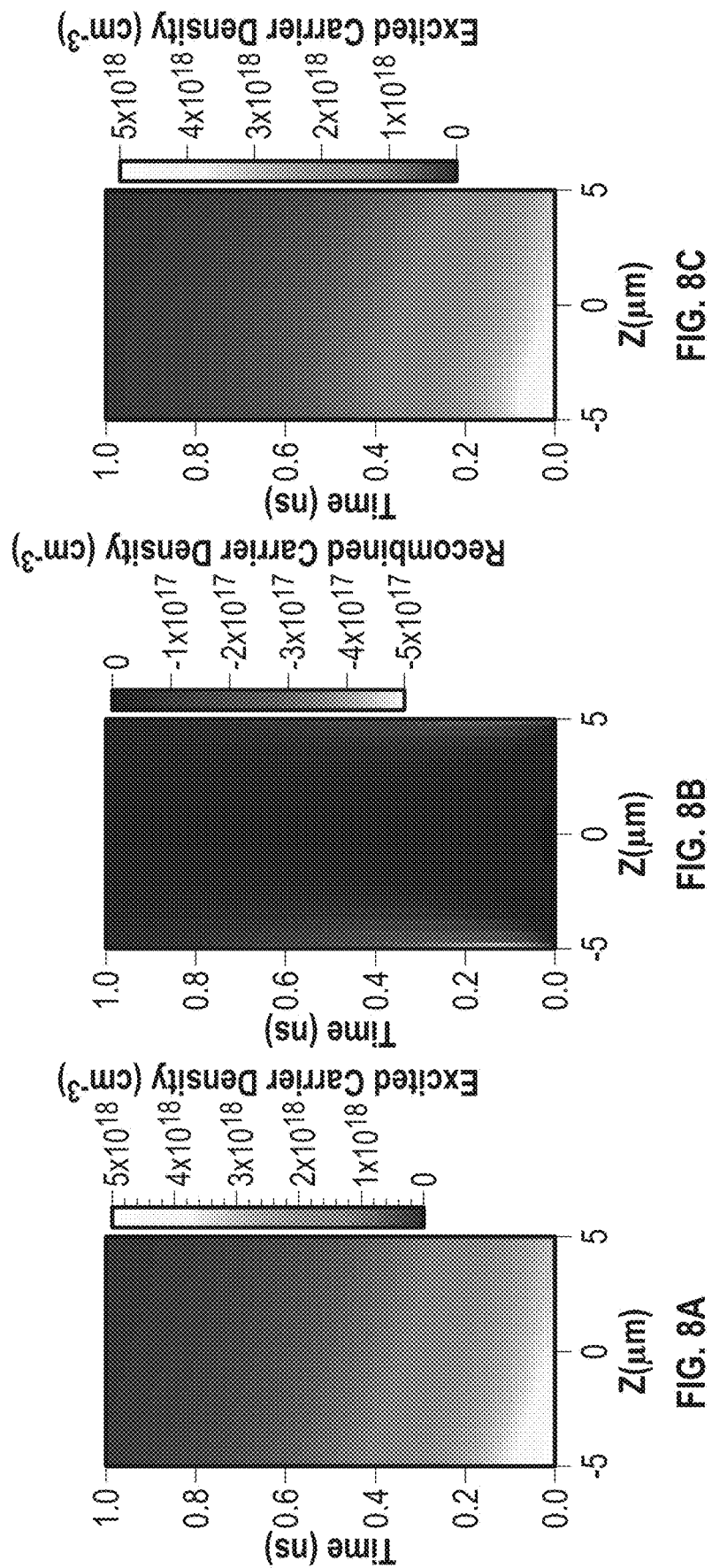

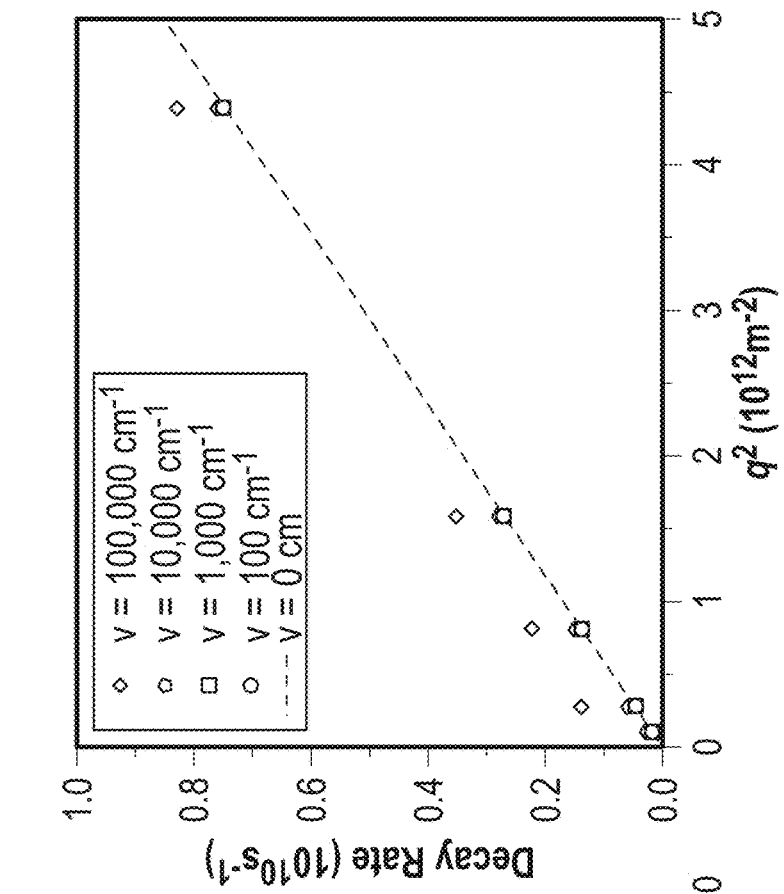
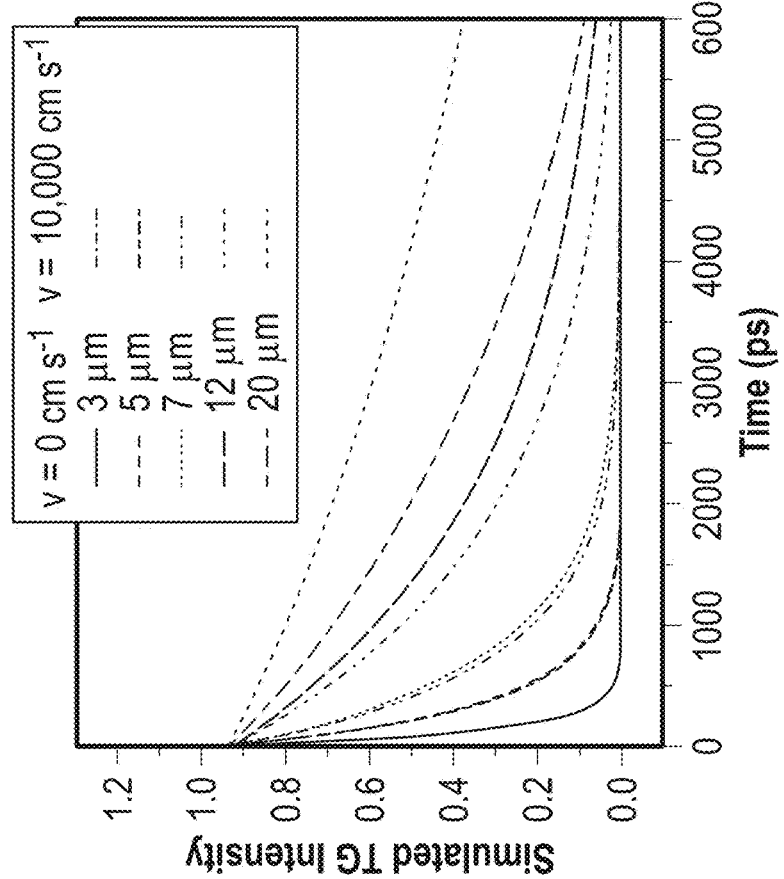
FIG. 9B
FIG. 9A

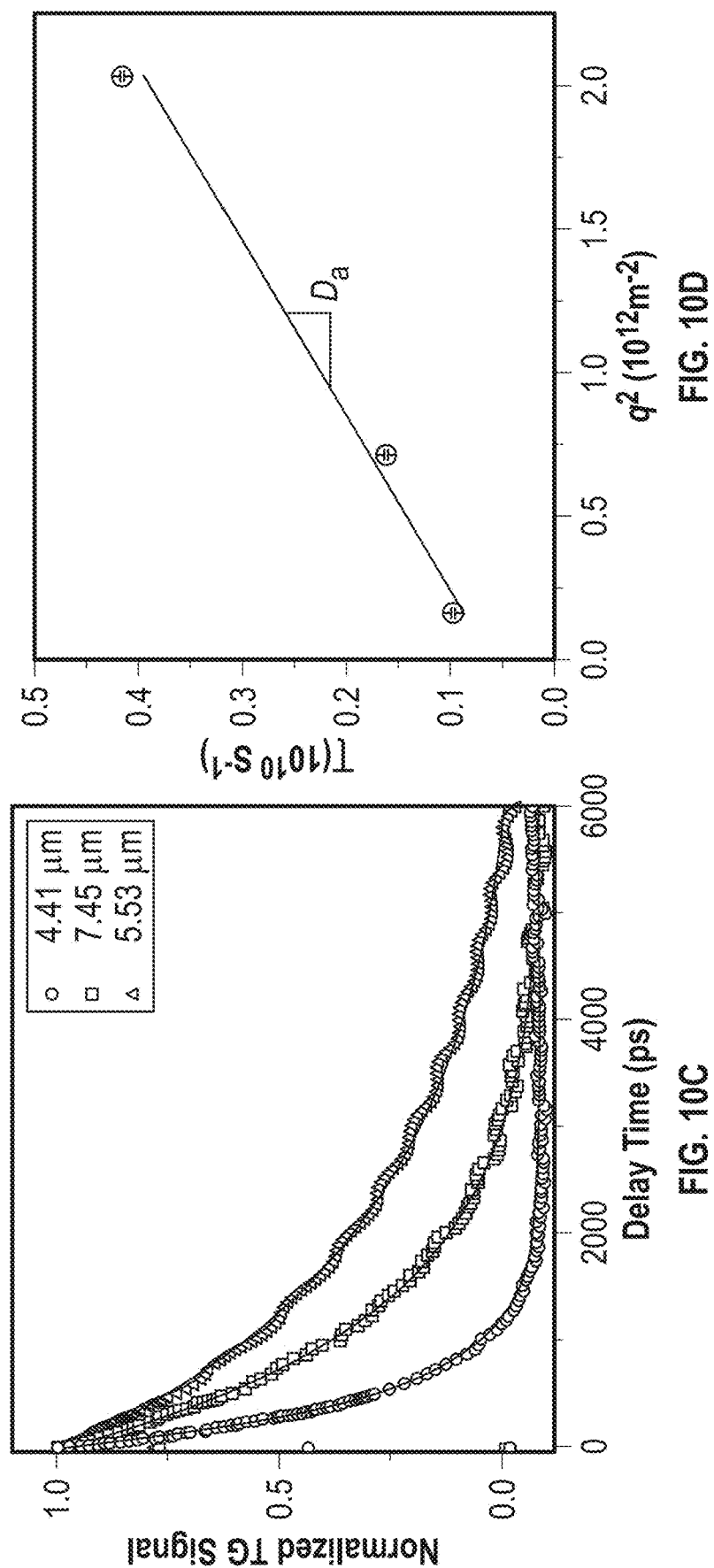

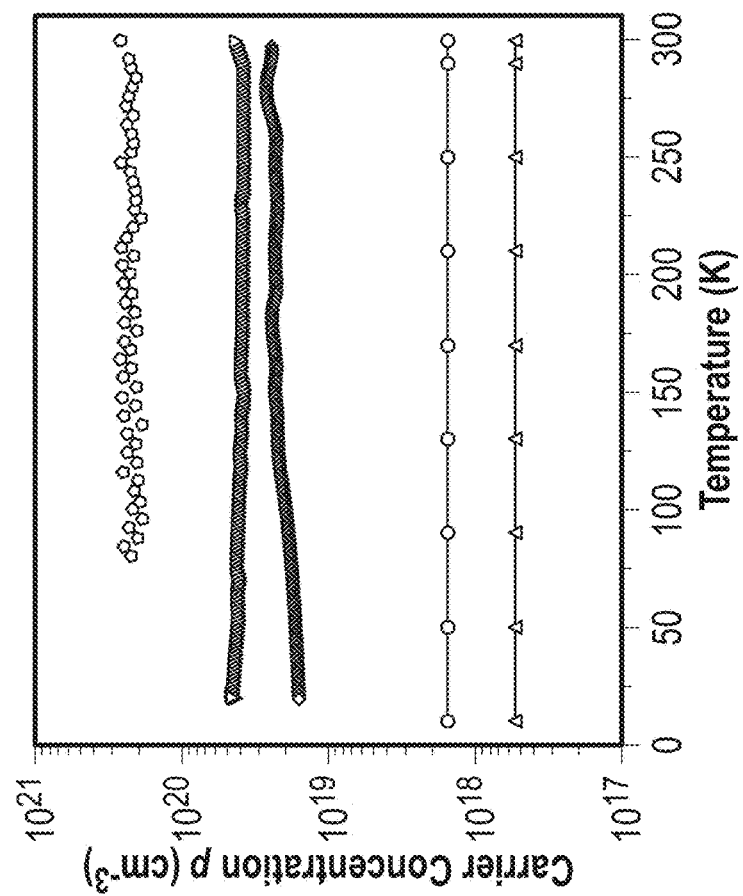
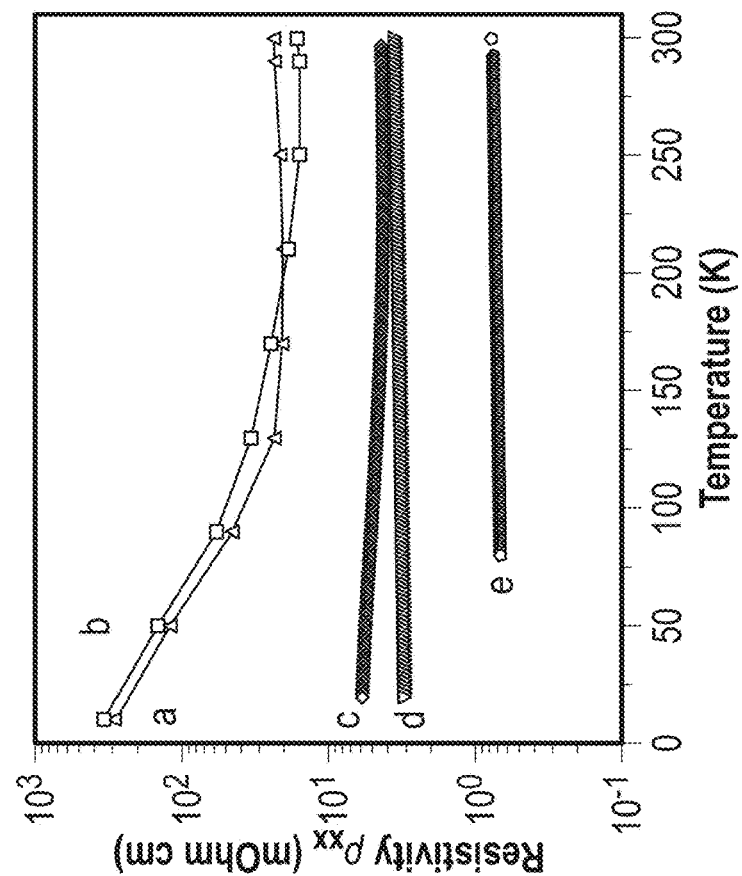
FIG. 16A
FIG. 16B

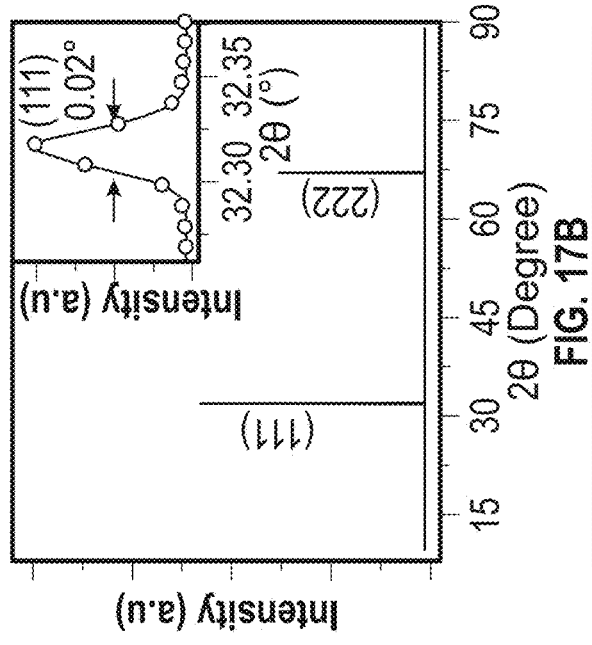
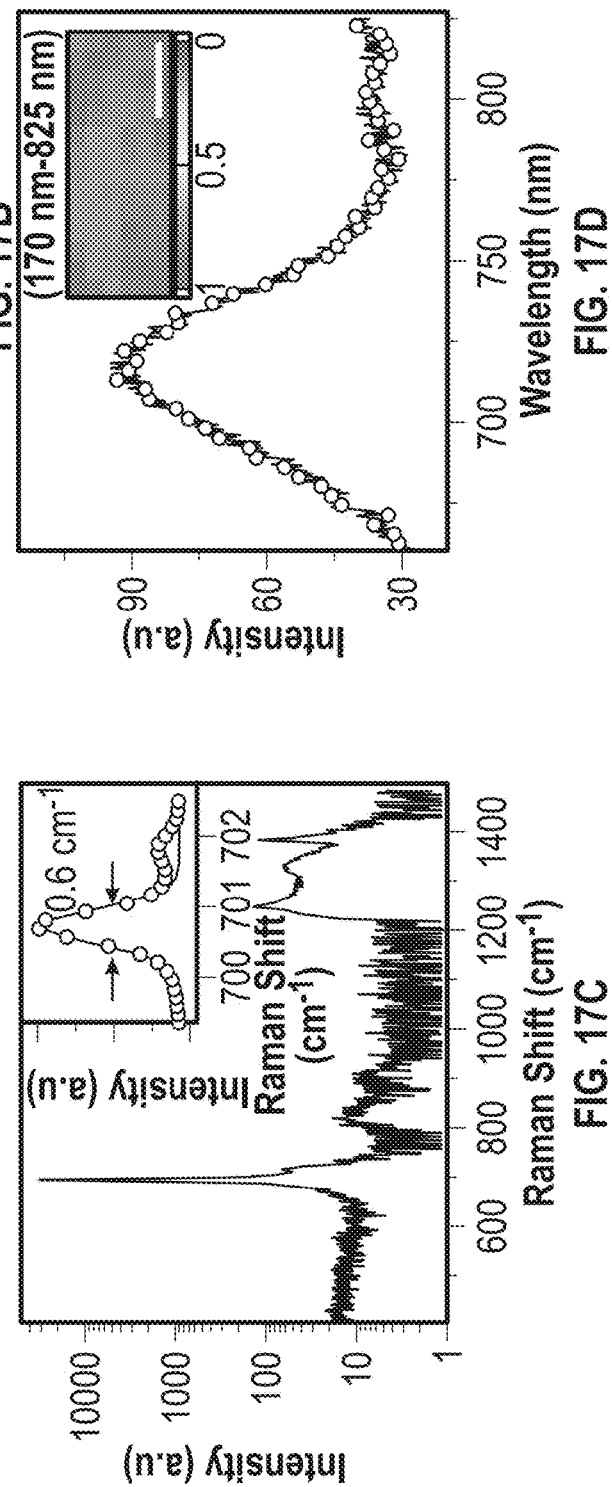
FIG. 17A
FIG. 17B
FIG. 17C
FIG. 17D

ULTRA-HIGH AMBIPOLAR MOBILITY CUBIC BORON ARSENIDE

CROSS REFERENCE TO RELATED APPLICATIONS

This application claims benefit of U.S. provisional patent application Ser. No. 63/303,725 filed Jan. 27, 2022, and entitled "Ultra-High Ambipolar Mobility Cubic Boron Arsenide," the disclosure of which is hereby incorporated herein by reference in its entirety for all purposes.

STATEMENT REGARDING FEDERALLY SPONSORED RESEARCH OR DEVELOPMENT

This work was done with government support by the Office of Naval Research under Multidisciplinary University Research Initiative (MURI) grant N00014-16-1-2436. This work made use of the MRSEC Shared Experimental Facilities at MIT, supported by the National Science Foundation under award number DMR-1419807, Welch Foundation (E-1728), and a UH Small Equipment Grant (Award No. 000182016). The Government has certain rights in the invention.

TECHNICAL FIELD

The present disclosure relates to cubic boron arsenide (c-BAs) and methods of making same; more specifically, the present disclosure relates to c-BAs having ultrahigh ambipolar mobility; still more specifically, the present disclosure relates to c-BAs having ultrahigh ambipolar mobility suitable for use in semiconductor, electronic, and optoelectronic devices.

BACKGROUND

Semiconductors with high thermal conductivity and electron-hole mobility are of great importance for electronic and photonic devices as well as for fundamental studies. Heretofore, there have been no semiconductors having the combination of thermal conductivity higher than 1000 W m$^{-1}$ K$^{-1}$ at room temperature and mobility higher than 1500 cm$^2$ s$^{-1}$ V$^{-1}$ at room temperature.

Accordingly, a need exists for materials that exhibit high carrier mobility. Desirably, the material provides for high thermal conductivity in combination with high carrier mobility.

SUMMARY OF THE DISCLOSURE

Embodiments of the present disclosure are described in detail with reference to the drawings wherein like reference numerals identify similar or identical elements.

In aspects of the present disclosure, disclosed herein are cubic boron arsenide (c-BAs) single crystals having an ambipolar mobility, $\mu_a$, at room temperature, at one or more locations thereof that is greater than or equal to 1500, 1600, 1700, 1800, 1900, 2000, 2100, 2200, 2300, 2400, 2500, 2600, 3000, 4000, 5000, 6000, 7000, 8000, 9000, or 10000 cm$^2$V$^{-1}$s$^{-1}$, and a room temperature thermal conductivity at the one or more locations thereof that is greater than or equal to 1000 Wm$^{-1}$K$^{-1}$, wherein the ambipolar mobility is defined as: $\mu_a=2\mu_e\mu_h/(\mu_e+\mu_h)$, wherein $\mu_e$ is electron mobility and $\mu_h$ is hole mobility.

Also provided herein is a method of producing one or more bulk cubic boron arsenide (c-BAs) crystals, the method comprising: producing, during a first chemical vapor transport (CVT) process, single BAs crystals using a purified boron (B) source and a purified arsenic (As) source; and using at least a portion of the single BAs crystals to produce a bulk c-BAs crystal via a second CVT process, such that a number (e.g., a sparsity) of nucleation centers is controlled during the second CVT process, wherein the one or more crystals have an (e.g., observed) room temperature, ambipolar mobility, $\mu_a$, at one or more locations thereof that is greater than or equal to about 1500, 1600, 1700, 1800, 1900, 2000, 2100, 2200, 2300, 2400, 2500, 2600, 3000, 4000, 5000, 6000, 7000, 8000, 9000, or 10000 cm$^2$V$^{-1}$s$^{-1}$, and a room temperature thermal conductivity at the one or more locations thereof that is greater than or equal to 1000 Wm$^{-1}$K$^{-1}$, wherein the ambipolar mobility is defined as: $\mu_a=2\mu_e\mu_h/(\mu_e+\mu_h)$, wherein $\mu_e$ is electron mobility and $\mu_h$ is hole mobility.

Further provided herein is a semiconductor, electronic or optoelectronic device comprising: cubic boron arsenide (c-BAs) comprising single crystals having an ambipolar mobility, $\mu_a$, at room temperature, at one or more locations thereof that is greater than or equal to about 1500, 1600, 1700, 1750, 1800, 1850, 1900, 1950, 2000, 2050, 2100, 2150, 2200, 2250, 2300, 2350, 2400, 2450, 2500, 2550, 2600, 3000, 4000, 5000, 6000, 7000, 8000, 9000, or 10000 cm$^2$V$^{-1}$s$^{-1}$, and a room temperature thermal conductivity at the one or more locations thereof that is greater than or equal to 1000 Wm$^{-1}$K$^{-1}$, wherein the ambipolar mobility is defined as: $\mu_a=2\mu_e\mu_h/(\mu_e+\mu_h)$, wherein $\mu_e$ is electron mobility and $\mu_h$ is hole mobility.

Also disclosed herein is a process comprising: utilizing c-BAs as described herein in an electronic or optoelectronic process, wherein the process has an increased performance (e.g., speed) and/or level of integration relative to a same process operated with silicon, due to the higher ambipolar mobility provided by the c-BAs disclosed herein relative to an ambipolar mobility of silicon.

BRIEF DESCRIPTION OF THE DRAWINGS

A better understanding of the features and advantages of the disclosed technology will be obtained by reference to the following detailed description that sets forth illustrative embodiments, in which the principles of the technology are utilized, and the accompanying drawings of which:

FIGS. 1A-1G depict the optical characterization of c-BAs single crystals: FIG. 1A depicts an optical photograph; FIG. 1B depicts an SEM image; and FIG. 1C depicts XRD; FIG. 1D depicts a typical PL spectrum; and FIG. 1E depicts 2D PL intensity mapping integrated over 100 nm spectrum range for each spot in which the dashed circles show TG measurement spots; FIG. 1F depicts a typical Raman spectrum, and FIG. 1G depicts 2D mapping of background Raman scattering intensity integrated over 100 cm$^{-1}$ for each spot;

FIGS. 2A-2F depict thermal and electron transport measurements: FIG. 2A depicts schematic illustration of TG experiments; FIG. 2B depicts calculated time-dependent electron-hole pair density in c-BAs; FIG. 2C depicts TG signal for c-BAs; thermal conductivity is calculated from exponential fitting (black line); FIG. 2D depicts wavelength-dependent electrical decay rate $\Gamma$; FIG. 2E depicts TG signal with varying diffraction grating periods q; and FIG. 2F depicts electrical and thermal decay rate versus $q^2$.

FIG. 3A depicts calculated thermal conductivity; and FIG. 3B depicts ambipolar mobility with neutral (solid lines) and charged (dashed lines) group-IV impurities, open circles are $\mu_h$ of bulk samples measured by electrical probes (FIG. 16); FIG. 3C depicts calculated electron-phonon, and short- and long-range scattering rates with electron energy relative to the valence band valley ($Si_{As}^-=10^{18}$ cm$^{-3}$); and FIG. 3D depicts thermal conductivity (solid lines) and mobility (dashed lines) differences between charged and neutral impurities.

FIG. 4A depicts measured mobility and thermal conductivity of c-BAs from different batches (0, I, II, III, IV), See Table 1 for details; The solid and dashed lines show the calculated $\mu_a$ and κ with varying concentrations of neutral $Si_{As}^0$ and charged $Si_{As}^-$, respectively; FIG. 4B depicts temperature-dependent ambipolar mobility of c-BAs (III-a, III-b); The solid and dashed line shows calculated $\mu_a$ of pristine c-BAs and Si.

FIG. 5A depicts Raman spectrum; and FIG. 5B depicts the corresponding FWHM and $A_{BG}$ of c-BAs crystals from different batches; $A_{BG}$ is integrated over 100 cm$^{-1}$.

FIG. 6A depicts optical microscopy images of 110-nm Au coated eight c-BAs single crystal (Batch III and IV)—Number 1-5 indicates the FDTR measurement spots from each sample; FIG. 6B depicts thermal conductivity of eight c-BAs crystals.

FIGS. 8A-8C depicts photoexcited carrier density profile in c-BAs: FIG. 8A depicts calculated time-dependent photoexcited minority carrier density change by lateral diffusion and FIG. 8B depicts calculated time-dependent photoexcited minority carrier density change by surface recombination; FIG. 8C depicts total photoexcited minority carrier density of c-BAs after TG excitation.

FIGS. 9A-9C depict the effect of surface recombination in TG experiments: FIG. 9A depicts calculated TG signal with and without surface recombination with varying grating periods from 3 to 20 μm; FIG. 9B depicts Γ vs. $q^2$ with varying surface recombination velocities; and FIG. 9C depicts $1/\tau_{eff}$ of TG curves as a function of surface recombination velocity v.

FIGS. 10A-10D depict TG measurement for Si membrane: FIG. 10A depicts TG signal with varying φ at the grating period of 9 μm; FIG. 10B depicts measured and fitted TG thermal decay curve at the grating period of 9 μm—the dashed line shows calculated TG curves with κ±20%; FIG. 10C depicts measured and fitted TG electrical decay curve for the Si membrane with varying grating periods; and FIG. 10D depicts electrical decay rate κ vs. $q^2$ for Si.

FIG. 12A depicts optical microscope image of C-doped c-BAs; and FIG. 12B depicts optical microscope image of pristine c-BAs.

FIG. 13A depicts optical microscopy; FIG. 13B depicts 2D integrated background Raman scattering intensity mapping; and FIG. 13C depicts 2D integrated PL intensity mapping of a c-BAs single crystal (batch IV).

FIG. 14A depicts uncorrected defect potentials directly extracted from first-principles calculations for c-BAs with a Si dopant on a B site (solid points), compared with the analytic long-range Coulomb potential (solid line) calculated based on relationship (25), described in Example 1 hereinbelow; The three-dimensional defect potentials are projected as a function of the distance from the defect, located at the center of the supercell; FIG. 14B depicts corrected defect potentials, showing a short-range nature thereof; here, in calculating the defect potential, the atomic relaxation is ignored to emphasize the long-range decaying part; the potentials at the farthest location away from the defect have also been aligned to zero.

FIG. 15A depicts TG signals for III-a samples measured from 200 K to 400 K at a grating period of 7.45 μm; and FIG. 15B depicts III-b samples measured from 200 K to 400 K at a grating period of 7.45 μm.

FIGS. 16A-16C depict Hall effect measurements: FIG. 16A depicts temperature-dependent resistivity ($\rho_{xx}$) of c-BAs samples; FIG. 16B depicts carrier concentration n of c-BAs samples; and FIG. 16C depicts Hall mobility ($\mu_H$) of c-BAs samples; all samples here from Batch III.

FIGS. 17A-17D depict characterizations of a c-BAs single crystal (Sample 1) on a corner facet (111): FIG. 17A depicts Scanning electron microscopy image; FIG. 17B depicts X-ray diffraction pattern. Inset: magnified view of the (111) peak; FIG. 17C depicts Raman spectrum excited by a 532 nm laser, with inset showing high-resolution spectrum of the LO phonon; and FIG. 17D depicting photoluminescence spectrum excited by a 593 nm laser, with inset showing photoluminescence mapping from the region marked by a rectangle in FIG. 17A, Scale bar: 10 μm.

FIG. 18A depicts a schematic illustration of the experimental setup; FIG. 18B depicts evolution of a 2D transient reflectivity microscopy image from a spot on sample 1, Scale bar: 1 μm; FIG. 18C depicts typical transient reflectivity dynamics (photo-excited carrier density of 5×10$^{18}$ cm$^{-3}$); FIG. 18D depicts spatial profile (dots) and Gaussian fit at 0.5 ps time delay from FIG. 18B; (FIG. 24); and FIG. 18E depicts evolution of variance of Gaussian distributions extracted from Gaussian fitting in FIG. 18D, the corresponding mobility is included.

FIG. 19A depicts PL spectra of six locations on a cross-sectional surface with increasing distance from the edge, PL of the spot at 0 μm was taken from the (111) surface around the edge, with inset showing optical image of the sidewall; Dashed circle: location for pump-probe measurements in (FIG. 19C-19E); FIG. 19B depicts Raman spectra of three of the six locations shown in FIG. 19A, with the inset providing a magnified view of the phonon line in the spectra of the five sidewall locations; FIG. 19C-19D show spatial profiles (dots) and Gaussian fits (curves) of photo-excited carriers at initial concentrations of 4.3×10$^{18}$ cm$^{-3}$ and 8.6×10$^{18}$ cm$^{-3}$, respectively, from a location indicated by the dashed circle in FIG. 19A; FIG. 19E depicts variance and ambipolar mobility values from FIG. 19C, FIG. 19D, and FIG. 26.

FIG. 20A depicts representative pump-probe transient reflectivity curve from sample 1, in which the probe wavelength is 585 nm; FIG. 20B and FIG. 20C depict spatial profiles (dots) and Gaussian fits (curves) of transient reflectivity from a spot in sample 1 measured using 585 nm and 530 nm probes, respectively; FIG. 20D depicts evolution of the variances of carrier density distributions and carrier mobility from FIG. 20B and FIG. 20C and FIG. 30; FIG. 20E and FIG. 20F depict variance and ambipolar mobility results, respectively, for sample 2 at six locations corresponding to those shown in FIG. 19A and FIG. 19B.

FIG. 21A depicts an optical image of the sample 1, the detection corner is marked by an oval; FIG. 21B depicts an optical image of sample 2 on the surface of a mm ruler; FIG. 21C depicts an optical image of the side wall of sample 2; and FIG. 21D depicts XRD pattern of the top surface of sample 2.

FIG. 22A depicts a schematic illustration of the transient reflection mapping apparatus; FIG. 22B depicts a schematic illustration of the wide field detection; and FIG. 22C depicts pulses intensity distribution on the surface of sample 2, the pump beam was focused onto the surface (within an inner dotted circle) while probe beam was de-focused to create the wide field detection, marked by outer dotted circle. The exposure area is marked by a rectangle, a reference beam (dotted circle outside the outer circle) was focused onto the target surface of the camera directly; in the actual measurement, the pump beam was blocked by a long pass filter.

FIG. 23A depicts temperature-dependent reflection of BAs showing a $3.9 \times 10^{-4}$ increase in reflectivity per degree Celsius; and FIG. 23B depicts temperature-dependent reflection of silicon showing a $4 \times 10^{-5}$ increase in reflectivity per degree Celsius.

FIG. 24A depicts carrier distribution raw data at 7.2 ps in FIGS. 18; FIG. 24B depicts the fitted result; and FIG. 24C depicts residual of the fitting.

FIG. 25A depicts profile of pump beams and the Gaussian fitting, the typical FWHM of pump beam of 400 nm and 600 nm are 0.75 μm and 0.9 μm, respectively; and FIG. 25B depicts absorption of a BAs sample with thickness of 100 μm.

FIG. 26A depicts spatial profiles (dots) and Gaussian fits (curves) at 0.5 ps and 33.5 ps; FIG. 26B depicts variances versus time and ambipolar mobilities extracted from the linear fitting. Einstein relationship was considered.

FIG. 27A depicts schematic illustration of the scanning details. The length of each scanning step was calibrated using a standard ruler with 10-um marks and the position of the focusing spot of the pump beam was recorded using laser-damaged holes; FIG. 27B and FIG. 27C depict two typical calibration experiments, with movement of 12 steps each.

FIG. 28A depicts a schematic illustration of the measurement principle; FIG. 28B depicts optical images of a 400-nm pump spot and a 585-nm probe spot with increasing displacement; and FIG. 28C depicts a schematic illustration of the initial carrier distribution inside the sample after pump excitation.

FIG. 29A depicts power dependent transient reflection dynamics with the pump energy of 3.1 eV (400 nm) and probe energy of 2.12 eV (585 nm) with a tri-exponential fitting; FIG. 29B depicts the fitted amplitude; and FIG. 29C depicts the fitted lifetime.

FIG. 32A depicts transient reflection microscopy mapping of the wafer with pump beam of 600 nm, probe beam of 800 nm. The carrier density was $1.4 \times 10^{19}$ cm$^{-3}$; FIG. 32B depicts carrier distribution versus time. The diffusivity was extracted from the linear fitting. Ambipolar mobility was further obatianed considering the Einstein relationship.

FIG. 33A depicts carrier diffusion in p-type silicon measured with transient reflection microscopy. 3×3 binning was used to enhance the signal to noise ratio. The excitation and detection wavelengths are 600 nm and 800 nm, respectively; FIG. 33B depicts the spatio-temporal population distribution along the vertical axis and the gaussian fitting; and FIG. 33C depicts the carrier distribution versus time together with the ambipolar mobility.

Figure 1C:
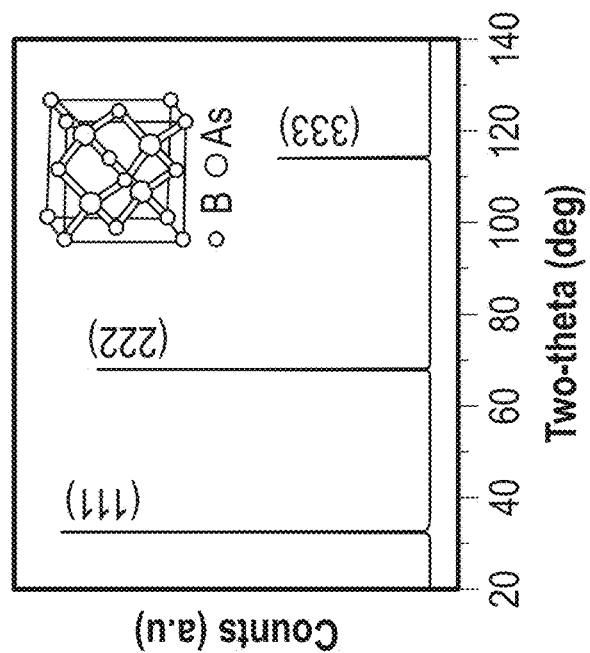

Further details and aspects of various embodiments of the present disclosure are described in more detail below with reference to the appended figures.

DETAILED DESCRIPTION OF DISCLOSED EXEMPLARY EMBODIMENTS

Although the present disclosure will be described in terms of specific embodiments, it will be readily apparent to those skilled in this art that various modifications, rearrangements, and substitutions may be made without departing from the spirit of the present disclosure.

For purposes of promoting an understanding of the principles of the present disclosure, reference will be made to exemplary embodiments illustrated in the drawings, and specific language will be used to describe the same. It will nevertheless be understood that no limitation of the scope of the present disclosure is thereby intended. Any alterations and further modifications of the features illustrated herein, and any additional applications of the principles of the present disclosure as illustrated herein, which would occur to one skilled in the relevant art and having possession of this disclosure, are to be considered within the scope of the present disclosure.

Overview

Among the ultrahigh thermal conductivity materials, cubic boron arsenide (c-BAs) is the only one predicted to exhibit simultaneously high electron and hole mobility greater than 1,000 cm$^2$V$^{-1}$s$^{-1}$. Herein disclosed is cubic boron arsenide (c-BAs) having unexpectedly high ambipolar mobility. It has also been unexpectedly discovered that lowering ionized and neutral impurity concentrations during production of c-BAs, as described herein, can be key to achieving c-BAs with unexpectedly high mobility and high thermal conductivity, respectively. As noted hereinabove, high ambipolar mobilities, combined with ultrahigh thermal conductivity, can make c-BAs as disclosed herein a promising candidate for next-generation electronics.

The performance of microelectronic and optoelectronic devices benefits from semiconductors with simultaneously high electron and hole mobilities, and high thermal conductivity. However, heretofore, mobility and thermal conductivity measurements have identified no such materials. Two of the most widely used semiconductors, silicon and GaAs, for example, have high room temperature (RT) electron mobilities of $\mu_e$=1,400 cm$^2$V$^{-1}$s$^{-1}$ and 8,500 cm$^2$V$^{-1}$s$^{-1}$, respectively. However, the corresponding RT hole mobilities ($\mu_h$=450 cm$^2$V$^{-1}$s$^{-1}$ for Si; 400 cm$^2$V$^{-1}$s$^{-1}$ for GaAs), and thermal conductivities ($\kappa_{RT}$=140 Wm$^{-1}$K$^{-1}$ for Si; 45 Wm$^{-1}$K$^{-1}$ for GaAs) are lower than desired. Although graphene has high electron and hole mobilities and a high in-plane thermal conductivity, the cross-plane heat conduction is low. Recently, first-principles calculations predicted that cubic boron arsenide (c-BAs) should have exceptionally high RT thermal conductivity of around 1,400 Wm$^{-1}$K$^{-1}$, ten times higher than that of Si. This high value stems from its unusual phonon dispersions and chemical bonding properties that promote simultaneously weak three-phonon and four-phonon scattering. c-BAs single crystals produced herein have, with measured c-BAs thermal conductivities in the range $\kappa_{RT}$=1,000-1,300 Wm$^{-1}$K$^{-1}$, identifying c-BAs as the most thermally conductive semiconductor.

First-principles calculations also predict that c-BAs should possess simultaneously high RT electron and hole mobilities of $\mu_e$=1,400 cm$^2$V$^{-1}$s$^{-1}$ and $\mu_h$=2,100 cm$^2$V$^{-1}$s$^{-1}$, respectively. The major reason for such high electron and hole mobilities is the high energy and low occupation of polar optical phonons in c-BAs, which give rise to weak carrier scattering. This unique feature distinguishes c-BAs from other III-V semiconductors which have high electron mobility but much lower hole mobility where $\mu_e/\mu_h$>10~100, except for AlSb ($\mu_e$=200 cm$^2$V$^{-1}$s$^{-1}$, $\mu_h$=400 cm$^2$V$^{-1}$s$^{-1}$).

Despite the promising theoretical predictions, there has heretofore been no report on the experimental observation of the creation of BAs having such high mobilities. Similar to the history of development of other III-V semiconductors, the initial quality c-BAs crystals have been limited by large and nonuniform defect concentrations. Consequently, traditional bulk transport measurement methods can only obtain the defect-limited behaviors instead of the intrinsic properties. Defects in c-BAs crystals have prevented such measurements from assessing the validity of the predicted high mobilities. Furthermore, previous reports show that thermal conductivity and electronic mobility do not appear to have a strong relationship with each other. Prior art describes c-BAs micro-rod sample having measured $\kappa_{RT}$=186 Wm$^{-1}$K$^{-1}$ and estimated $\mu_h$=400 cm$^2$V$^{-1}$s$^{-1}$, while another prior art finds millimeter-scale c-BAs crystals measured with $\kappa_{RT}$=920 Wm$^{-1}$K$^{-1}$ and $\mu_h$=22 cm$^2$V$^{-1}$s$^{-1}$. Such prior art obtained mobilities were much lower than the calculated mobility and did not show a clear correlation with the measured thermal conductivity. The origins of the (i) discrepancy between ab initio calculations and observed, measured c-BAs values, and (ii) decoupling between thermal and electrical properties have not previously been identified.

Herein disclosed are cubic boron arsenide (c-BAs) single crystals having an unexpectedly high, room temperature, ambipolar mobility, $\mu_a$, at one or more locations thereof that is greater than or equal to about 1500, 1600, 1700, 1800, 1900, 2000, 2100, 2200, 2300, 2400, 2500, 2600, 3000, 4000, 5000, 6000, 7000, 8000, 9000, or 10000 cm$^2$V$^{-1}$s$^{-1}$. The ambipolar mobility is defined as: $\mu_a$=2$\mu_e\mu_h$/($\mu_e$+$\mu_h$), wherein $\mu_e$ is electron mobility and $\mu_h$ is hole mobility.

The c-BAs single crystals can have a thickness of greater than or equal to about 0.1, 0.2, 0.3, 0.4, 0.5, 0.6, 0.7, 0.8, 0.9, 1, 2, 3, 4, 5, 6, 7, 8, 9, 10, 20, 30, 40, 50, 60, 70, 80, 90, 100, 200, 300, 400, 500, 600, 700, 800, 900, 1000, 2000, 3000, 4000, 5000, 6000, 7000, 8000, 9000, or 10000 micrometers (μm). In embodiments, the hole mobility, $\mu_h$, of the c-BAs single crystals is greater than or equal to about 1000, 1500, 1600, 1700, 1800, 1900, 2000, 3000, 4000, 5000, 6000, 7000, 8000, 9000, 10000, or 20000 cm$^2$V$^{-1}$s$^{-1}$. In embodiments, the electron mobility, $\mu_e$, is greater than or equal to about 1000, 1400, 1500, 1600, 1700, 1800, 1900, 2000, 3000, 4000, 5000, 6000, 7000, 8000, 9000, or 10000 cm$^2$V$^{-1}$s$^{-1}$.

In embodiments, an ambipolar diffusion coefficient, $D_a$, at the one or more locations can be greater than or equal to 40, 50, 60, 70, 80, 90, 100, 200, 300, 400, or 500 cm$^2$s$^{-1}$, wherein $D_a$ is determined as: $D_a$=$K_B$T$\mu_a$/e, wherein $K_B$ is the Boltzmann constant, e is the elementary charge, and T is the absolute temperature.

The c-BAs can comprise less than or equal to about 10$^{18}$ cm$^{-3}$ carriers (e.g., neutral impurities). The c-BAs can comprise less than or equal to about 10$^{16}$ cm$^{-3}$ carriers (e.g., charged impurities).

A room temperature thermal conductivity at the one or more locations can be greater than or equal to about 1000, 1100, 1200, 1300, 1400, 1500, 1600, 1700, 1800, 1900, 2000, 2100, 2200, 2300, 2400, 2500, or 2600 Wm$^{-1}$K$^{-1}$, and/or in a range of from about 1000 to about 2600 Wm$^{-1}$K$^{-1}$, from about 1100 to about 2000 Wm$^{-1}$K$^{-1}$ or from about 1200 to about 1500 Wm$^{-1}$K$^{-1}$.

The one or more locations can comprise a corner facet and/or an interior/center of a sidewall perpendicular to a (111) growth surface of the crystal. The one or more locations can be at a depth of greater than about 7, 8, or 9 μm from the crystal surface, in embodiments (see FIGS. 17-20 and the description thereof in Example 2 hereinbelow).

In embodiments, a bulk ambipolar mobility of the c-BAs single crystals can be greater than or equal to about 1000, 2000, 5000, or 10000 cm$^2$V$^{-1}$s$^{-1}$.

Also provided herein is a method of producing one or more bulk cubic boron arsenide (c-BAs) crystals. In embodiments, the c-BAs single crystals are grown via a method as described in U.S. Patent Publication No. 2021/0269318, with the improvements and changes to the method described herein.

The method can comprise producing, during a first chemical vapor transport (CVT) process, single BAs crystals using a purified boron (B) source and a purified arsenic (As) source; and using at least a portion (e.g., at least 1, 5, 10, 20, 30%) of the single BAs crystals to produce a bulk c-BAs crystal via a second CVT process. Alternatively, B and As powders (e.g., purified as described herein) can be utilized as the source. Via the use of the single BAs crystals from the first CVT process being utilized in the second CVT process, a number of nucleation centers can be controlled (e.g. via controlling a number of source and/or seed crystals) during the second CVT process, for example by spacing of the single BAs crystals from the first CVT process during the second CVT process, as detailed in Example 1 hereinbelow. In embodiments, quartz fiber, GaAs, BN, etc., can be utilized as nucleation sites in place of or in addition to the single BAs crystals from the first CVT process. The BAs single crystals can have an observed, room temperature, ambipolar mobility, $\mu_a$, at one or more locations thereof that is greater than or equal to about 1500, 1600, 1700, 1800, 1900, 2000, 2100, 2200, 2300, 2400, 2500, 2600, 3000, 4000, 5000, 6000, 7000, 8000, 9000, or 10000 cm$^2$V$^{-1}$s$^{-1}$, wherein the ambipolar mobility is defined above.

The method can further include purifying a boron (B) source and an arsenic source to provide the purified B source and the purified As source, for example, as described hereinbelow in Example 1 hereinbelow. Such purification can reduce a number of defects in the resulting single BAs crystals. The purification can be effected in any suitable manner, for example as described in Example 1 hereinbelow. In embodiments, the purified As has a purity of greater than or equal to about 99.9, 99.99, 99.999, or 99.9999 weight percent (wt %) As. In embodiments, the purified B has a purity of greater than or equal to about 99.9, 99.99, 99.999, or 99.9999 weight percent (wt %) B. The single BAs crystals can have a lateral dimension of less than or equal to 0.1, 0.2, 0.3, 0.4, 0.5, 0.6, 0.7, 0.8, 0.9, 1, 2, 3, 4, 5, 6, 7, 8, 9, 10, 20, 30, 40, 50, 60, 70, 80, 90, 100, 200, 300, 400, 500, 600, 700, 800, 900. 1000, 2000, 3000, 4000, 5000, 6000, 7000, 8000, 9000, or 10000 micrometers (μm).

The method can further comprise increasing a CVT growth time during the second CVT process to increase the crystal size of the bulk c-BAs crystal. The bulk c-BAs crystal can have a size sufficient for evaluation via transport measurement techniques. In embodiments, the bulk c-BAs crystal has a size of at least about 4×2×1 millimeters.

The first CVT process can comprise growing the single BAs crystals in a tube furnace with a temperature gradient for vapor transport. The first CVT process can further comprise positioning the purified B source, the purified As source, and iodine ($I_2$) at a source side of a fused quartz tube and seed material at the other side of the tube, a seed side, to serve as seed crystals. In embodiments, the iodine is at least 0.1, 1.0, or 10 wt % pure. The seed material can comprise, for example and without limitation, gallium arsenide (GaAs), boron nitride (BN), glass fiber, or a combination thereof. In embodiments, a ratio of arsenic to iodine (As:I) is from about 5:1 to about 50:1, or from about 5:1 to about 20:1.

The method can further comprise: sealing the quartz tube under vacuum and placing the sealed quartz tube in the tube furnace. The vacuum can comprise a pressure of less than or equal to $10^{-4}$ Torr. The tube furnace can be a horizontal tube furnace.

The first CVT process can further comprise: establishing and maintaining the temperature gradient by setting the seed side of the tube at a lower temperature zone of the furnace at a fixed temperature in a range of from about 650° C. to about 900° C. (e.g., 790° C.) and the source side at a higher temperature zone of the furnace at a fixed temperature in a range of from about 800° C. to 1000° C. (e.g., 890° C.).

The second CVT process can be the same as the first CVT process, except for the use of the single BAs crystals from the first CVT process at the source side of the sealed quartz tube in place of the purified boron source.

The method can further comprise: optimizing seed crystal quality and distribution during the second growth period to obtain the bulk c-BAs crystals. Accordingly, in embodiments, the second CVT process can comprise: removing single BAs crystals (e.g., from the seed side) after the first CVT process; cleaning the removed single BAs crystals; and selecting highest quality BAs crystals for positioning in (e.g., on the source side of) the quartz tube during the second CVT process.

Cleaning the BAs crystals can comprise: washing with nitric acid, aqua regia, or both; and/or rinsing with an alcohol, deionized water, or both. To achieve highest ambipolar mobility, the washing, the rinsing, or both are adjusted to minimize a number of defects and/or impurities in the bulk c-BAs single crystals.

The first CVT process, the second CVT process, or both can comprise a time duration of about 1-100 days (e.g., one week, two weeks, three weeks, etc.).

The second CVT process can comprise selecting less than about 5, 4, 3, or 2 of the single BAs crystals produced during the first CVT process on a source side of a quartz tube during the second CVT process. The second CVT process can comprise selecting less than about 5, 4, 3, or 2 of the single BAs crystals (e.g., from the growth side of the quartz tube) produced during the first CVT process during the second CVT process.

In embodiments, the single BAs crystals that are utilized during the second CVT process are positioned a specific distance apart on the source side of the quartz tube for the second CVT process. In embodiments, single BAs crystals from the seed side of the quartz tube that are utilized during the second CVT process are positioned a specific distance apart on the source side of the quartz tube for the second CVT process. Alternatively or additionally, quartz fiber, small pieces of GaAs and/or BN single crystals can be utilized to promote nucleation.

In embodiments, two of the single BAs crystals obtained via the first CVT process are utilized on the source side during the second CVT process. In embodiments, two of the single BAs crystals from the seed side of the quartz tube obtained via the first CVT process are utilized (e.g., on the source side) during the second CVT process.

The specific distance apart can comprise about 0.5, 1, or 2 centimeters (cm).

The first CVT process can include a first growth period for a first time duration, and/or the second CVT process can include a second growth period for a second time duration. The first time duration, the second time duration, or both can comprise from about one to about one hundred days (e.g., one week, two weeks, three weeks).

Also disclosed herein is a semiconductor, electronic or optoelectronic device comprising: cubic boron arsenide (c-BAs) comprising single crystals having a room temperature ambipolar mobility, $\mu_a$, at one or more locations thereof that is greater than or equal to about 1500, 1600, 1700, 1750, 1800, 1850, 1900, 1950, 2000, 2050, 2100, 2150, 2200, 2250, 2300, 2350, 2400, 2450, 2500, 2550, 2600, 3000, 4000, 5000, 6000, 700, 8000, 9000, or 10000 $cm^2V^{-1}s^{-1}$, wherein the ambipolar mobility is defined as: $\mu_a=2\mu_e\mu_h/(\mu_e+\mu_h)$, wherein $\mu_e$ is electron mobility and $\mu_h$ is hole mobility. In embodiments, the c-BAs is utilized in an electronics system of the device. In embodiments, the device comprises a transistor, a photodetector, or a solar cell, for example, because of the ultrahigh thermal conductivity, carrier mobility, and suitable bandgap.

Also provided herein is a process comprising: utilizing BAs single crystals as recited herein in an electronic or optoelectronic process, wherein the process has an increased performance (e.g., speed) and/or level of integration relative to a same process operated with silicon, due to the higher ambipolar mobility provided by the BAs single crystals relative to silicon.

EXAMPLES

Example 1 hereinbelow describes experimental measurement, via optical transient grating technique, and validation by ab initio calculations of the unexpectedly high ambipolar mobility in the cubic boron arsenide (c-BAs) of this disclosure. Example 2 provides experimental measurement, via transient reflectivity microscopy, of the herein disclosed unexpectedly ultrahigh ambipolar mobility in the herein described cubic boron arsenide (c-BAs).

Example 1: Experimental Measurement and Validation by Ab Initio Calculations of High Ambipolar Mobility of the Herein Disclosed Cubic Boron Arsenide (c-BAs)

In this Example 1, an optical transient grating (TG) technique was utilized to experimentally measure thermal conductivity of 1200 Wm$^{-1}$K$^{-1}$ and ambipolar mobility of 1,600 cm$^2$s$^{-1}$V$^{-1}$ at the same locations on c-BAs samples at room temperature despite spatial variations. Ab initio calculations described in this Example 1 unexpectedly show that lowering ionized and neutral impurity concentrations, as described herein can be key to achieving high mobility and high thermal conductivity, respectively. As noted hereinabove, high ambipolar mobilities, combined with ultrahigh thermal conductivity, can make c-BAs as disclosed herein a promising candidate for next-generation electronics.

Figure 1B:
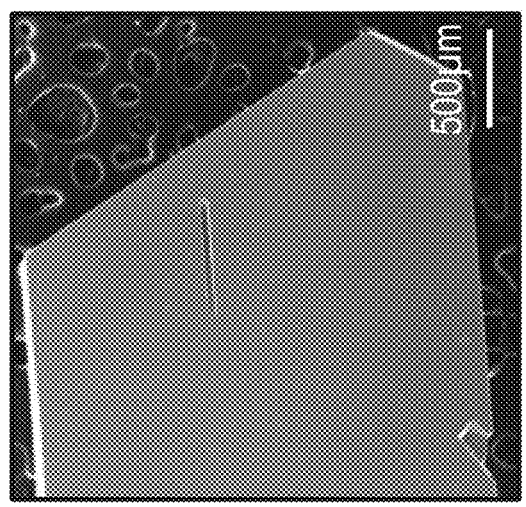
Figure 1A:
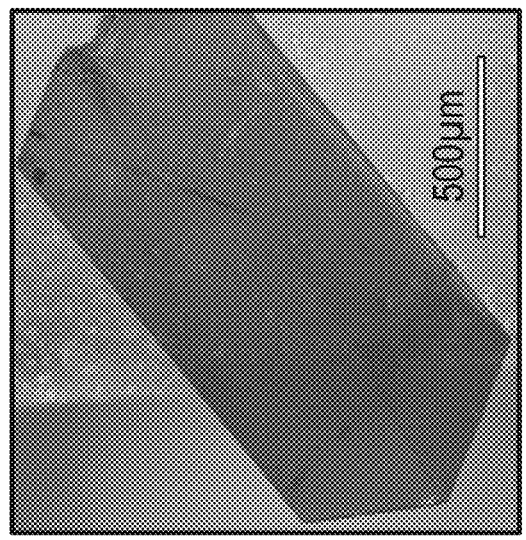
Figures 5A, 5B:
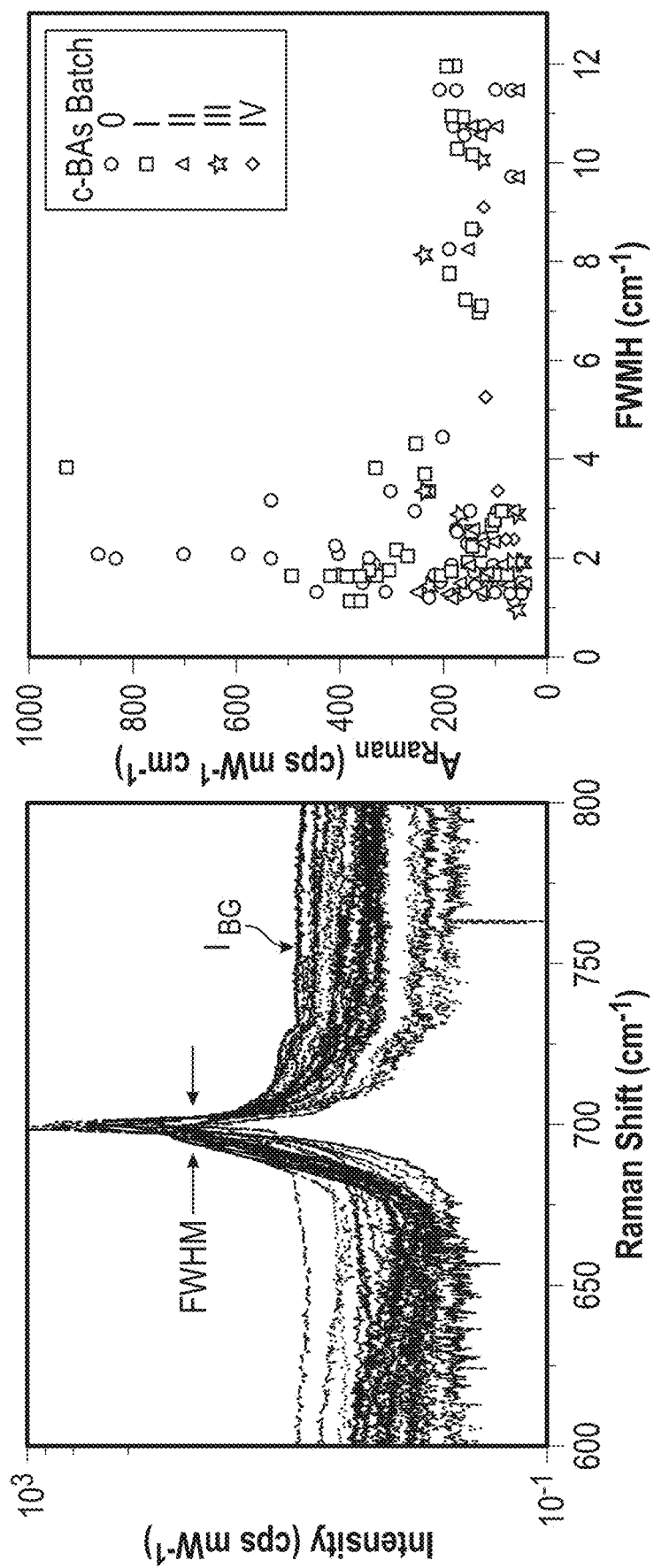
FIGS. 5A-5B depict Raman scattering data of c-BAs crystals.
Figure 6A:
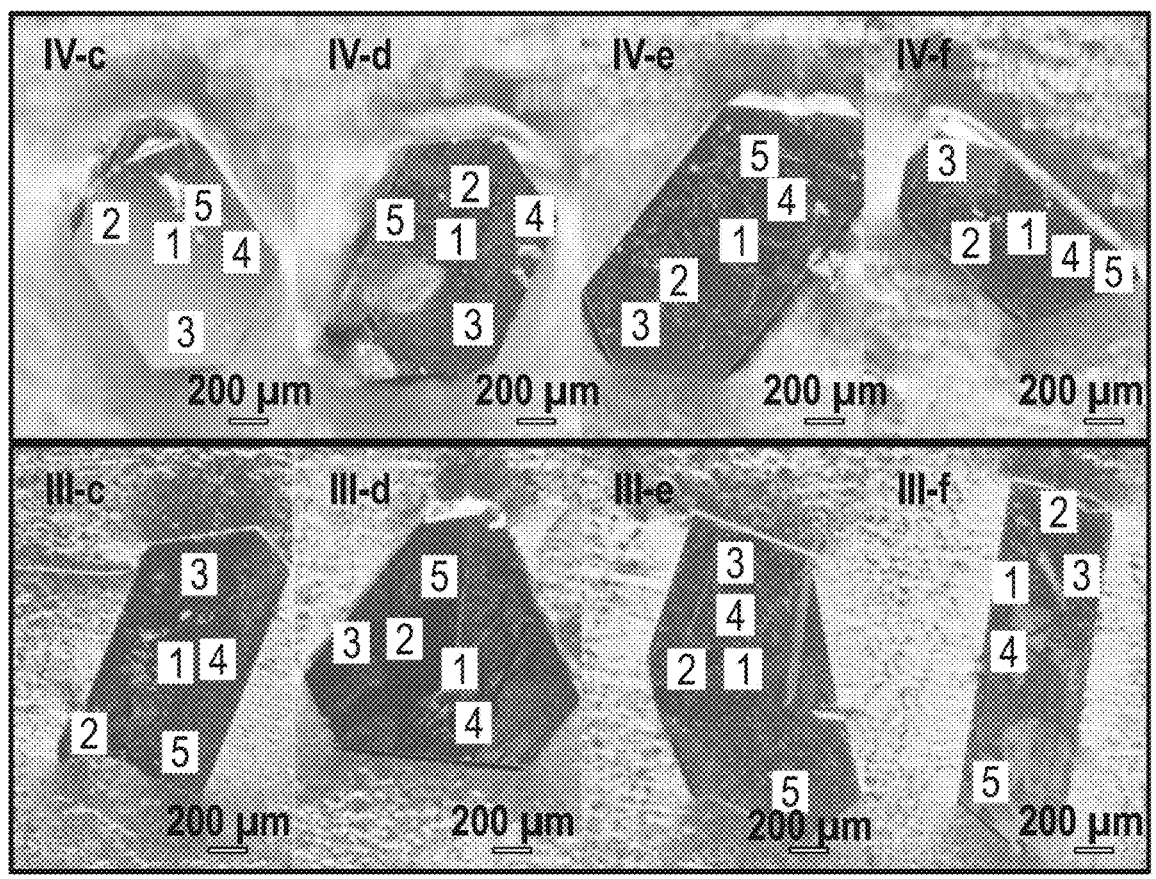
FIGS. 6A-6B depict FDTR measurements.
Figure 6B:
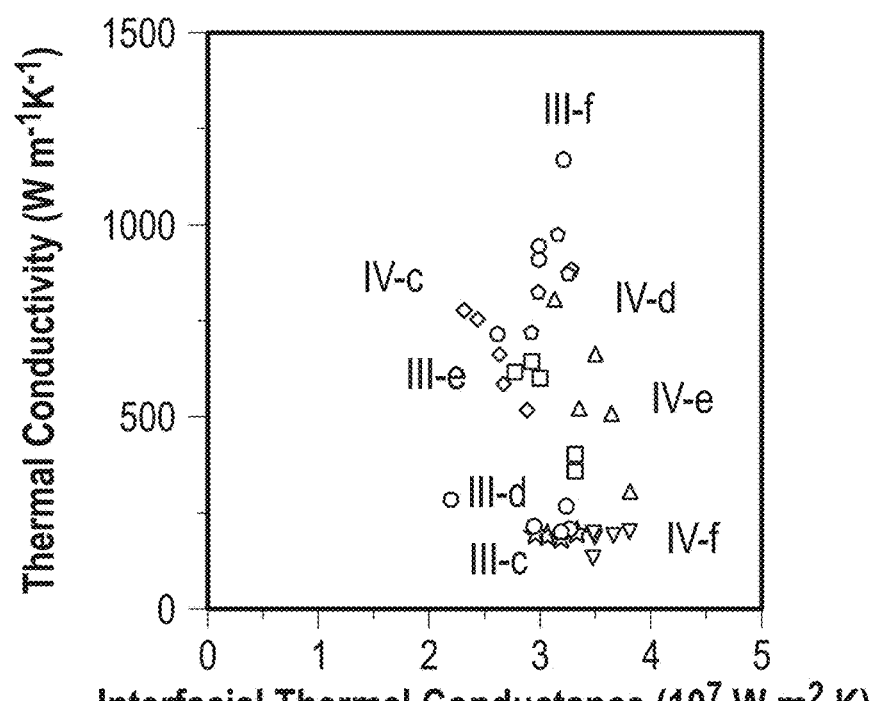

In this Example 1, an optical transient grating (TG) method was utilized to measure electrical mobility and thermal conductivity on the same spot of c-BAs single crystals. The experiments show that the c-BAs of this disclosure exhibits simultaneously high thermal conductivity, and unexpectedly high electron and hole mobilities. Using ab initio calculations, it has been surprisingly determined that ionized impurities strongly scatter charge carriers, while neutral impurities are mainly responsible for the thermal conductivity reduction. This finding establishes c-BAs as the only known semiconductor exhibiting this combination of desirable properties and places it among the ideal materials for next-generation microelectronics applications.

c-BAs samples were prepared using multi-step chemical vapor transport (CVT) with varying conditions (described hereinbelow, FIG. 5 and FIG. 6). FIG. 1A and FIG. 1B show a photograph and scanning electron microscopy (SEM) image of a c-BAs single crystal with a thickness of ~20 μm. X-ray diffraction (XRD, FIG. 1C) confirmed a cubic structure, in agreement with the literature.

Photoluminescence (PL) and Raman spectroscopies have been employed to identify the non-uniform impurity distribution in c-BAs. FIG. 1D and FIG. 1E show a PL spectrum and two-dimensional (2D) PL mapping of c-BAs. Local bright spots indicate the spatial differences in charge carrier density and recombination dynamics. FIG. 1F and FIG. 1G show a Raman spectrum and 2D Raman background scattering intensity ($I_{BG}$) mapping of the c-BAs. The strong Raman peak at ~700 cm$^{-1}$ is associated with the longitudinal optical (LO) mode of c-BAs at the zone center. The full-width at half maximum of the LO peak and $I_{BG}$ can be attributed to mass disorder due to impurities, responsible for large κ variation.

Figure 7:
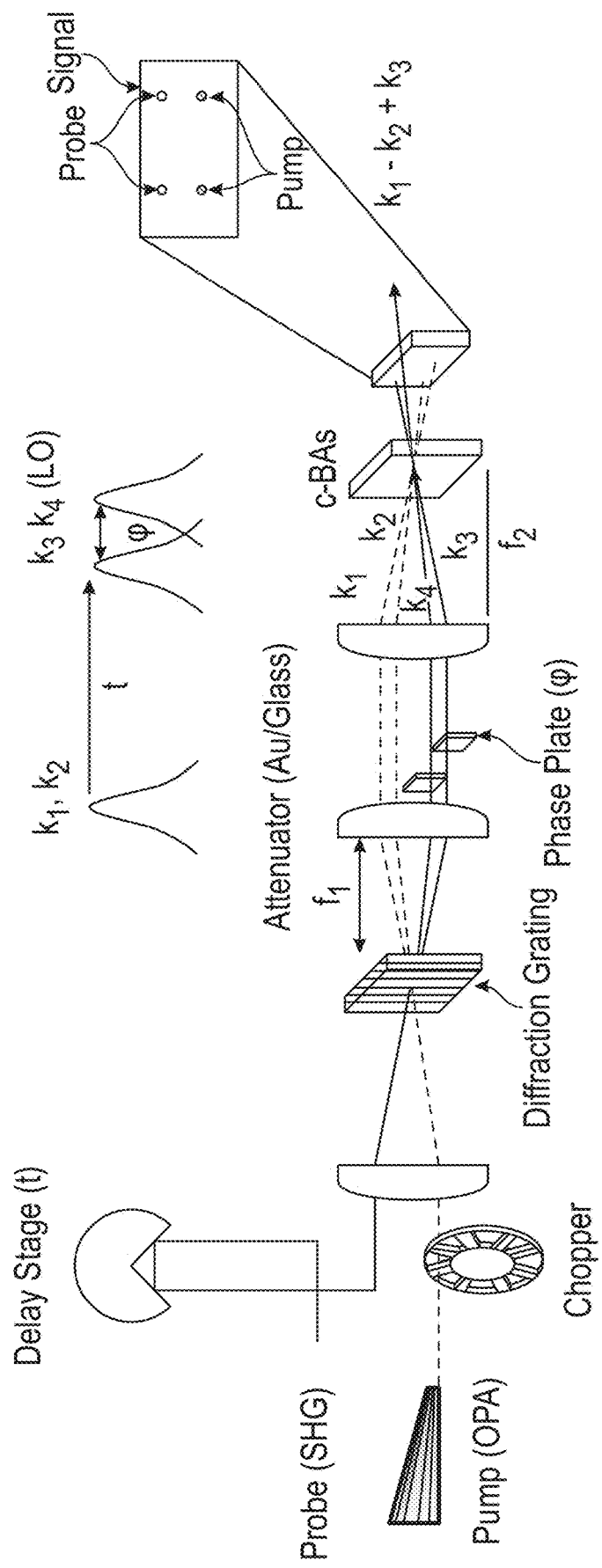
FIG. 7 depicts the schematic of TG setup.

The TG technique was utilized to simultaneously measure electrical and thermal transport on multiple spots, marked with circles (A-D) on FIG. 1. FIG. 2A shows a schematic of the TG experiments. Two femtosecond laser pulses (pump) with wavevectors $k_1$ and $k_2$ create sinusoidal optical interference on the c-BAs samples, exciting electron-hole pairs accordingly (FIG. 7 hereinbelow). A third laser pulse ($k_3$, probe) arrives at the sample spot after delay time t, which is subsequently diffracted to the direction of $k_1-k_2+k_3$ and mixed with a fourth pulse ($k_4$) for heterodyne detection. As the photoexcited carriers undergo diffusion and recombination, the corresponding diffraction signal decays with t. FIG. 2B shows the calculated time-dependent electron-hole profile in c-BAs (FIG. 8 and FIG. 9).

Diffusion and recombination of photoexcited carriers result in a fast exponential decay in the TG signal (t<1 ns), followed by a slower thermal decay (t>1 ns) with an opposite sign (FIG. 2C). The short and long-time decays are used to calculate electrical mobility and thermal conductivity on the same spot, respectively (see FIG. 10 hereinbelow for details). Thermal conductivity was directly calculated from the exponential fitting of the long-time decay (line). The electrical decay is sensitive to the wavelength of the pump pulses. An optical parametric amplifier (OPA) was utilized to match the wavelength of the pump beam with the bandgap (2.02 eV) of c-BAs to avoid excitation of high-energy electrons that can lead to hot electrons and holes with different scattering dynamics and mobilities. FIG. 2D depicts the wavelength-dependent electrical decay rate Γ. TG decays much faster at shorter wavelengths (λ<500 nm) and reaches a plateau near the bandgap (λ~600 nm), followed by signal loss for photon energy below the bandgap (λ>650 nm) (FIG. 11). FIG. 2E and FIG. 2F show TG decay of c-BAs with varied grating wavevector q. The slopes of electrical and thermal Γ vs. q$^2$ are equivalent to the ambipolar diffusivity $D_a$ and thermal diffusivity $D_{th}$ of c-BAs. $D_a$ is subsequently converted to ambipolar mobility $\mu_a=eD_a/k_BT=2\mu_e\mu_h/(\mu_e+\mu_h)$, which is dominated by the low mobility carrier where $k_B$ is the Boltzmann constant, e is the elementary charge and T is temperature.

Figure 12B:
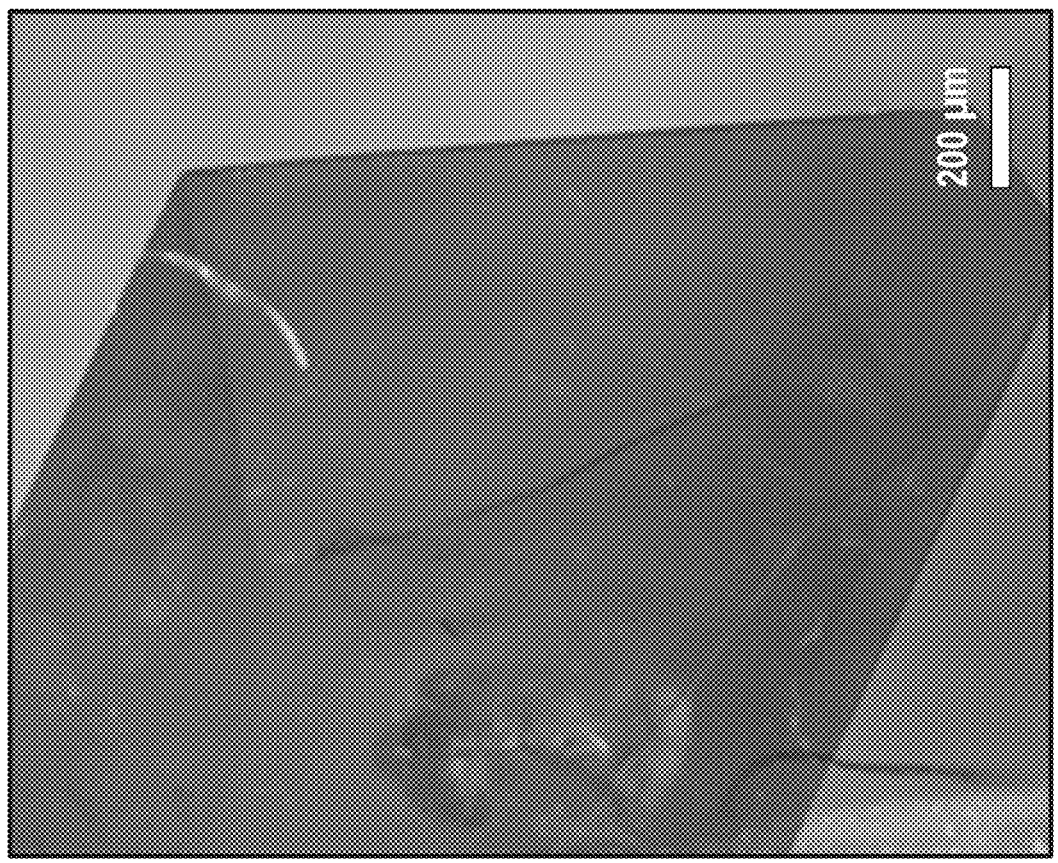
FIGS. 12A-12B depict C-doped c-BAs.
Figure 12A:
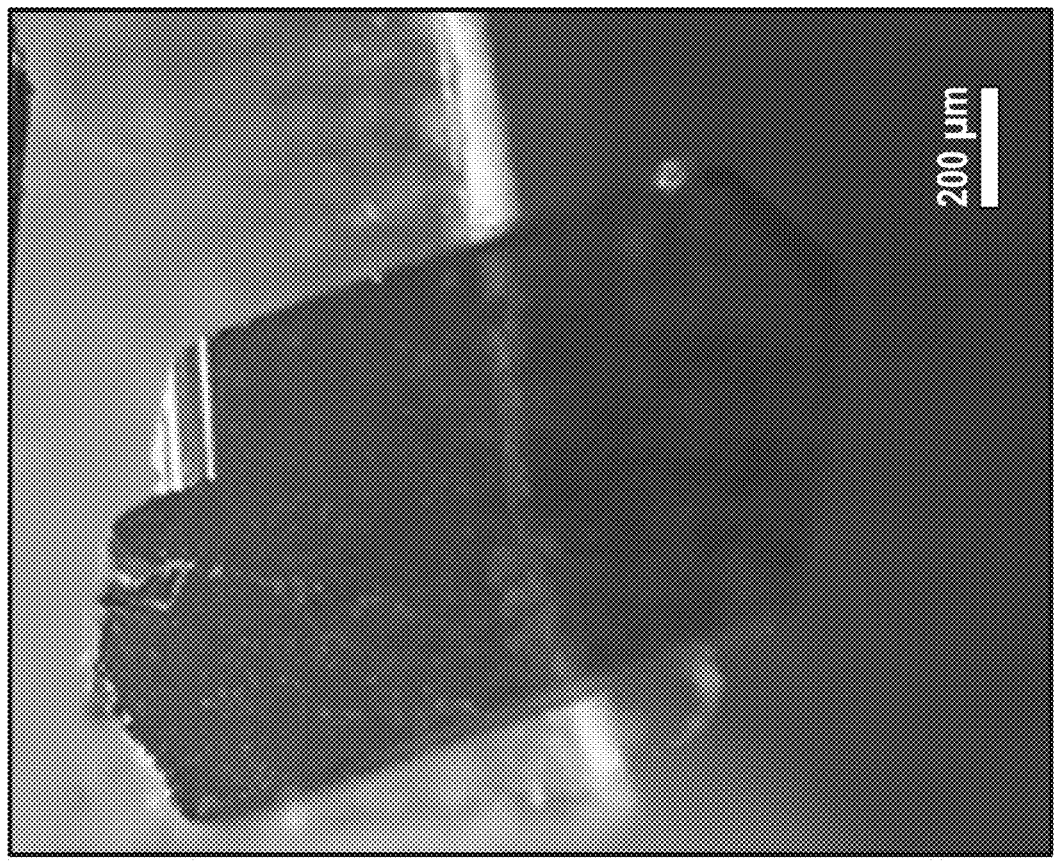
Figure 13A:
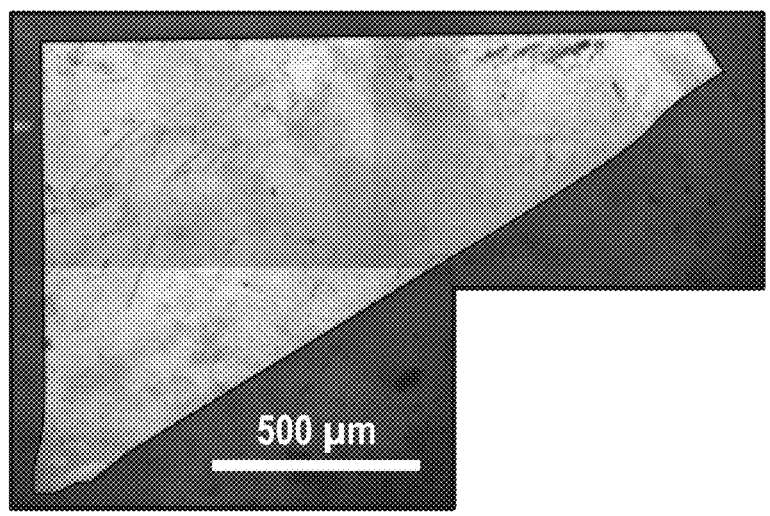
FIGS. 13A-13C depict carbon-doped c-BAs crystal.
Figure 13B:
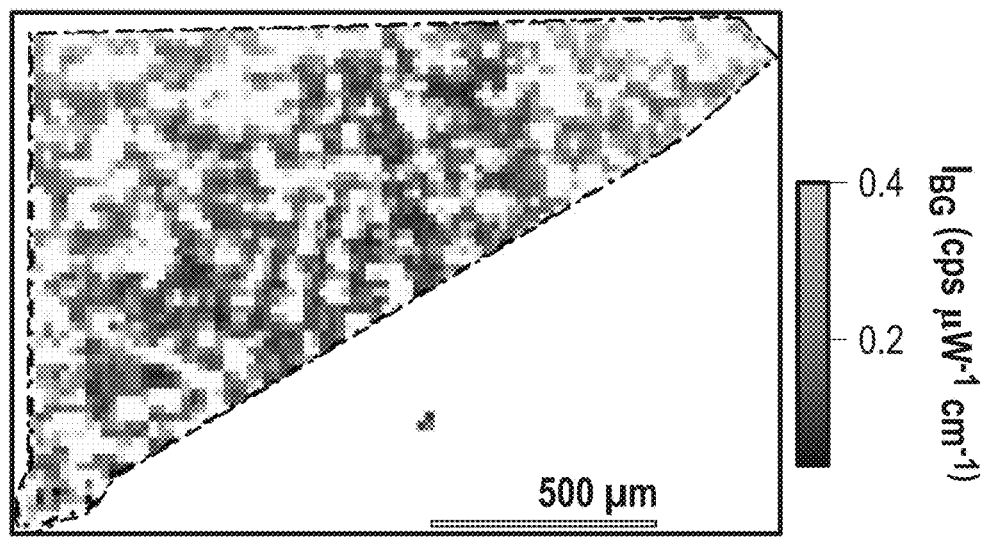
Figure 13C:
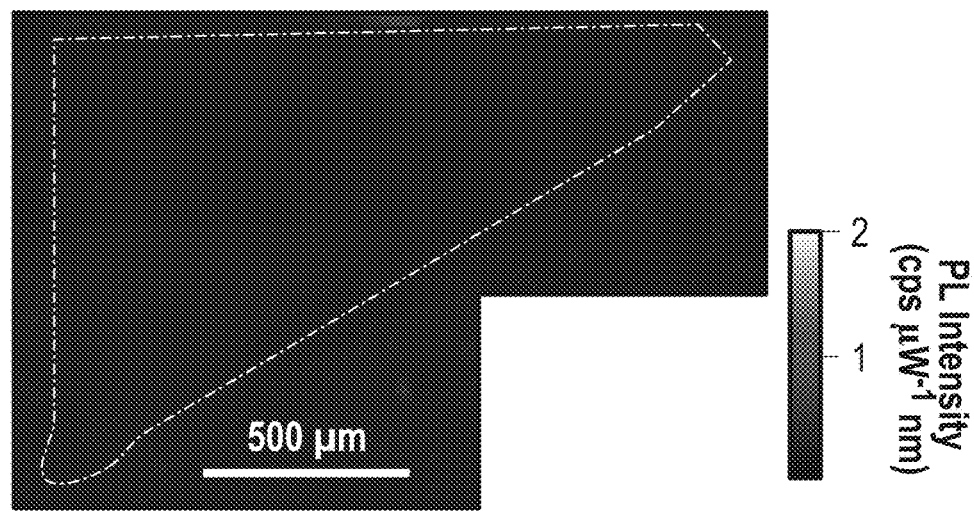

A wide variation of the RT κ and $\mu_a$ for spots A-D (A: 920 Wm$^{-1}$K$^{-1}$ and 731 cm$^2$V$^{-1}$s$^{-1}$; B: 1,132 Wm$^{-1}$K$^{-1}$ and 1,482 cm$^2$V$^{-1}$s$^{-1}$, C: 163 Wm$^{-1}$K$^{-1}$ and 331 cm$^2$V$^{-1}$s$^{-1}$, D: 211 Wm$^{-1}$K$^{-1}$ and 328 cm$^2$V$^{-1}$s$^{-1}$) was measured. This large spatial variation of thermal and electrical properties can be attributed to corresponding variations in impurity density; higher impurity density lowers PL intensity and increases $I_{BG}$. To corroborate this trend, c-BAs was intentionally doped with C (batch IV), and κ=200-953 Wm$^{-1}$K$^{-1}$ and $\mu_a$=195-416 cm$^2$V$^{-1}$s$^{-1}$ were measured along with large variation in $I_{BG}$ and low PL intensity (FIG. 12 and FIG. 13).

Figure 3A:
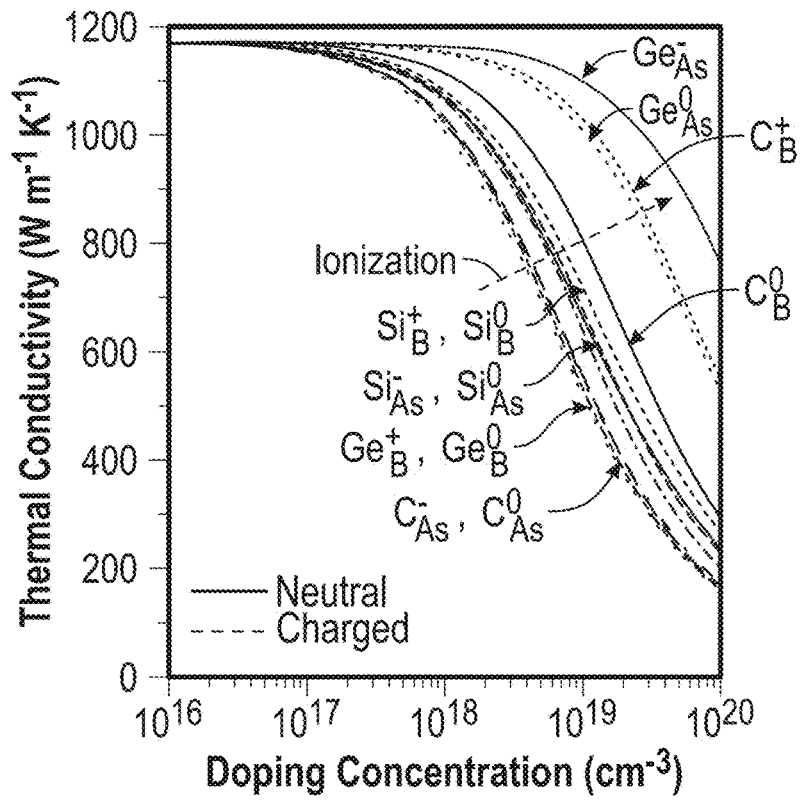
FIGS. 3A-3D depict theoretical calculations of the impurity effects on thermal conductivity and mobility.

Common impurities in c-BAs are group-IV elements, such as C and Si. These impurities can serve as electron acceptors in c-BAs due to low formation energies. Space charges created by ionized impurities introduce distortions in the local bonding environment, driving distinct phonon scattering mechanisms. FIG. 3A shows the κ of c-BAs calculated by solving the phonon Boltzmann transport equation including three- and four-phonon scattering, and phonon-scattering by neutral (solid lines) and charged (dashed lines) group-IV impurities on B or As sites. The calculated κ decreases with increasing mass difference between the impurity and host atoms. Upon impurity ionization, the number of valence electrons of the impurity (IV) matches that of B or As (III or V), resulting in weaker bond perturbations than those from the neutral impurities. Consequently, the thermal conductivity reduction from ionized impurities is smaller than that caused by the un-ionized impurities, especially when the substituted impurity has a similar mass to the host atom, i.e., Ge$_{As}^-$ and C$_B^+$.

Figure 3B:
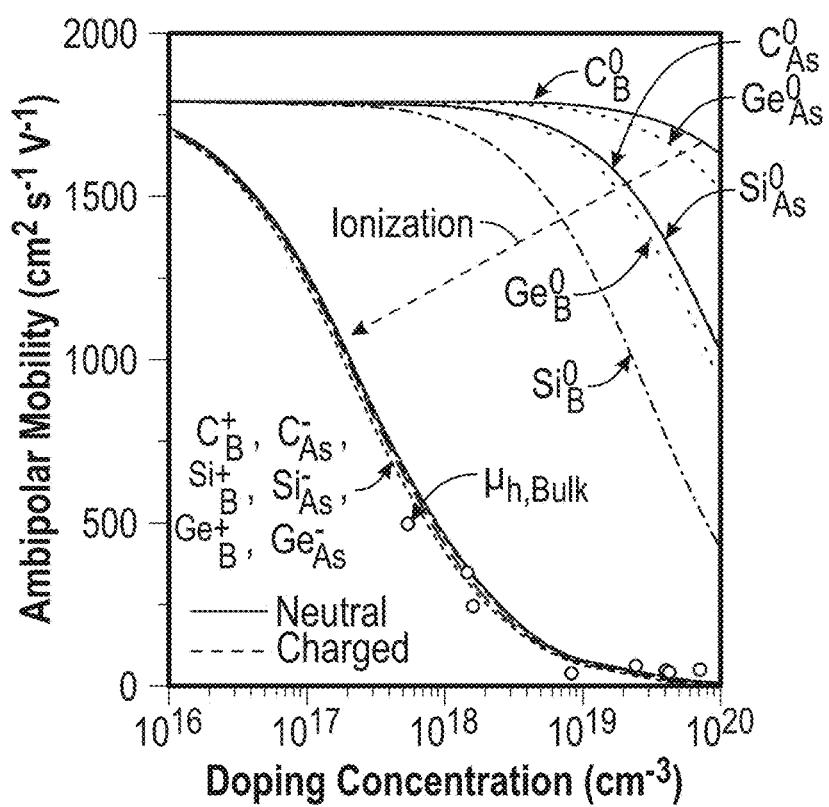
Figure 3C:
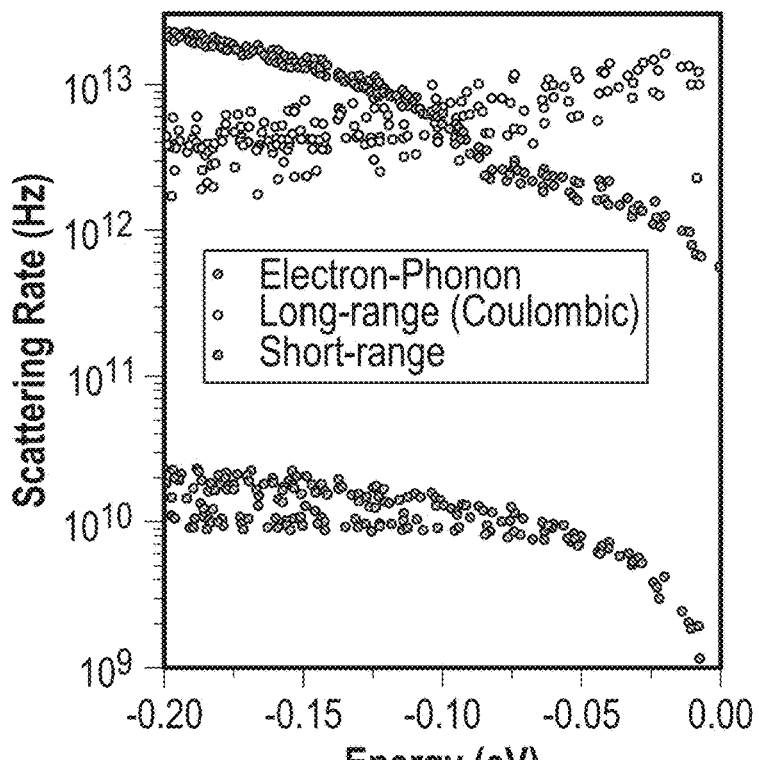

The bond perturbation and Coulomb potential of impurities modify electron transport dynamics in c-BAs differently. Building on recent developments in computing formation energies for charged impurities, ab initio calculations were utilized to study the effect of group-IV impurities on the RT $\mu_a$ of c-BAs (FIG. 3B). FIG. 3C shows electron-phonon scattering, and long- and short-range defect scattering for electrons in c-BAs with Si$_{As}^-$ (see FIG. 14 hereinbelow for details). Long-range Coulombic interaction with charged impurities is found to be the dominant electron scattering mechanism near the band edge. The lack of a Coulomb potential for neutral impurities results in a weaker carrier scattering, causing $\mu_a$ to not decrease until the concentration approaches 10$^{18}$ cm$^{-3}$ where the electron-neutral impurity scattering starts to show effect. On the other hand, $\mu_a$ decreases dramatically with charged impurities from 10$^{16}$ cm$^{-3}$, regardless of the mass of impurity.

Figure 3D:
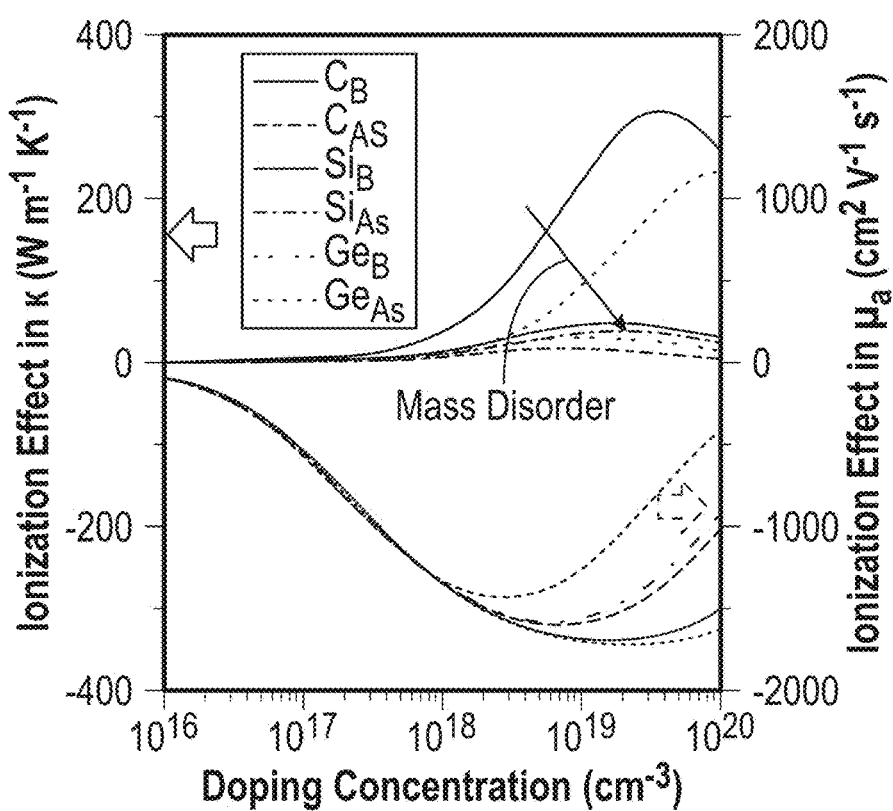

FIG. 3D elucidates the different effects of neutral and charged impurities on κ and $\mu_a$. Neutral impurities more strongly suppress κ due to stronger bond perturbations compared with charged impurities. Charged impurities predominantly contribute to $\mu_a$ reduction regardless of the mass thereof due to Coulombic scattering. Charged impurities with less mass-disorder would exhibit $\kappa_{RT}$ above 1,000 W m$^{-1}$ K$^{-1}$ even at a high impurity level of $10^{19}$ cm$^{-3}$ while $\mu_a$ can be reduced to below 400 cm$^2$V$^{-1}$s$^{-1}$ at a moderate level of $10^{18}$ cm$^{-3}$.

Figure 4B:
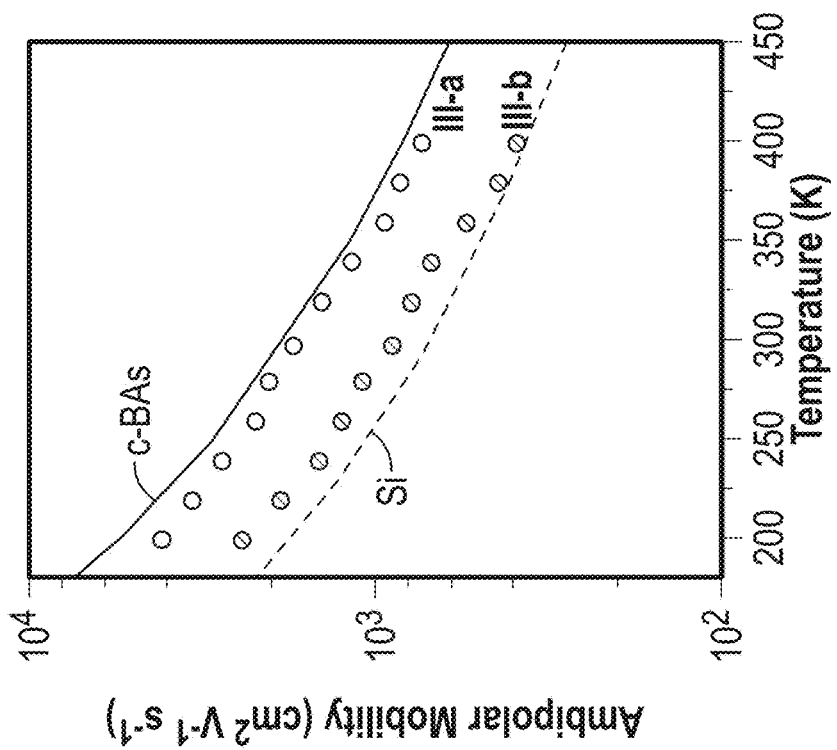
FIGS. 4A-4B depict the ambipolar mobility and thermal conductivity of c-BAs.
Figure 4A:
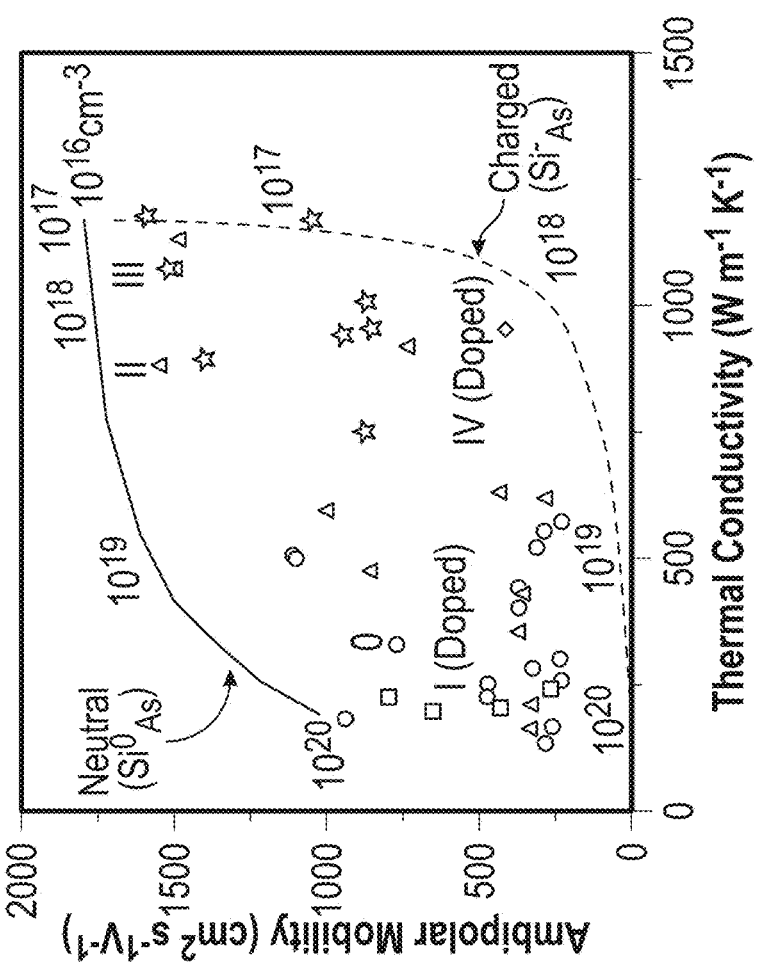
Figure 15A:
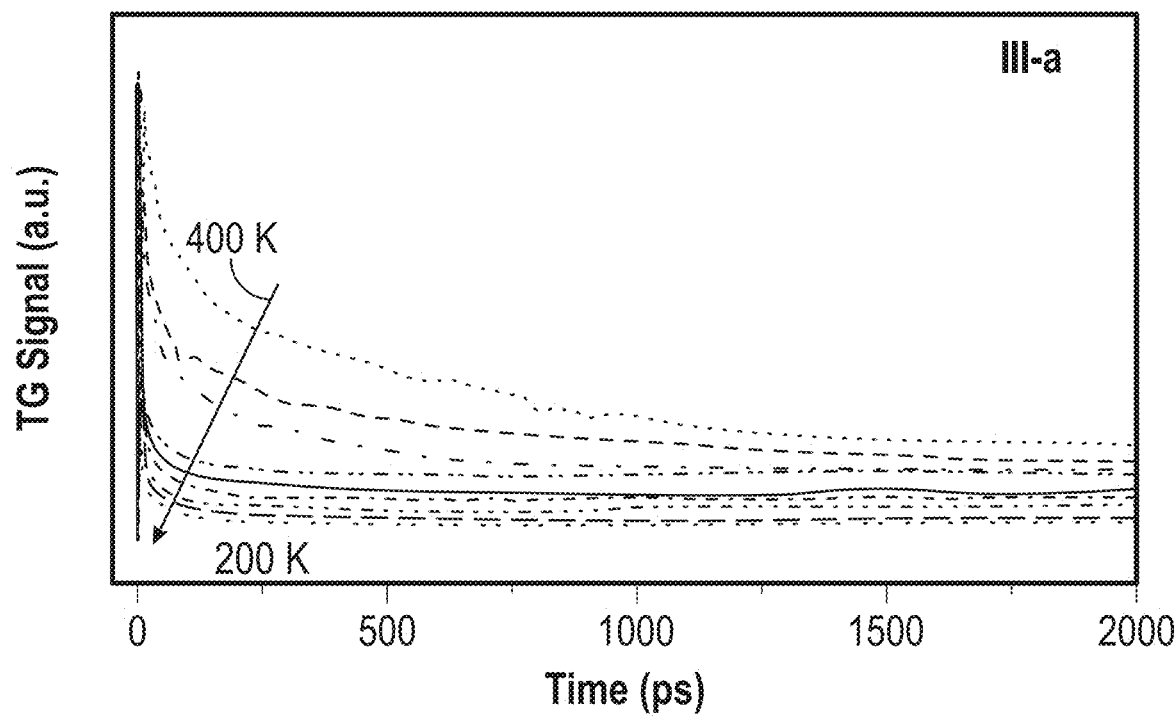
FIGS. 15A-15B depict temperature-dependent mobility measurements.
Figure 15B:
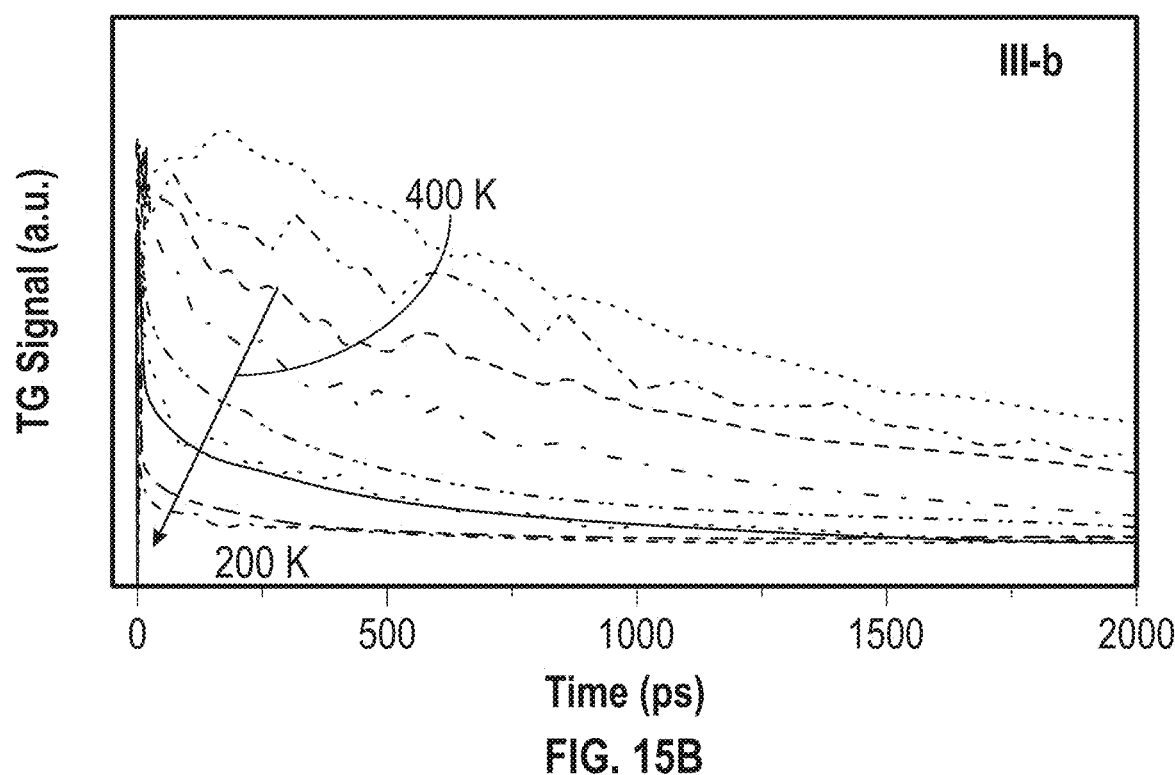

FIG. 4A highlights the contrasting trends in $\kappa$ and $\mu_a$ with neutral and charged impurities. Solid and dashed lines show trajectories of calculated $\mu_a$ and $\kappa$ with neutral $Si_{As}^-$ and charged $Si_{As}^-$ from $10^{16}$ to $10^{20}$ cm$^{-3}$, respectively. Scattered points are measured $\mu_a$ and $\kappa$ of samples from different batches, labeled with different colors. All measured data fit into the area between the trajectory curves. Among the high-quality c-BAs batch (III), were measured $\mu_a$=1, 600±170 cm$^2$s$^{-1}$V$^{-1}$ and $\kappa$=1,200±130 Wm$^{-1}$K$^{-1}$. The temperature-dependent $\mu_a$ of two different spots (III-a and III-b) of high-quality samples (FIG. 15) was measured. The measured $\mu_a$ for III-a shows good agreement with calculation (FIG. 4B). Hall measurements of the bulk samples provide $\mu_h$ and carrier concentration p averaged over the entire sample with spatially varied impurity concentration. The measured bulk $\mu_h$ plotted in FIG. 3B (see FIG. 16 hereinbelow for details) is limited by the average impurity concentrations, rather than local spots with low impurities.

The high-spatial resolution TG measurements provide clear evidence of simultaneously high electron and hole mobilities in c-BAs and demonstrate that through elimination of defects and impurities, c-BAs can exhibit both high thermal conductivity and unexpectedly high electron and hole mobilities. In addition, the observed weak correlation between the local thermal conductivity and mobility can be caused by different effects of neutral and ionized impurities. This remarkable combination of electronic and thermal properties along with a thermal expansion coefficient and lattice constant that are closely matched to common semiconductors such as Si and GaAs, make the c-BAs of this disclosure a promising material for integrating with current and future semiconductor manufacturing processes and addressing the grand challenges in thermal management for next-generation electronics.

Materials and Methods

BAs Crystal Preparation

Cubic c-BAs single crystals were synthesized using the modified chemical vapor transport (CVT) method. Boron (B, 19.9% 10B and 80.1% 111B, 99.9% purity) was purchased from UMC. Arsenic was purchased from Alfa Aesar (As, >99.99999%). Iodine was purchased from Alfa Aesar, and used without further purification (I$_2$, >99.9985%).

First, As was purified using CVT. An As source was placed at one end of a vacuum-sealed quartz tube ($10^{-4}$ Torr). Then, the source-end was heated up to 800° C. by a two-zone tube furnace (Lindberg, Thermo SCIENTIFIC). After 24 h, the furnace was turned off to let the quartz tube cool down to room temperature. During cooling, As vapor was transferred to the cold side of the quartz tube and crystalized to form solid As. Impurities were removed from the As during the CVT process, leaving yellow marks on the hot side of the quartz tube. The purified As crystals without a sign of impurities were carefully selected for the growth of c-BAs.

Extra care was taken in purification of B, since evaporation of B is not as effective as As. Instead of directly melting B, I$_2$ was utilized as a transport agent. At elevated temperature, B and I undergo the following reactions:

(A)

(B)

where (A) is exothermic and (B) is endothermic reactions above 500 K. When B and I$_2$ are directly used for c-BAs growth, the transport rate and efficiency of B are very low. It was unexpectedly discovered that c-BAs crystals themselves can serve as a very effective B source for the synthesis of high-quality c-BAs crystals. Using c-BAs instead of B source resulted in an increased rate and efficiency of the CVT process.

To prepare high-quality c-BAs single crystals, employed was a two-step CVT method including 1) synthesizing c-BAs crystals using B and As sources and 2) synthesizing high-quality c-BAs using a purified As source and c-BAs crystals that were prepared during the first CVT process. GaAs, SiC and quartz fiber were used as seed materials.

For the first CVT process, B, As and I$_2$ were placed together at the end of a sealed quartz tube under vacuum ($10^{-4}$ Torr). Using the two-zone tube furnace, the source-end was placed on the high-temperature zone at the fixed temperature of 890° C., and the seed materials (glass fiber or GaAs) were placed at the low-temperature zone at the fixed temperature of 790° C. The average time for CVT growth takes three weeks under the constant temperature gradient.

The second CVT step utilized c-BAs crystals instead of B. c-BAs crystals, purified As source and I$_2$ were placed at the hot-end of a sealed quartz tube. The rest of the process was identical to the first CVT process. The second-stage c-BAs crystals can be formed faster and have fewer impurities than the first-stage c-BAs crystals. Seed material placed at the cold end is important for the achievement of high-quality c-BAs single crystals. Samples with the highest quality were directly grown on GaAs wafers.

Carbon-doped c-BAs was prepared by using high-purity graphite powder from Alfa Aesar (C, 99.9999%). Graphite powder was placed on either the growth side or the source side of the sealed quartz tube with an atomic ratio of (B:C=20:1). The rest of the growth process was identical to the second-stage CVT method.

XRD

To confirm the crystal structure of c-BAs, X-ray diffraction (XRD) measurements were performed using Rigaku Smartlab X-ray diffractometer using Cu-K$\alpha$ radiation. A c-BAs single crystal was placed with a large surface parallel to the sample holder. The result confirmed the high-quality zincblende structure with a lattice constant of 4.777 Å with the orientation of the a-axis normal to the surface.

Optical Microscopy, Raman and PL

Raman and photoluminescence (PL) measurements are performed using Renishaw Invia Reflex Raman Confocal Microscope equipped with a fully automated Renishaw HSES motorized stage for fast two-dimensional (2D) mapping capability. A 532 nm laser with an intensity of 5-7 mW was utilized to excite the sample. Optical microscopy (OM) images for c-BAs were captured using Leica microscope.

c-BAs Variations

Table 1 shows c-BAs crystals from a number of batches synthesized using different precursors and methods. Batch 0, I and II were synthesized from the one-step CVT method with non-purified sources. Batch 0 was grown on quartz fiber or SiC seed materials. Batch I was doped with carbon (C), and grown on quartz fiber. Batch II was grown on GaAs wafers. Batch III was synthesized with two-step CVT methods using c-BAs and purified As source, and GaAs a seed material. Batch IV was synthesized with two-step CVT and doped with C.

TABLE 1 c-BAs Single Crystals
Batch Synthesis Condition

| Batch | Precursor | Doping | Seed |
|---|---|---|---|
| 0 | B and As | — | Quartz fiber, SiC |
| I | B and As | C | Quartz fiber |
| II | B and As | — | GaAs wafer |
| III | BAs and purified As | — | GaAs wafer |
| IV | BAs and purified As | C | GaAs wafer |

Raman measurements for Batches 0-IV (FIG. 5A) were performed and full-width at half maximum (FWHM) of the LO peaks and background Raman intensity $I_{BG}$ were measured. A broad distribution of FWHM and integrated background Raman intensity ($A_{BG}$) (FIG. 5B) was observed. Batch III, which was synthesized from the purified source and GaAs seed materials, showed a sharp LO peak and small background Raman intensity, indicating the low impurity concentrations compared with other batches.

Even with the two-step CVT method, however, c-BAs samples exhibited large spatial variation of impurities, which were confirmed with a large variation of thermal conductivity. Steady-state thermal conductivity measurements on large samples usually show lower values than frequency and time-domain thermal reflectance measurements that can be performed with high spatial resolution. A 110-nm Au film was deposited on eight c-BAs crystals, and frequency-domain thermoreflectance (FDTR) carried out to measure the thermal conductivity of c-BAs crystals. Five spots were measured for each sample, and plotted in FIG. 6.

TG Experiments

To measure thermal and electrical transport in c-BAs, optical transient grating (TG) was employed to measure a temporal response of electron-hole diffusion from the peak to the valley of the sinusoidal excitation in the sample. The experimental configuration of TG is shown in FIG. 7. A high-power femtosecond laser (Pharos-10W, Light Conversion) was utilized to generate femtosecond laser pulses with a wavelength λ=1030 nm, a repetition frequency of 25 kHz and a pulse duration of 290 fs. An optical parametric amplifier (Orpheus, Light Conversion) was used to generate pump pulses with varying wavelengths from 400 nm to 800 nm. A second harmonic generator (SHG, HIRO, Light Conversion) was utilized to generate 515 nm pulses, which serve as the probe. The pump and probe pulse energies were set to 60-360 nJ and 20-40 nJ with $1/e^2$ diameters of ~100 μm on the sample surface, respectively.

The pump beam was modulated by a mechanical chopper operating at 2 kHz. The probe beam was delayed by an optical delay stage up to 9 ns with respect to the pump beam. The pump and the probe beams were combined using a D-shaped mirror with a vertical offset of 1 mm. A piano-convex lens was utilized to focus pump and probe beams at a diffraction grating, and the diffracted pump and probe beams with +1 and −1 orders were collected by another piano convex lens at a focal distance ($f_1$) away from the diffraction grating. A convex lens with a focal distance ($f_2$) recombined +1 and −1 order pump beams with wavenumbers of $k_1$ and $k_2$ on a sample surface, and created a mirror image of the phase mask with a magnification ratio of ($f_2/f_1/2$).

The pump beams create an optical grating on the sample, which excites spatially sinusoidal electron-hole pairs. Electrons and holes undergo recombination and lateral diffusion from the peaks to the valleys of the sinusoidal excitation. The amplitude decay of the electron-hole wave is measured by the +1 and −1 orders time-delayed probe beams ($k_3$ and $k_4$). One of the diffracted probe beams ($k_4$) is used as a local oscillator (LO) for heterodyne detection. A Au-coated glass (170 μm) was utilized to attenuate the intensity of the LO beam by 99%. The other probe beam ($k_3$) was diffracted by the optical grating in the sample and subsequently combined with the LO beam at the direction of ($k_1-k_2+k_3$). A thin glass slide (170 μm) was mounted on a rotation stage and utilized to impose the phase difference φ between the LO and the probe beam. An iris was utilized to collect the probe beam which meets the phase-matching condition at ($k_1-k_2+k_3$). A sharp beam pass filter (515 nm) was utilized to reject the scattered pump beam.

A Si photodiode and a lock-in amplifier (SR830, Stanford Research Systems) synchronized with the mechanical chopper were utilized to measure the TG signal of the samples. To measure the thermal decay that takes a longer time than the t range of the delay stage, an avalanche photodiode (APD) and oscilloscope with a continuous wave (CW) probe beam were utilized.

TG Modeling

A mathematical model was utilized to calculate the ambipolar mobility of c-BAs from the temporal evolution of the sinusoidal electron-hole concentration profile in the sample. First, the photoexcited minority carrier concentration n was defined utilizing a partial differential equation. The pump beam was taken to be along the z-direction, and the sinusoidal electron-hole pair wave to propagate in the x-direction. The photoexcited electrons and holes in c-BAs will diffuse and recombine with each other until the concentration gradient becomes zero. The photoexcited minority carrier concentration n, which is defined by the carrier generation rate g, concentration gradient in the lateral direction (x) and thickness direction (z), and carrier lifetime r is calculated.

$$\frac{\delta n}{\delta t} = D_a \left( \frac{\delta^2 n}{\delta x^2} + \frac{\delta^2 n}{\delta z^2} \right) - \frac{n}{\tau} + g(x, z, t) \tag{1}$$

where the ambipolar diffusion coefficient $$D_a = \frac{k_B T \mu_a}{e},$$

$k_B$ is the Boltzmann constant, e is the elementary charge, T is temperature and $$\mu_a = \frac{2\mu_n \mu_p}{\mu_n + \mu_p}$$

is the ambipolar mobility. With semi-transparent samples, the initial carrier generation profile g by TG grating can be defined as:

$$g(x, z, t) = \delta(t)\cos(qx)[C_1 e^{-\alpha z} + C_2 e^{\alpha z}] \tag{2}$$

where q is the wavenumber of optical grating on the sample, $k_1$ and $k_2$ are given as:

$$C_1 = \frac{A_0 \varsigma a (1-R) \exp\left(-\frac{ad}{2}\right)}{1 - R^2 \exp(-2ad)} \quad (3)$$

$$C_2 = C_1 R \exp(-ad) \quad (4)$$

where $A_0$ is the number of photons arriving on the sample per unit area, a is extinction coefficient, ç is the quantum efficiency and R is the reflectance of c-BAs. Then, (1) was solved in the frequency domain ω. This approach allows the separation of variables x and z where $n = \cos(qx)Z$. After Fourier transformation, $Z(z,\omega)$ is determined from:

$$i\omega Z = D_a\left(-q^2 Z + \frac{\delta^2 Z}{\delta z^2}\right) - \frac{Z}{\tau} + k_1 e^{-az} + k_2 e^{az} \quad (5)$$

which can be rearranged to:

$$\frac{\delta^2 Z}{\delta z^2} + \left(-\frac{i\omega}{D_a} - q^2 - \frac{1}{D_a \tau}\right)Z + \frac{k_1 e^{-az} + k_2 e^{az}}{D_a} = 0 \quad (6)$$

The solution for Z is:

$$Z = A\cos(\beta z) + B\sin(\beta z) - \frac{k_1/D_a}{a^2 + \beta^2}e^{-az} - \frac{k_2/D_a}{a^2 + \beta^2}e^{az} \quad (7)$$

where $\beta = \sqrt{-\frac{i\omega}{D_a} - q^2 - \frac{1}{D_a \tau}}$

For a thin c-BAs crystal with a thickness of d, electron-hole recombinations at the top and bottom surfaces affect the electron-hole concentration profile (34). Applying surface recombination boundary conditions at d/2 and −d/2 gives:

$$D_a \frac{dZ}{dz}\bigg|_{z=d/2} = -vZ \quad (8)$$

$$\frac{1}{Z}\frac{dZ}{dz} = \quad (9)$$

$$\frac{-A\beta \sin(\beta d/2) + B\beta \cos(\beta d/2) + \frac{k_1/D}{a^2+\beta^2}ae^{-ad/2} - \frac{k_2/D}{a^2+\beta^2}ae^{ad/2}}{A\cos(\beta d/2) + B\sin(\beta d/2) - \frac{k_1/D}{a^2+\beta^2}e^{-ad/2} - \frac{k_2/D}{a^2+\beta^2}e^{ad/2}} = -\frac{v}{D_a}$$

$$D_a \frac{dZ}{dz}\bigg|_{z=-d/2} = vZ \quad (10)$$

$$\frac{1}{Z}\frac{dZ}{dz} = \quad (11)$$

$$\frac{A\beta \sin(\beta d/2) + B\beta \cos(\beta d/2) + \frac{k_1/D}{a^2+\beta^2}ae^{ad/2} - \frac{k_2/D}{a^2+\beta^2}ae^{-ad/2}}{A\cos(\beta d/2) - B\sin(\beta d/2) - \frac{k_1/D}{a^2+\beta^2}e^{ad/2} - \frac{k_2/D}{a^2+\beta^2}e^{ad/2}} = \frac{v}{D_a}$$

where v is the surface recombination velocity. Subtracting (9) with (11) gives:

$$A = B\frac{\left[\beta\cos(\beta d/2) + \frac{v}{D_a}\sin(\beta d/2)\right]}{\left[\frac{v}{D_a}\cos(\beta d/2) - \beta\sin(\beta d/2)\right]} + \quad (12)$$

$$\frac{1/D_a}{a^2 + \beta^2} \frac{\left[k_1\left(a + \frac{v}{D_a}\right)e^{ad/2} + \left(\frac{v}{D_a} - a\right)k_2 e^{-ad/2}\right]}{\left[\frac{v}{D_a}\cos(\beta d/2) - \beta\sin(\beta d/2)\right]}$$

$$(13)$$

$$B = \frac{A(k_1 - k_2)\left[\sin(\beta d/2)\sinh(ad/2) + \frac{a}{\beta}\cos(\beta d/2)\cosh(ad/2)\right] - \frac{a(k_2 - k_1)}{D_a \beta(a^2 + \beta^2)}}{\left\{A + (k_1 + k_2)\left[\cos(\beta d/2)\cosh(ad/2) - \frac{a}{\beta}\sin(\beta d/2)\sinh(ad/2)\right]\right\}}$$

A and B are solved iteratively. The first two terms of (7) are related to the complex surface recombination term $Z_S$. The last two terms of (7) are related to the lateral diffusion of photoexcited carriers $Z_L$. Discrete inverse Fourier transformation was performed to calculate the numerical solution for $Z_S$. $Z_L$ is directly converted to time-domain concentration using inverse Fourier transformation.

$$\frac{k_1}{D_a(q^2 - a^2) + \frac{1}{\tau} + i\omega}e^{-az} \xrightarrow{F^{-1}} k_1 e^{-(D_a q^2 + 1/\tau)t}e^{-az} \quad (14)$$

$$\frac{k_2}{D_a(q^2 - a^2) + \frac{1}{\tau} + i\omega}e^{az} \xrightarrow{F^{-1}} k_2 e^{-(D_a q^2 + 1/\tau)t}e^{az} \quad (15)$$

$$Z_L(z,t) = (k_1 e^{-az} + k_2 e^{az})e^{-(D_a q^2 + 1/\tau)t} \quad (16)$$

FIG. 8A shows the change of the photoexcited carrier density profile $Z_L$ due to lateral diffusion (x-direction) at x=0. Optical constants were utilized for c-BAs from the literature. A thin (10 μm) c-BAs sample with an extremely large surface recombination velocity v=10,000 cm s$^{-1}$ was considered to estimate the effect of surface recombination on the carrier profile. FIG. 8B shows the carrier density change in the thickness direction (z-direction) due to surface recombination ($Z_S$) at x=0. Even with an extremely high surface recombination velocity, a $Z_S$ about an order of magnitude smaller than $Z_L$ was observed, suggesting that the lateral diffusion is the dominant driving force for TG signal. The total photoexcited minority carrier concentration $Z_L + Z_S$ is shown in FIG. 8C.

After excitation by the pump beam, the probe beam was utilized to measure the decay of the amplitude of the sinusoidal wave by measuring the intensity of diffracted probe beam. For semi-transparent c-BAs crystals with a thickness d, the transmitted intensity for the probe beam changes with the photoexcited carrier density N(x,t) in the beam path.

$$N(x, t) = \int_{-d/2}^{d/2} \cos(qx)(Z_L + Z_S) dz \quad (17)$$

The numerical solution of N(x,t) matched the following analytical solution with an exponential decay:

$$N(x, t) = \frac{N_0}{2}(e^{-iqx} + e^{iqx})e^{-\Gamma t} \quad (18)$$

where N0 is the total photoexcited minority carrier concentration and $\Gamma = D_a q^2 + 1/\tau_{\text{eff}}$. $\tau_{\text{eff}}$ is the effective minority carrier lifetime. The expression for $\Gamma$ is similar to the fundamental decay rate of time-resolved photoluminescence experiments where $1/\tau_{\text{eff}} = 1/\tau + 1/\tau_s$ and $\tau_s$ is the surface recombination time.

The transmission coefficient T(x,t) changes with the photoexcited carrier concentration as $T(x, t) = T_0 + \alpha N(x, t)$ with small N(x,t) where $T_0$ is the initial transmission coefficient and $\alpha$ is the absorption coefficient. The transmitted electric field $E_t$ is defined as:

$$E_t = E_i(T_0 + \alpha N(x, t))e^{ikx}e^{ikz} \quad (19)$$

$$E_t = E_i T_0 e^{ikx} e^{ikz} + E_i \frac{N}{2}\alpha e^{-iqx} e^{ikx} e^{ikz} + E_i \frac{N_0}{2}\alpha e^{iqx} e^{-\Gamma t} e^{ikx} e^{ikz} \quad (20)$$

where $E_i$ is the incident electric field and k is the wavenumber of the probe beam. The second and third terms of (20) are electric fields of +1 and −1 order probe beams. The diffracted probe beam intensity is exponentially decaying with $2\Gamma$.

$$I = |E_{\pm 1}|^2 \propto e^{-2\Gamma t} \quad (21)$$

To enhance the signal-to-noise ratio, heterodyne detection was utilized by combining the diffracted probe beam with a LO beam with a phase angle with respect to the probe.

$$I(\varphi) = |E_{LO}e^{i\varphi} + E_{\pm 1}|^2 = |E_{LO}|^2 + |E_{\pm 1}|^2 + 2|E_{LO}E_{\pm 1}|\cos\varphi \quad (22)$$

The angle of the rotational stage was changed to find $\varphi = 0$ and $\pi$, and subtract one from the other. The subtracted heterodyne signal is exponentially decaying with $\tau$.

$$I(0) - I(\pi) = 4|E_{LO}E_{\pm 1}|\propto e^{-\Gamma t} \quad (23)$$

Depending on signal-to-noise, either diffraction or heterodyne TG signals were utilized to calculate ambipolar mobility of c-BAs. Decay rate $\Gamma = D_a q^2 + 1/\tau_{\text{eff}}$ with varying diffraction grating $q^2$ was plotted. The slope of $\Gamma$ vs. $q^2$ equals ambipolar diffusivity, and the y-intersection point equals $1/\tau_{\text{eff}}$.

Using the solutions of N(x,t), TG decay curves of c-BAs and Si with $\nu = 0$ to 100,000 cm s$^{-1}$ were calculated to evaluate the effect of surface recombination on the TG signal. A carrier lifetime of $\tau = 6$ ns was utilized for all calculations. For smaller grating periods and larger diffusivity where $D_a q^2 > 4\nu^2/D_a$, surface recombination does not affect the TG decay signal. As the grating size increases and the $D_a$ decreases, the vertical concentration gradient change by the surface recombination becomes increasingly important compared with the lateral concentration gradient. This results in an increased effect of surface recombination on TG signal.

Figure 9C:
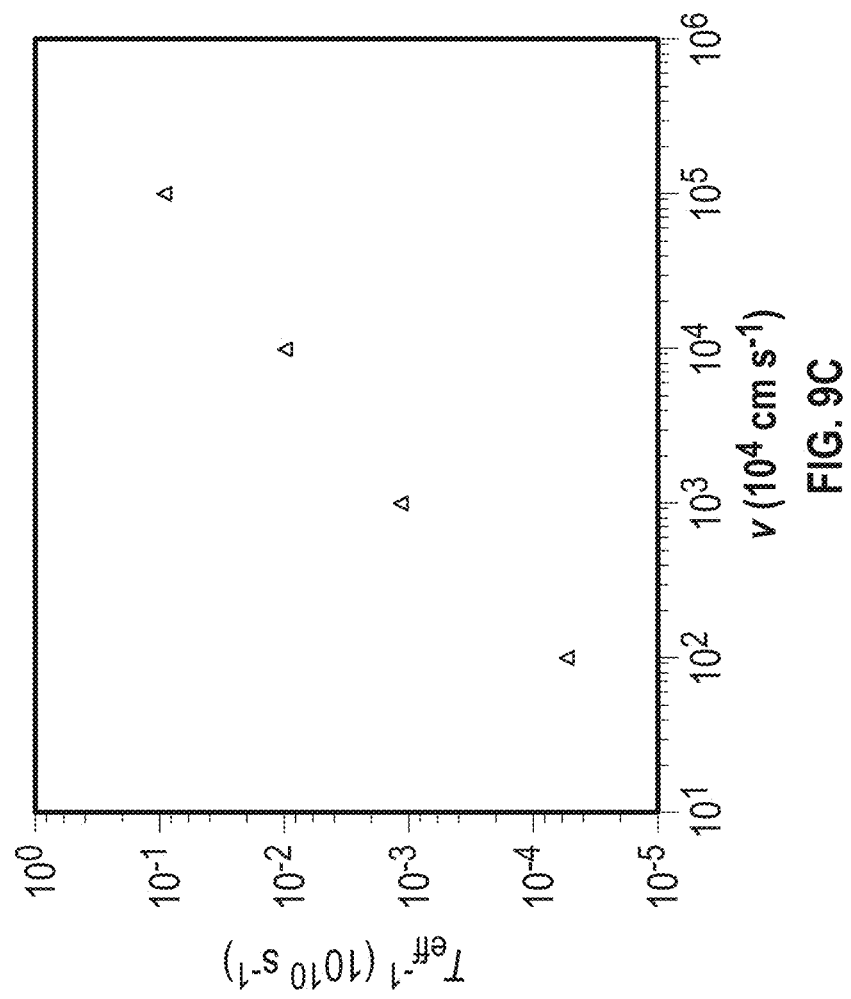

FIG. 9A shows the calculated TG curves for Si with and without the surface recombination. Literature optical properties of Si were utilized with $\tau = 10$ μs. For $D_a q^2 \sim 4\nu^2/D_a$, the deviation of the TG decay without surface recombination is observed. As all curves show single exponential decay, the exponential decay rate $\Gamma$ with varying surface recombination velocities is plotted in FIG. 9B. Increasing $\nu$ results in the upshift of $\Gamma$, as it increases the surface recombination rate $1/\tau_s$. It is observed that $1/\tau_{\text{eff}}$, the y-intersection point of $\Gamma$ vs. $q^2$ plot, is proportional to $\nu$ (FIG. 9C). However, the slope of $\Gamma$ vs. $q^2$, does not change with respect to $\nu$. Thus, the TG measurements can measure $D_a$ independent of the thickness and surface recombination of the sample.

TG Measurement

Transmission TG experiments were measured for a 2-μm thick Si membrane. FIG. 10A shows the measured TG signal for the Si membrane with a varying phase angle φ. The results clearly show the electrical decay at the shorter delay time and the thermal decay at the longer delay time with opposite signs. The maximum and minimum curves (φ=0 and 180°) are subtracted and normalized to calculate thermal conductivity κ and ambipolar mobility $\mu_a$ of Si.

Figure 10B:
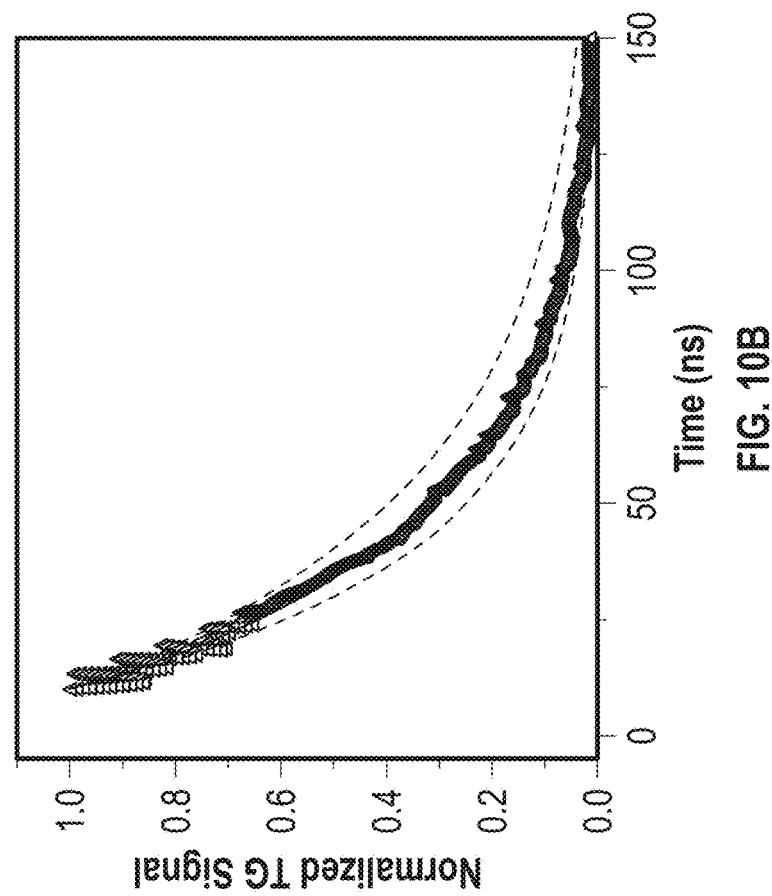
Figure 10A:
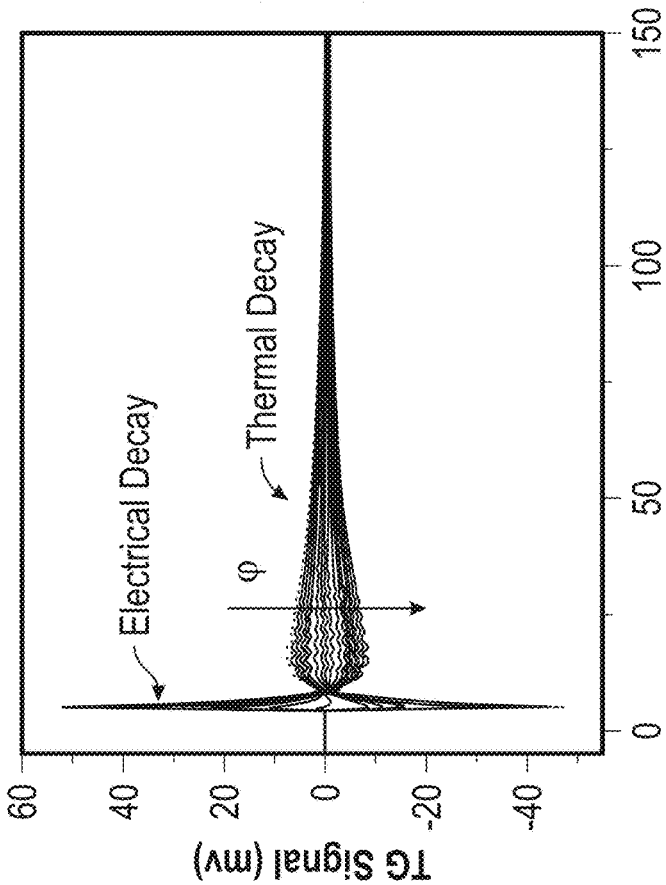
Figure 11:
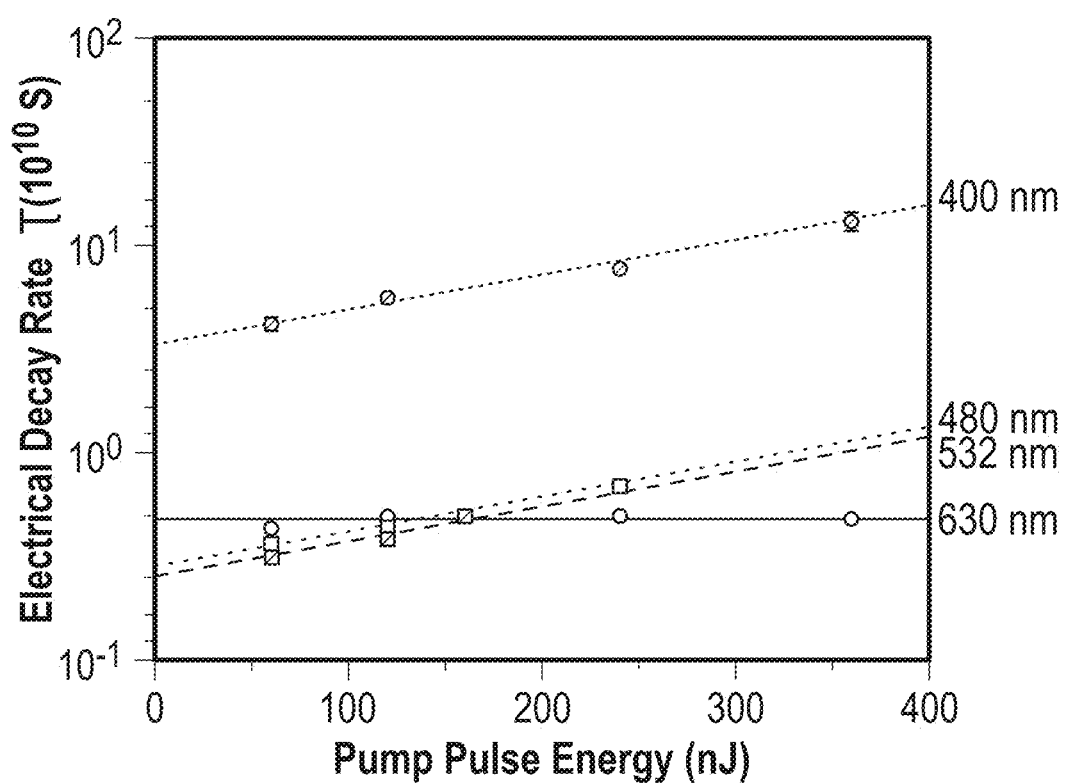
FIG. 11 depicts the power-dependent TG decay rate for c-BAs with varying pump wavelengths.

FIG. 10B shows the measured and fitted thermal decay curve for the Si membrane. For the grating period large enough compared with the mean-free-paths of heat-carrying phonons, the thermal decay rate $\Gamma_{Th} = D_{Th} q^2$ where $D_{Th} = \kappa/C$, κ is the thermal conductivity and C is heat capacity per unit volume of sample. $\kappa = 94$ W m$^{-1}$ K$^{-1}$ was measured for Si membrane, and is about 30% lower than the bulk value due to boundary scattering.

Calculation of electrical mobility requires multiple TG measurements with varying q to negate the effect of electron-hole recombinations. FIG. 10C shows the measured and fitted TG curves with varying grating periods. FIG. 10D shows electrical decay $\tau$ vs. $q^2$ of the Si membrane. The slope, $D_a$, is 16.4 cm$^2$ s$^{-1}$, which can be converted to $\mu_a = 638$ cm$^2$ V$^{-1}$ s$^{-1}$. This value is consistent with the literature.

For BAs, $\tau$ depends on the wavelength (FIG. 11). For pump wavelength shorter than the bandgap value, $\tau$ is much faster than the $\tau$ measured with the pump beam wavelength close to the bandgap value (see FIG. 2D). This effect leads to the overestimation of $\mu_a$ with short wavelength TG measurements. $\tau$ depends on the power of the pump beam for wavelengths below 600 nm. At wavelengths above 600 nm, $\tau$ is independent of power and wavelength.

Effect of Carbon Doping c-BAs (Batch II and IV) was intentionally doped with carbon to study the effect of doping on optical, thermal and electrical properties of c-BAs. It was observed that C-doped c-BAs samples not only exhibit relatively broader LO peaks and higher $I_{BG}$ (see Batch I and IV in FIG. 5B) but also exhibited dark color, clearly distinguishable from high-quality, semi-transparent c-BAs crystals (FIG. 12). FIG. 13 shows that C-doped c-BAs exhibits bright and irregular Raman background intensity and almost no PL emission.

Computational Details for Example 1

All the first-principles calculations were performed using the QUANTUM ESPRESSO package. Optimized Norm- Conserving Vanderbilt (ONCV) pseudopotential was utilized with the approximated exchange-correlation functional proposed by Perdew, Burke, and Ernzerhof (PBE). A cutoff energy of 80 Ryd and an 8×8×8 k-mesh were utilized to determine the equilibrium lattice constant. The equilibrium properties of phonons and the electron-phonon interaction matrices were calculated via density functional perturbation theory with a 4×4×4 q-mesh and an 8×8×8 k-mesh. The EPW package was utilized to interpolate the electronic information, the phonon information, as well as the electron-phonon coupling matrices to a fine mesh (i.e. 120×120×120 k-mesh and 60×60×60 q-mesh).

First-Principles Calculation of Defect Potential

The impurity potential is the difference in the total electronic potential between the system with the defect and the original pristine system $\Delta \hat{V} = V_d - V_{bulk}$. The impurity potential consists of short-range part due to change of atomic structure and long-range part due to the additional charge carried by the defect. Typically the impurity potential is obtained by building a large supercell and calculating the defect potential for the pure and defected systems separately. However, the long-range Coulomb potential cannot be correctly represented due to the cut-off at the supercell boundary. This problem could be solved by describing the long-range part of the defect as an analytic Coulomb potential profile as detailed below.

Figure 14A:
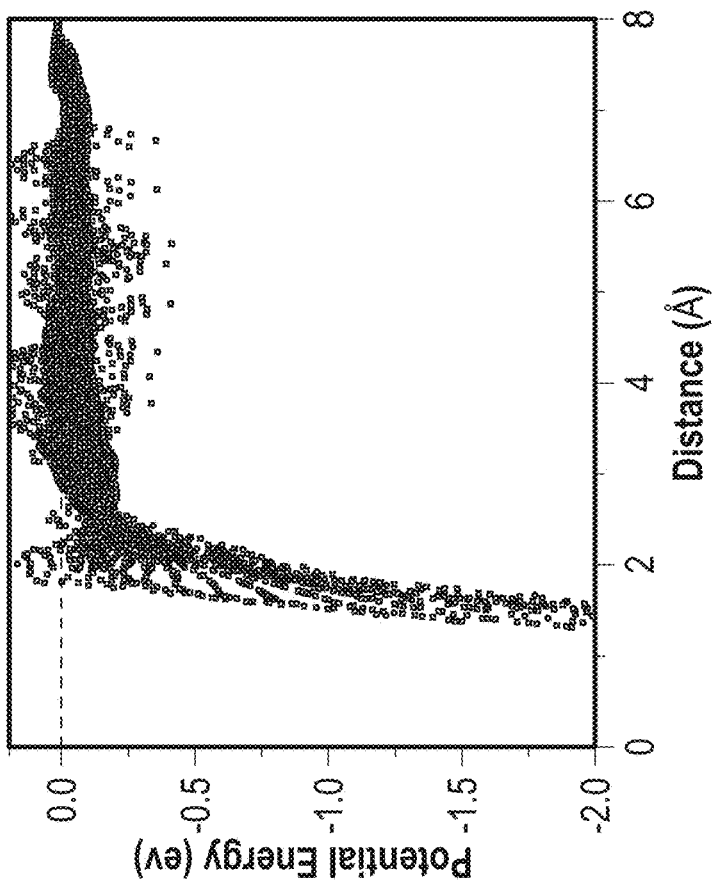
FIGS. 14A-14B depict subtraction of the long-range Coulomb potential from ab initio defect potential profiles.
Figure 14B:
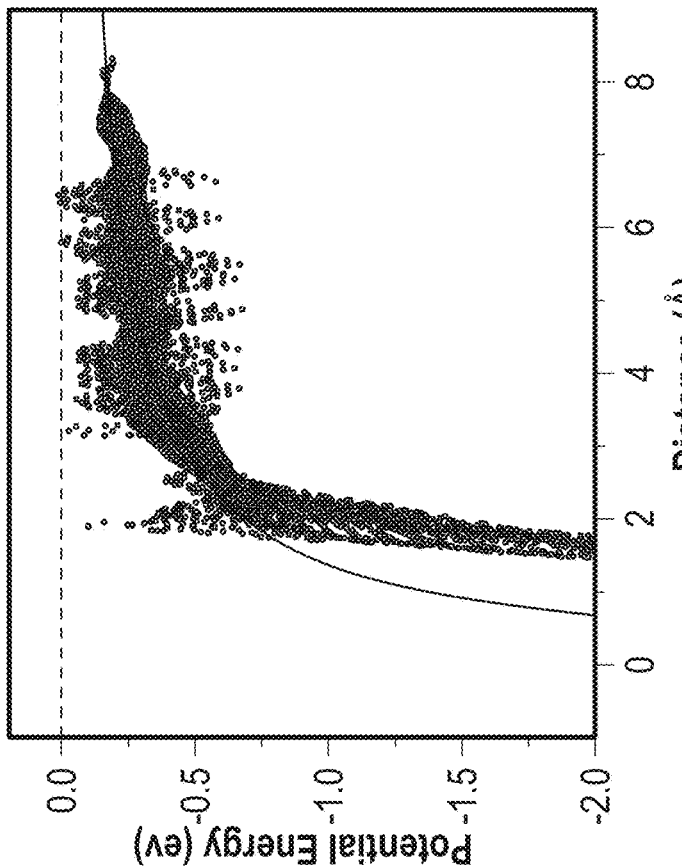

A c-BAs supercell was built with a 2×2×2 conventional unit cell and replaced one B/As atom with a dopant atom (C, Si, or Ge). The defect potential was obtained by subtracting the potential of pure c-BAs from the one with the dopant atom. For the latter calculation, the total charge of the supercell was taken to be +1e/−1e, making the dopant positively/negatively charged. The defect potentials corresponding to the Si dopants (B site) in c-BAs are shown in FIG. 14A.

This gradually decaying profile is the long-range Coulomb potential of the defect charge. For an infinite periodic array of charge Ze at locations $R_i$ corresponding to the corners of the periodic supercell, the Coulomb potential at r is:

$$\Delta \hat{V}_{lr} = -\sum_{i} \frac{Ze^2}{\sqrt{|\bar{\varepsilon}|}} \frac{\mathrm{erfc}\left(\gamma \sqrt{(R_i - r) \cdot \bar{\varepsilon}^{-1}(R_i - r)}\right)}{\sqrt{(R_i - r) \cdot \bar{\varepsilon}^{-1}(R_i - r)}} - \sum_{G_i}^{i \neq 0} \frac{4\pi Ze^2}{\Omega} \frac{\exp\left(-G_i \cdot \bar{\varepsilon} \cdot \frac{G_i}{4\gamma^2}\right)}{G_i \cdot \bar{\varepsilon} \cdot G_i} \exp(iG_i \cdot r) + \frac{\pi Ze^2}{\Omega \gamma^2} \tag{24}$$

Here $\bar{\varepsilon}$ is the dielectric tensor computed from first principles, $\Omega$ is the supercell volume, Z=1 is the defect charge, and $\gamma$ is a convergence parameter for the Ewald summation. This long-range Coulomb potential is also plotted in FIG. 14A as a reference, which matches well with the asymptotic trend of all defect potentials extracted from the first-principles calculations. If this long-range term is subtracted from the defect potential, only a short-range component remains (FIG. 14B), which becomes flat away from the defect. The potential is aligned at the farthest distance from the defect to zero, based on its short-range nature.

First-Principles Electron Transport Calculation

First-principles calculation of mobility µ is based on the Boltzmann transport theory:

$$\mu = \frac{e}{3n} \sum_{k\alpha} v_{k\alpha}^2 \tau_{k\alpha} \left(-\frac{\partial f_{k\alpha}^0}{\partial E}\right) \tag{25}$$

where n is the total carrier concentration, given by $$n = \frac{1}{\Omega_0 N_k} \sum_{k\alpha} f_{k\alpha}^0,$$

e is the electronic charge, $\Omega_0$ is the unit cell volume, $N_k$ is the number of k points, $\alpha$ is the band index, $v_{k\alpha}$ is the electron group velocity, $\tau_{k\alpha}$ is the electron relaxation time, E is the electron energy, and $f_{k\alpha}^0$ is the Fermi-Dirac distribution. The electron energy and group velocity are derived from the electronic band structure. The electron relaxation time τ is determined via Matthiessen's rule considering both intrinsic electron-phonon interactions and extrinsic electron-defect interactions: $1/\tau = 1/\tau_{e-ph} + 1/\Sigma_{e-d}$. The electron-phonon interaction matrices are first calculated within density functional perturbation theory and then interpolated via the Wannier interpolation scheme to the fine mesh.

The intrinsic electron-phonon scattering rates are related to the electron-phonon interaction matrix g(k, k+q, q) via:

$$\frac{1}{\tau_k^{e-ph}} = \frac{2\pi}{\hbar} \frac{1}{N_q} \sum_q |g(k, k+q, q)|^2 \cdot \left[ \begin{matrix} (n_q + f_{k+q})\delta(E_k - E_{k+q} + \hbar\omega_q) + \\ (n_q + 1 - f_{k+q})\delta(E_k - E_{k+q} - \hbar\omega_q) \end{matrix} \right] \tag{26}$$

which sums over all possible scattering processes that satisfy momentum and energy conservations using a tetrahedral integration method, where $N_q$ is the number of q points, $n_q$ is the Bose-Einstein distribution for phonons, and the delta functions indicate the energy conservation.

The electron-defect scattering rates were determined by the electron-defect interaction (EDI) matrix $g_{e-d}$(k, k') via:

$$\frac{1}{\tau_k^{e-d}} = N_d \Omega_0 \frac{2\pi}{\hbar} \frac{1}{N_k} \sum_{k'} \left(1 - \frac{v_k \cdot v_{k'}}{|v_k||v_{k'}|}\right) |g_{e-d}(k, k')|^2 \delta(E_k - E_{k'}) \tag{27}$$

where $N_d$ is the volume density of defects, the factor $$1 - \frac{v_k \cdot v_{k'}}{|v_k||v_{k'}|}$$

takes into account the fact that scatterings between electrons with similar velocity directions do not contribute much to momentum loss and thus less to electrical resistance. $g_{e-d}$(k,k')=$\langle \psi_{k'} | \Delta \hat{V} | \psi_k \rangle$ is the EDI matrix.

As discussed before, the defect potential $\Delta \hat{V}$ contains both long-range and short-range parts, leading to two contributions to EDI. To compute these contributions, the EDI matrix is first rewritten as follows:

$$\langle \psi_k | \Delta \hat{V} | \psi_{k'} \rangle = \tag{28}$$

$$\int d^3 r u_{k'}^* e^{-ik'\cdot r} \Delta \hat{V} u_k e^{ik\cdot r} = \sum_G \Delta V(k'-k+G) \langle u_{k'} | e^{iG\cdot r} | u_k \rangle$$

where the Fourier transform of the defect potential is defined as $$\Delta V(q) = \frac{1}{\Omega_0} \int d^3 r \Delta \hat{V}(r) e^{-iq\cdot r},$$

and the integration spanning the entire space. This form separates the defect potential from the wave functions, and the factor containing wavefunctions can be computed readily once the periodic components $u_k$ of the wavefunctions are known:

$$\langle u_{k'} | e^{iG\cdot r} | u_k \rangle = \int d^3 r u_{k'}^* e^{-iG\cdot r} u_k,$$

where the integration spans over the unit cell. To evaluate the EDI matrix, computed was the Fourier component of the defect potential $\Delta V(q)$, which again contains both long-range and short-range parts. The short-range part can be calculated readily within the supercell based on $$\Delta V_{sr}(q) = \frac{1}{\Omega_0} \int d^3 r \Delta \hat{V}_{sr}(r) e^{-iq\cdot r}$$

since the potential has negligible contributions at far distances. The long-range part can be obtained by performing the integration analytically to infinity, yielding $$\Delta V_{lr}(q) = -\frac{Ze^2}{\Omega_0 \varepsilon \varepsilon_0} \frac{1}{|q|^2 + (1/L_D)^2}.$$

For this expression, the Coulomb potential energy has been assumed to be given by $$\Delta \hat{V}_{lr}(r) = -\frac{Ze^2}{4\pi \varepsilon \varepsilon_0 r} e^{-r/L_D}$$

where the factor $e^{-r/L_D}$ considers the carrier screening at high carrier concentrations with the Debye screening length $L_D$ given by $$L_D = \left( \frac{e^2}{\varepsilon \varepsilon_0} \int \left( -\frac{\partial f}{\partial E} \right) D(E) dE \right)^{-1/2} \tag{29}$$

Adding both long-range and short-range components as $\Delta V(q) = \Delta V_{sr}(q) + \Delta V_{lr}(q)$ allows us to evaluate the EDI matrix completely.

Temperature-Dependent TG Measurements

For temperature-dependent mobility measurement, a microscope cryostat (MicrostatHe, Oxford) was utilized to control the temperature of c-BAs samples (Batch III) during measurement. The same spot was measured with two diffraction gratings (7.45 and 11.48 µm) and linear interpolation performed to calculate $D_a$. Then, $D_a$ was converted to $\mu_a$ using the Einstein relationship $$D_a = \frac{k_B T \mu_a}{e}$$

from 200 K to 400 K.

Hall Effect Measurements

Figure 16C:
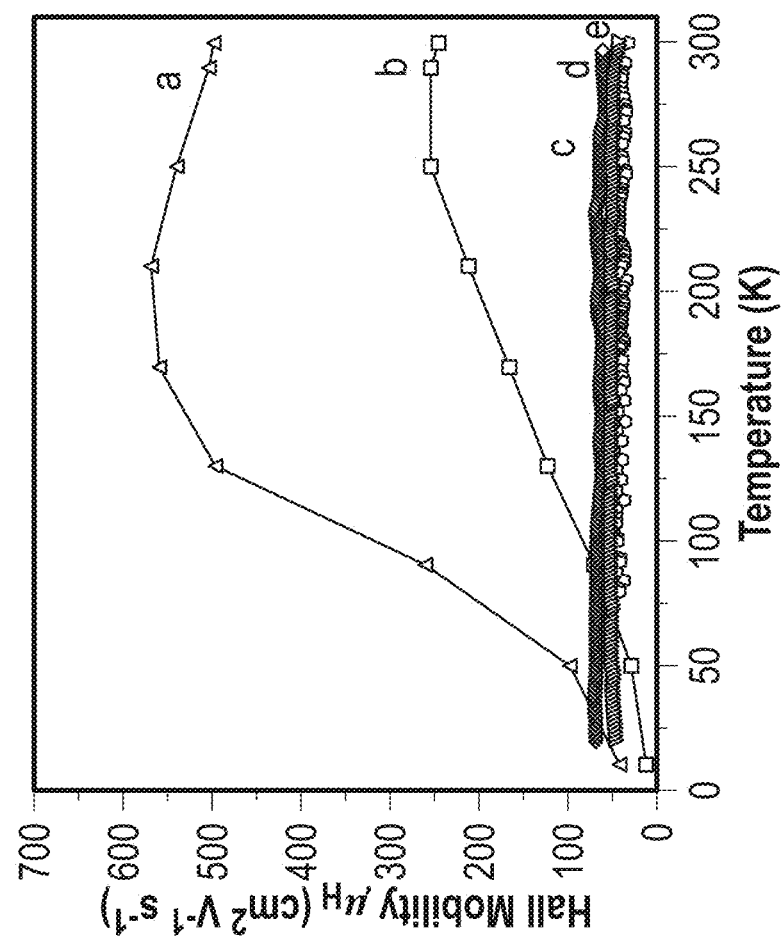

FIG. 16 shows Hall effect measurement data for c-BAs crystals. Longitudinal ($R_{xx}$) and the Hall ($R_{xy}$) resistance were simultaneously measured over the temperature range between 10 and 300 K with a five-probe geometry using a Quantum Design Physical Property Measurement System (PPMS). c-BAs single crystals were mounted on $SiN_x$/Si wafer chip and the contact wires were attached with a minimum amount of silver epoxy followed by curing at 165° C. for 5 min to reduce the contact resistance. The sample thickness and the distance between contact probes and were measured using an optical microscope after the measurement.

Based on the Hall resistance, all the c-BAs samples exhibit p-type conducting behavior. To ensure the Hall carrier concentration, Hall resistance was measured by sweeping the magnetic field at a fixed temperature (RH cycles, scatters with dashed line) and sweeping the temperature at the fixed magnetic field (RT cycles, scatters). Each point was averaged from three measurements. The step sizes of RH cycle and RT cycle are 100 Oe and 4 K, respectively. The measured Hall resistances were line fitted to obtain the Hall carrier concentration and its measurement uncertainty with the 95% confidence interval.

Hole concentration p was measured from $10^{17}$ cm$^{-3}$ to $10^{20}$ cm$^{-3}$. For samples with p>$10^{19}$ cm$^{-3}$, metallic behavior was observed where the longitudinal resistivity $\rho_{xx}$ and Hall mobility $\mu_H$ do not change significantly with temperature. Hall mobility $\mu_H$ remains below 100 cm$^2$ V$^{-1}$ s$^{-1}$. For samples with p<$10^{19}$ cm$^{-3}$, a significant enhancement in PH was observed, which shows semiconducting behavior with temperature. The measured bulk mobilities and concentrations agreed with corresponding mobility calculations as a function of charged impurity density (see FIG. 3B).

Example 2: Ultrahigh Ambipolar Mobility of Herein Disclosed Cubic Boron Arsenide Revealed by Transient Reflectivity Microscopy As noted above, semiconducting cubic boron arsenide (c-BAs) has shown high thermal conductivity and predicted carrier mobility values of 1,400 cm$^2$V$^{-1}$s$^{-1}$ for electrons and 2,100 cm$^2$V$^{-1}$s$^{-1}$ for holes at room temperature. Using pump-probe scanning transient reflectivity microscopy, the diffusion of photo-excited carriers was monitored in single-crystal c-BAs to obtain the mobility thereof. With near-bandgap 600 nm pump pulses, a high ambipolar mobility of 1550±120 cm$^2$V$^{-1}$s$^{-1}$, in good agreement with theoretical prediction. Additional experiments with 400 nm pumps on the same spot revealed a mobility greater than 3,000 cm$^2$V$^{-1}$s$^{-1}$, which can be attributed to hot electrons. The observation of high carrier mobility, in conjunction with high thermal conductivity, enables an enormous number of device applications for the herein disclosed c-BAs in high performance electronics and optoelectronics.

In this Example 2, the herein disclosed higher-than-expected carrier mobility in cubic boron arsenide crystals is revealed by scanning transient reflectivity microscopy.

In 2018, the predicted high room-temperature thermal conductivity ($\kappa$) of cubic boron arsenide (c-BAs), greater than 1,300 $Wm^{-1}k^{-1}$, was experimentally demonstrated. A higher hole mobility of greater than 3,000 $cm^2V^{-1}s^{-1}$ was later predicted under a small 1% strain. Such a high carrier mobility is due to a weak electron-phonon interaction and small effective mass. Like those predicting the thermal conductivity of c-BAs, these calculations were based on non-defective c-BAs with high crystal quality and a very low impurity level. The simultaneous high thermal conductivity and carrier mobility makes c-BAs a promising material for many applications in electronics and optoelectronics. Despite the inspiring prediction, the high mobility has not heretofore been experimentally achieved. Using ultrafast spatial-temporal transient reflectivity microscopy, an ambipolar mobility of about 1550 $cm^2V^{-1}s^{-1}$ was observed in the herein disclosed c-BAs single crystals, and a greater than 3,000 $cm^2V^{-1}s^{-1}$ mobility obtained for photo-excited hot carriers. Photoluminescence and Raman spectroscopy were utilized in this Example 2 to probe the relative level of p-type doping and it was discovered that a high hole concentration will significantly reduce the ambipolar mobility. In this Example 2, ultrafast spatial-temporal transient reflectivity microscopy was utilized and carrier mobility in c-BAs single crystals as described herein was found to be much higher than that predicted or expected. The mobility has been found to be strongly dependent on the facet and location within the crystal.

In this Example 2, c-BAs single crystals were grown using the same seeded chemical vapor transport technique reported in Example 1 hereinabove. These crystals typically appeared as slabs with (111) top and bottom surfaces.

FIG. 17A-17D depict characterizations of a c-BAs single crystal (Sample 1) on a corner facet (111): FIG. 17A depicts Scanning electron microscopy image; FIG. 17B depicts X-ray diffraction pattern. Inset: magnified view of the (111) peak; FIG. 17C depicts Raman spectrum excited by a 532 nm laser, with inset showing high-resolution spectrum of the LO phonon; and FIG. 17D depicting photoluminescence spectrum excited by a 593 nm laser, with inset showing photoluminescence mapping from the region marked by a rectangle in FIG. 17A, Scale bar: 10 µm.

FIG. 17A shows a scanning electron microscopy (SEM) image of a corner facet (111) of an as-grown c-BAs slab (labeled as sample 1). This facet is one of eight equivalent (111) surfaces and was chosen for mobility measurement because of its relatively high quality, which can be seen from the sharp (0.02°) characteristic peaks in the X-ray diffraction (XRD) pattern shown in FIG. 17B and its inset, a narrow (0.6 $cm^{-1}$) LO phonon peak at 700 $cm^{-1}$ in the Raman spectrum (FIG. 17C and its inset) shown in FIG. 17C, and the characteristic bandgap photoluminescence (PL) peak at 720 nm in the PL spectrum shown in FIG. 17D, indicating high-quality crystal lattices, a low mass disorder, and a low defect density, respectively. PL mapping shown in the inset to FIG. 17D also indicates the uniform crystal quality on the (111) surface. All measurements reported here were performed at room temperature. Further characterizations of sample 1 and another c-BAs slab (labeled sample 2) are provided in FIG. 21.

Figure 18A:
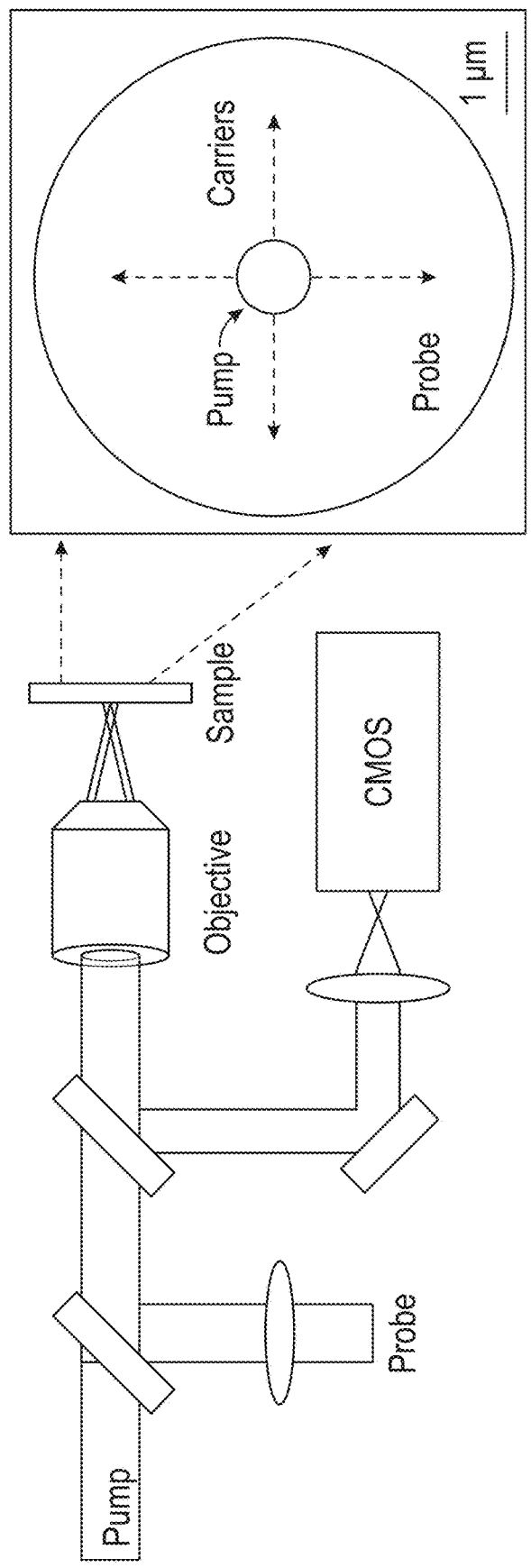
FIGS. 18A-18E depict pump-probe transient reflectivity microscopy, carrier dynamics, and diffusion in sample 1.
Figure 18B:
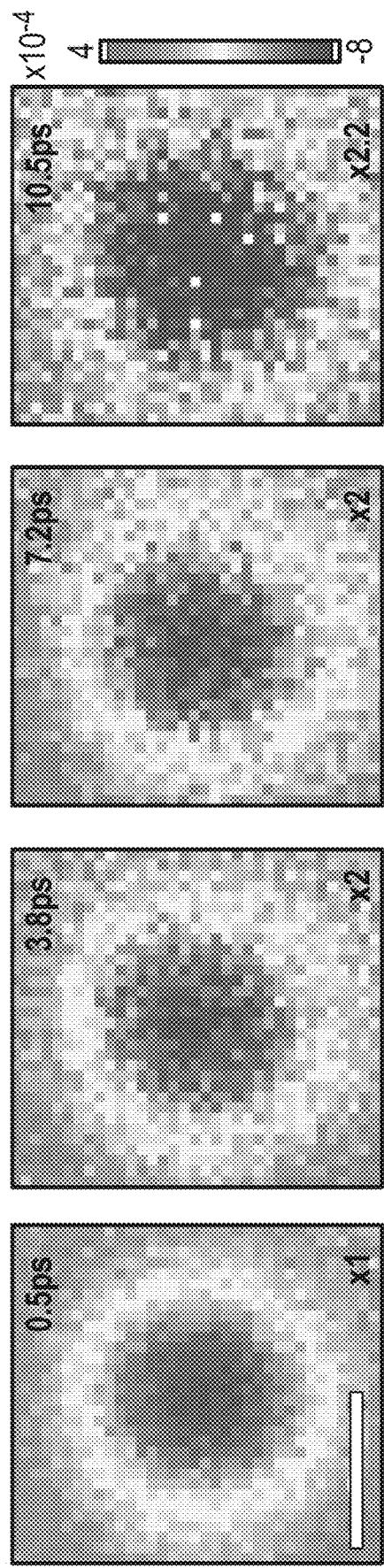
Figure 18C:
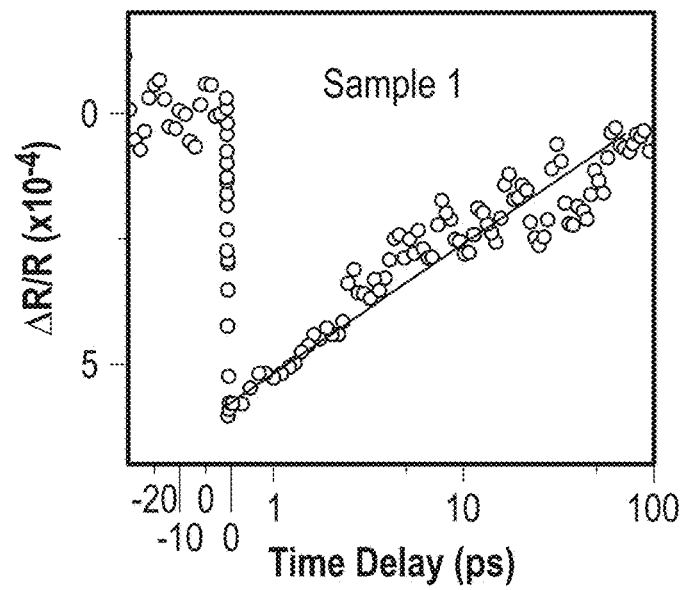
Figure 18D:
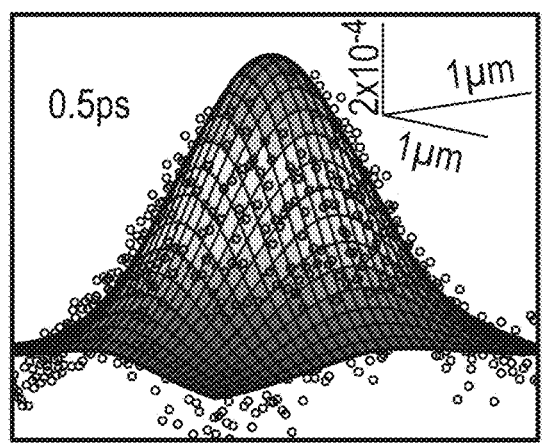
Figure 18E:
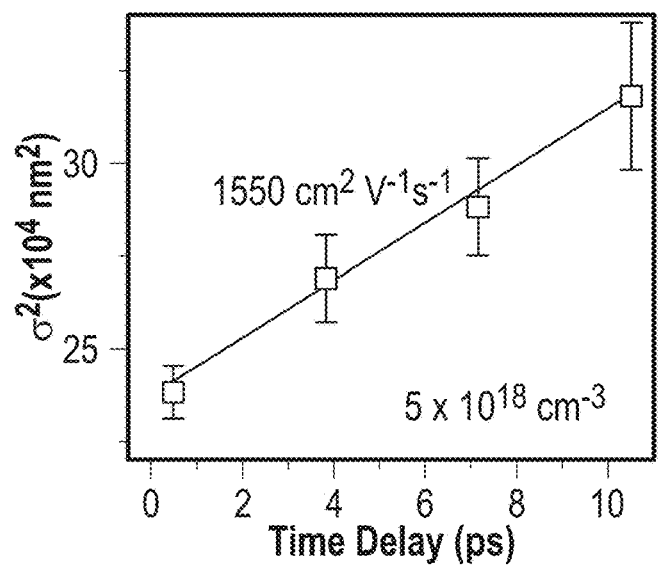
Figure 24A:
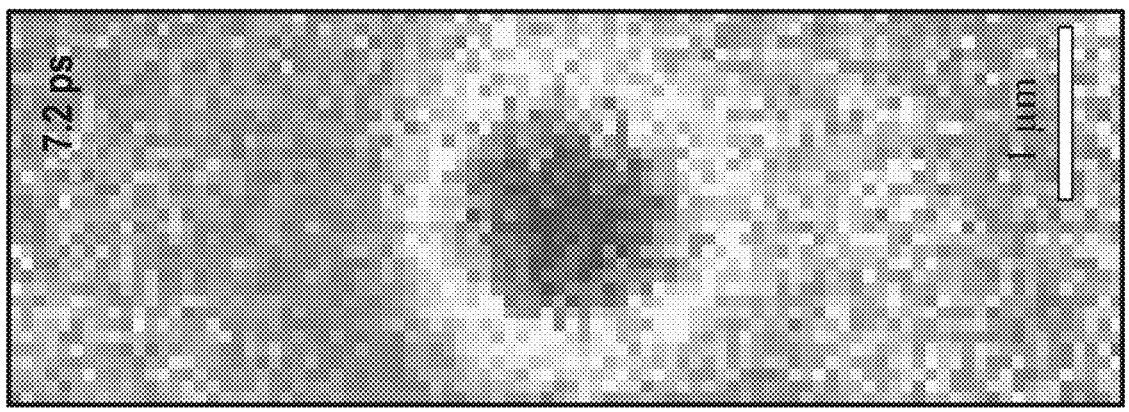
FIGS. 24A-24C depict two-dimensional gaussian fit performance.
Figure 24B:
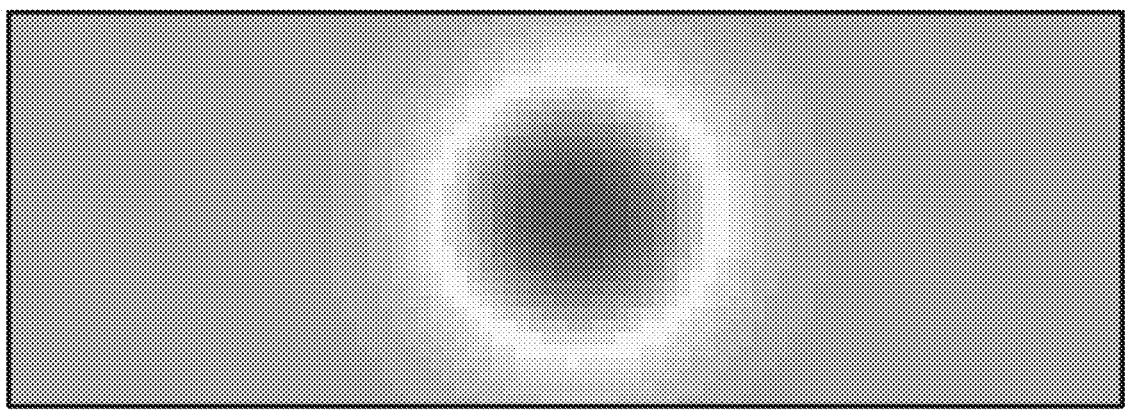
Figure 24C:
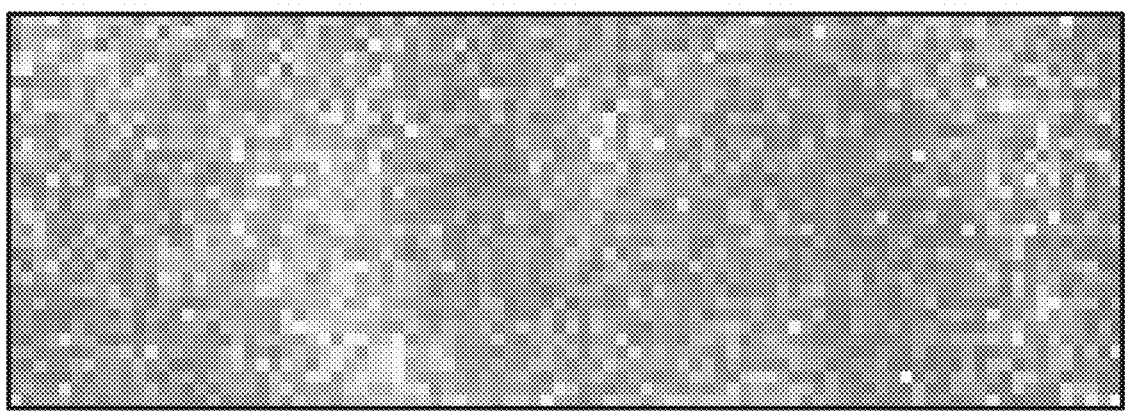

FIGS. 18A-18E depict pump-probe transient reflectivity microscopy, carrier dynamics, and diffusion in sample 1: FIG. 18A depicts a schematic illustration of the experimental setup; FIG. 18B depicts evolution of a 2D transient reflectivity microscopy image from a spot on sample 1, Scale bar: 1 µm; FIG. 18C depicts typical transient reflectivity dynamics (photo-excited carrier density of $5\times10^{18}$ $cm^{-3}$); FIG. 18D depicts spatial profile (dots) and Gaussian fit at 0.5 ps time delay from FIG. 18B; (FIG. 24); and FIG. 18E depicts evolution of variance of Gaussian distributions extracted from Gaussian fitting in FIG. 18D, the corresponding mobility is included.

Figures 22A, 22B, 22C:
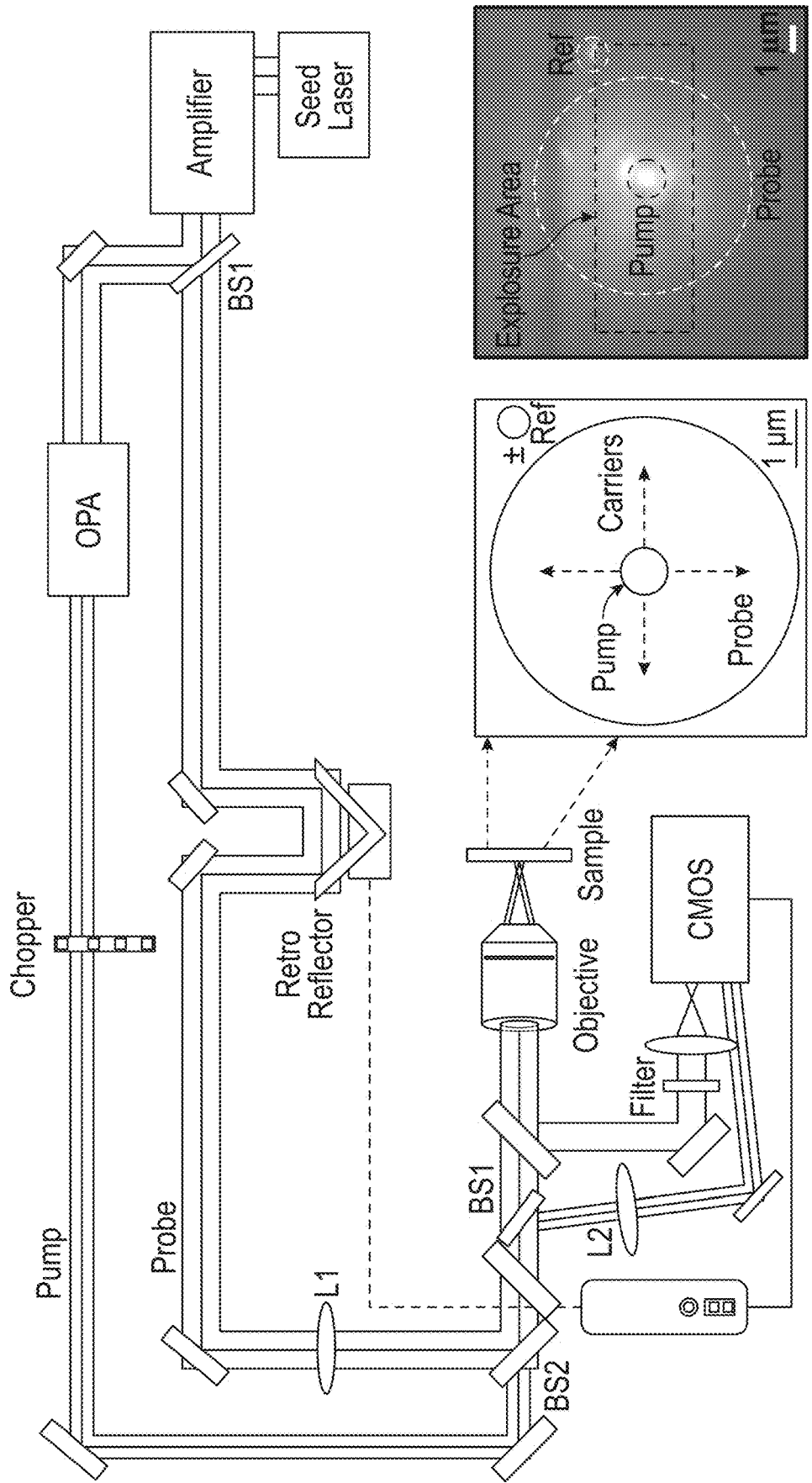
FIGS. 22A-22C depict the setup of transient reflectivity mapping system.
Figure 23B:
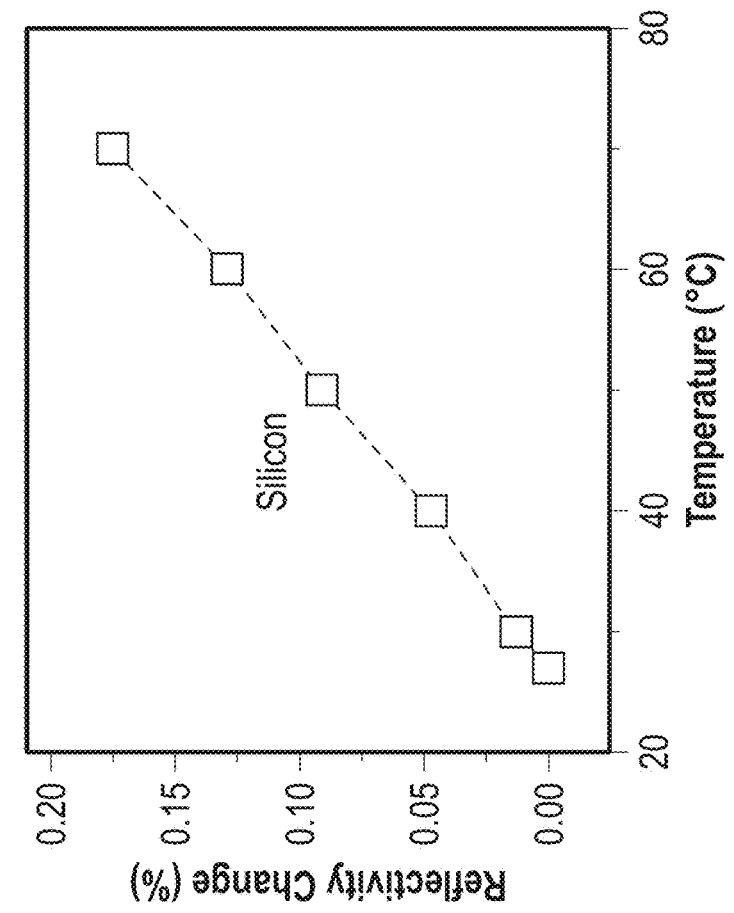
FIGS. 23A-23B depict temperature-dependent reflection on a BAs crystal and a silicon wafer.
Figure 23A:
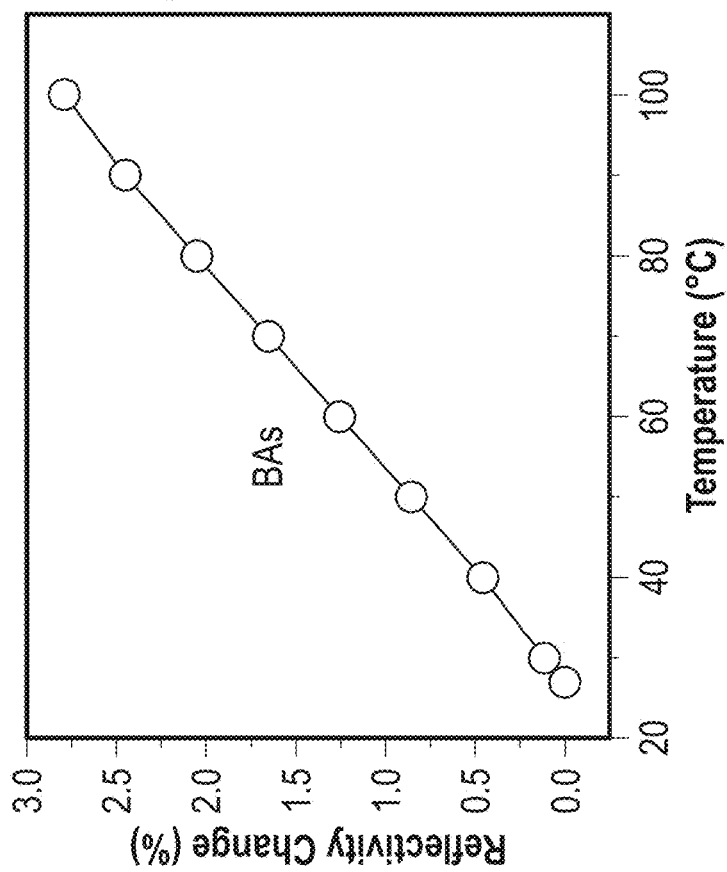

The Hall Effect is the most common technique used to measure carrier mobility, but it requires four electrical contacts on a relatively large and uniform sample. To accommodate the requirements of mobility measurement in a small sample size or in inhomogeneous materials, ultrafast pump-probe techniques have been employed to perform non-contact measurements with high spatial resolution. Because of the relatively thick samples utilized here, reflectivity was employed, rather than transmission. A femtosecond pump pulse was focused on BAs to photo-excite electrons and holes and diffusion of excited carriers was monitored in space and time with a time-delayed probe pulse defocused on a larger area (6 µm in diameter) (FIG. 18A, FIG. 22). Subsequently, an ambipolar mobility was obtained from the diffusion coefficient (D) through the Einstein relation ($D/k_BT=\mu/e$). Ambipolar mobility is given by $\mu_a=2\mu_e\mu_h/(\mu_e+\mu_h)$, where $\mu_e$ and $\mu_h$ are the electron and hole mobility values, respectively. Since c-BAs has an electronic band structure similar to that of silicon with an indirect bandgap in the range of 1.82-2.02 eV, a 600 nm pump pulse and a probe pulse at 800 nm were chosen to avoid the generation of hot carriers. Two-dimensional (2D) diffusion images in FIG. 18B show the expansion of carriers over 10 ps and a representative time-resolved reflectivity as a function of the time delay between the pump and the probe is shown in FIG. 18C. A sudden negative differential reflectivity indicates a dominant electronic contribution since reflectivity increases with lattice temperature (FIG. 23).

The spread of distributions in FIG. 18B reflects diffusion of photo-excited electrons and holes in space and time, and they can be well fit by Gaussian functions (FIG. 18D). The change in the variance 2 of carrier distributions is plotted in FIG. 18E. The linear increase in the variance with increasing time delay is a signature of diffusion and the diffusion coefficient D can be calculated from the slope based on the equation $\sigma_t^2=\sigma_0^2+\alpha Dt$, where $\alpha$ is a constant depending on the dimensions of the system and detection configuration. An $\alpha$ of 2 was chosen here because of the much larger laser penetration (excitation) depth (60 µm at 600 nm) compared to the thin top layer sampled by the probe beam [20 nm at 800 nm, given by $\lambda/4\pi n$, where n is the refractive index of c-BAs]. From the slope of the curve shown in FIG. 18E and the Einstein relation $D/kT=\mu/e$, an ambipolar diffusion coefficient of ~39 $cm^2s^{-1}$ was obtained, with an ambipolar mobility of 1,550±120 $cm^2V^{-1}s^{-1}$, close to the predicted value.

Figure 19B:
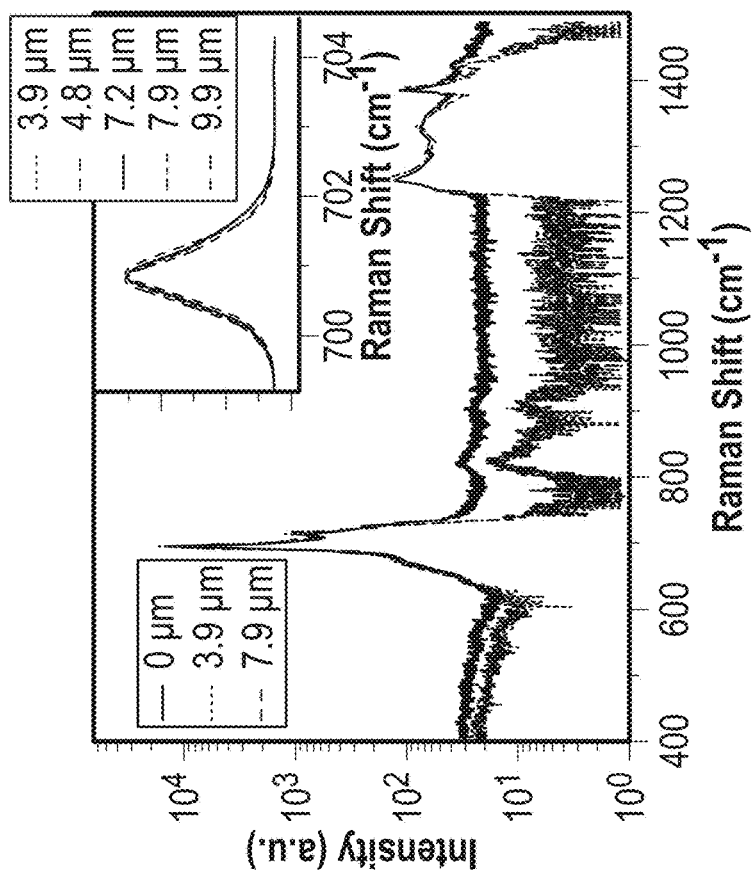
FIGS. 19A-19E depict carrier diffusion on a cross-sectional surface of sample 2.
Figure 19A:
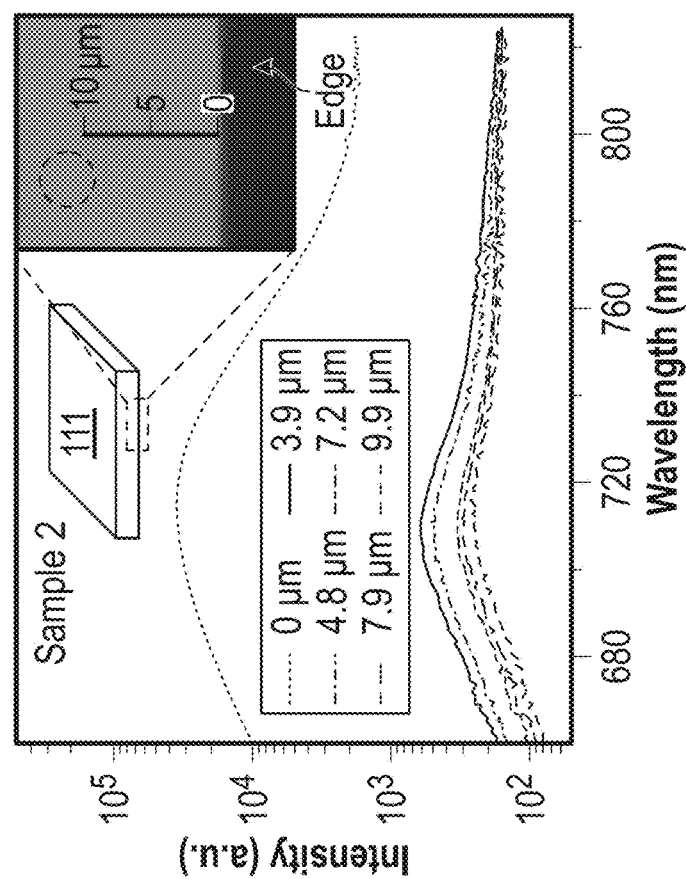
Figure 19C:
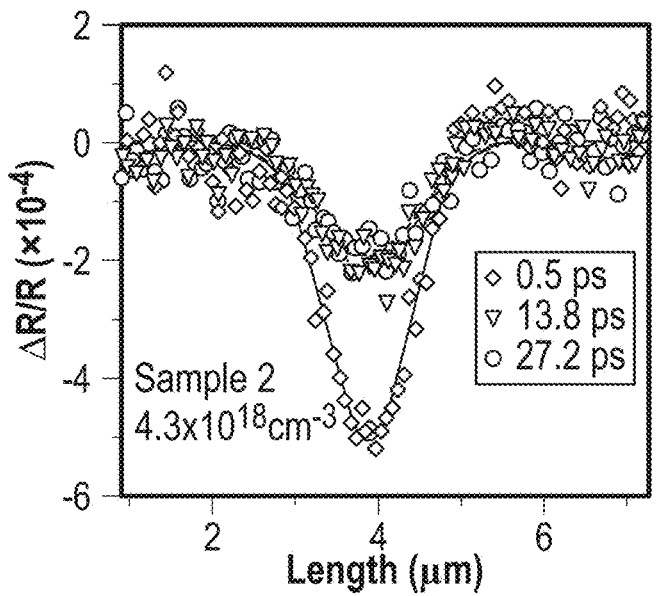
Figure 19D:
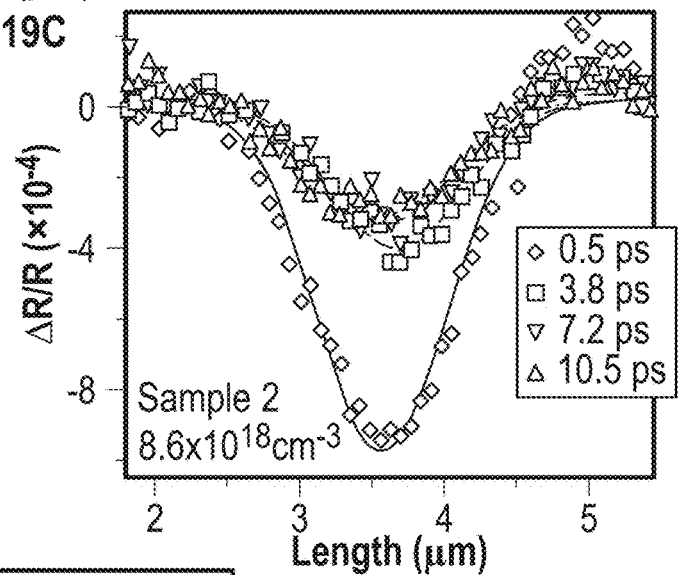
Figure 19E:
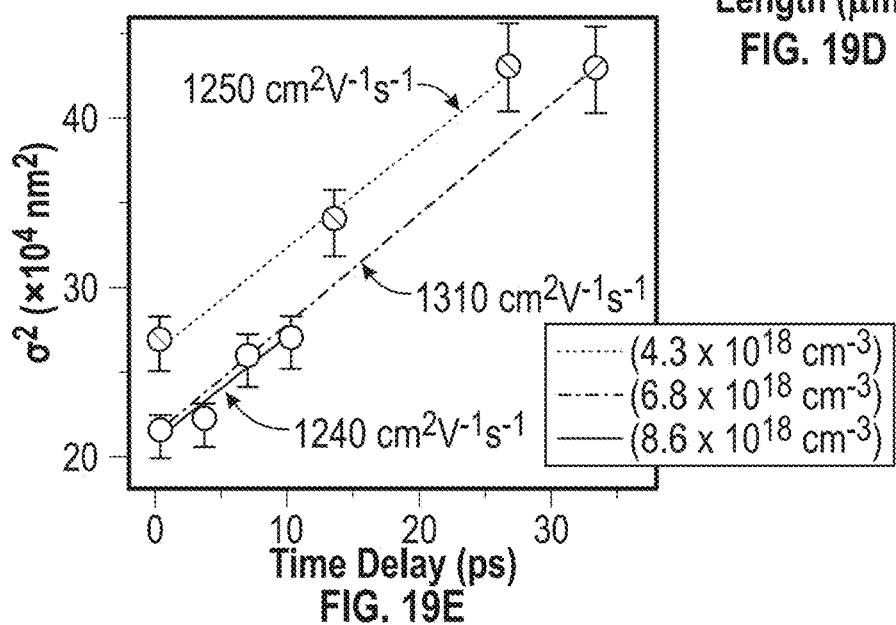

FIGS. 19-19E depict carrier diffusion on a cross-sectional surface of sample 2: FIG. 19A depicts PL spectra of six locations on a cross-sectional surface with increasing distance from the edge, PL of the spot at 0 µm was taken from the (111) surface around the edge, with inset showing optical image of the sidewall; Dashed circle: location for pump-probe measurements in (FIG. 19C-19E); FIG. 19B depicts Raman spectra of three of the six locations shown in FIG. 19A, with the inset providing a magnified view of the phonon line in the spectra of the five sidewall locations; FIG. 19C-19D show spatial profiles (dots) and Gaussian fits (curves) of photo-excited carriers at initial concentrations of $4.3 \times 10^{18}$ cm$^{-3}$ and $8.6 \times 10^{18}$ cm$^{-3}$, respectively, from a location indicated by the dashed circle in FIG. 19A; FIG. 19E depicts variance and ambipolar mobility values from FIG. 19C, FIG. 19D, and FIG. 26.

Figure 26B:
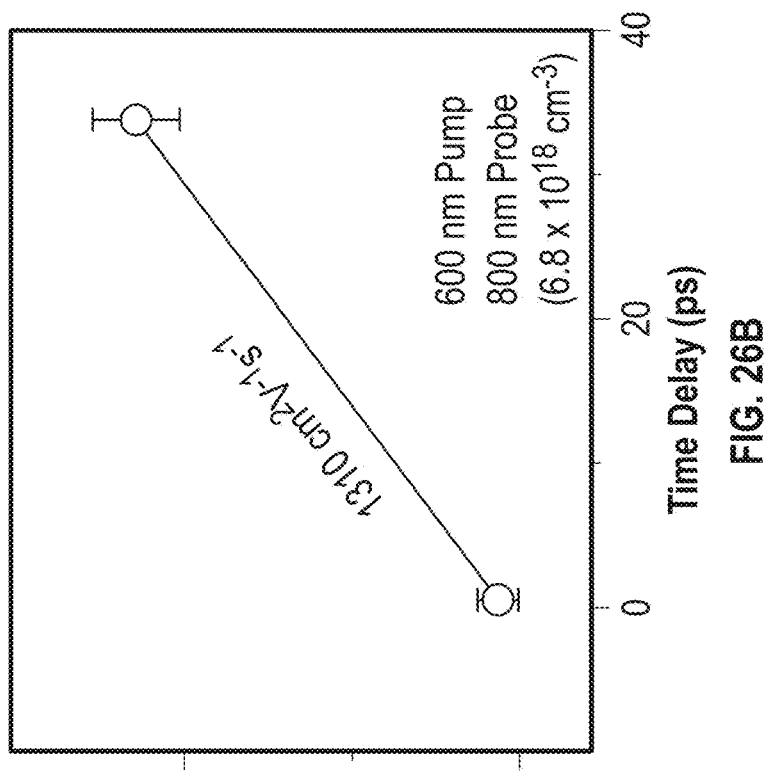
FIGS. 26A-26B depict carrier diffusion with 600-nm pump and 800-nm probe in sample 2.
Figure 26A:
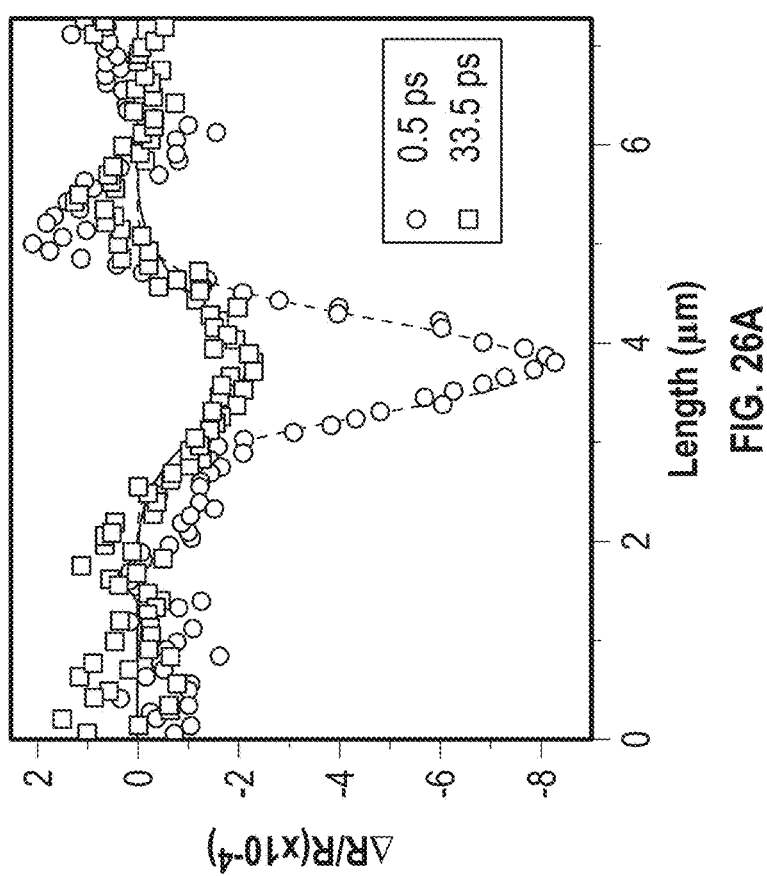

Since the properties of c-BAs are not uniform even within a single crystal, especially in the direction perpendicular to (111) surfaces, a cross-sectional surface of a relatively thin (30 μm thick) crystal labeled sample 2 was tested (FIG. 21). An optical image of the sample 2 sidewall is shown in the inset to FIG. 19A. PL spectra from several spots at different distances from the edge were obtained (FIG. 19A). The PL intensity increases with decreasing distance from the edge and exhibits a significant jump upon reaching the (111) surface, which agrees with previous finding of a drastic change in PL from one surface to the opposite surface of a single crystal slab. Corresponding Raman spectra from the same locations are shown in FIG. 19B and its inset. Similar to the PL results, the Raman spectrum of the (111) surface differs significantly from those of the sidewall. A spot about ~11 μm from the edge (dashed circle in the inset to FIG. 19A) was chosen and three pump fluences were utilized to create different carrier densities, the reflectivity distributions of which are shown in FIG. 19C and FIG. 19D and FIG. 26. The evolution of the variances was plotted and an ambipolar mobility of ~1300 cm$^2$V$^{-1}$s$^{-1}$ was obtained (FIG. 19E), indicating the negligible effect of carrier density on the mobility of sample 2 due to nonlinear effects such as Auger recombination.

Figure 20A:
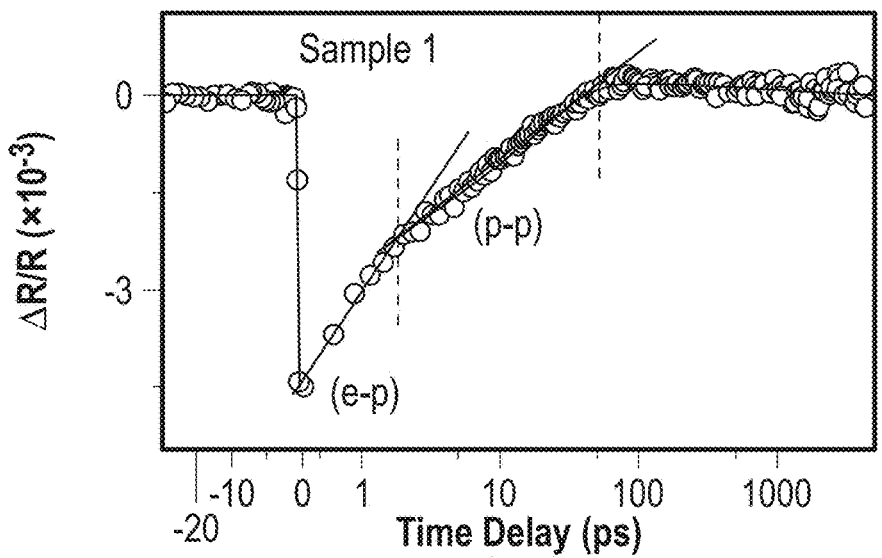
FIGS. 20A-20F depict transient reflectivity microscopy and carrier diffusion measured using a 400 nm pump and a 585 nm or 530 nm probe.
Figure 20B:
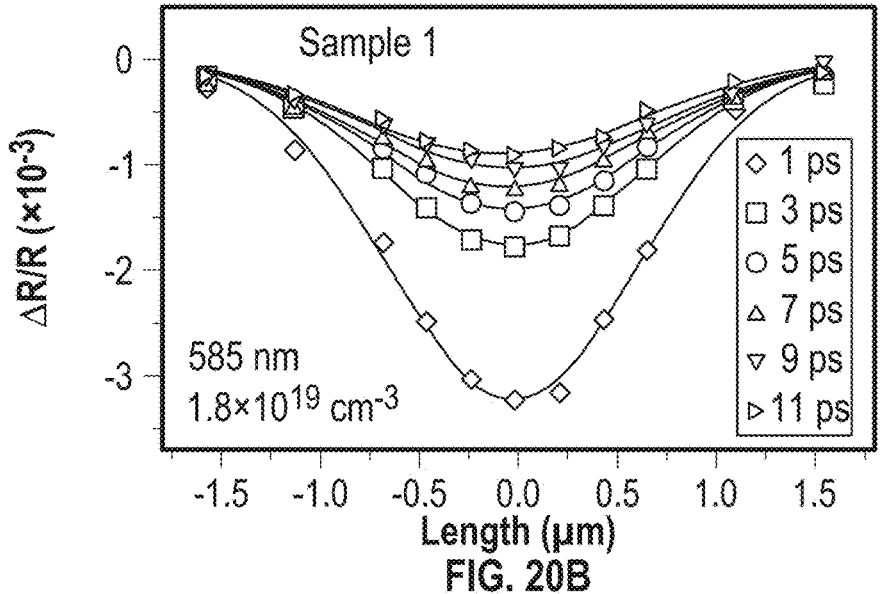
Figure 20C:
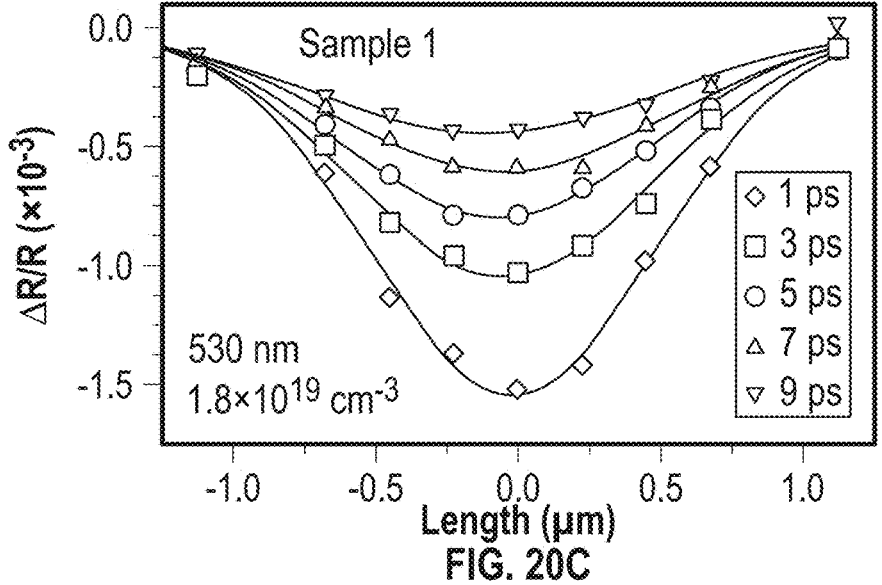
Figure 20D:
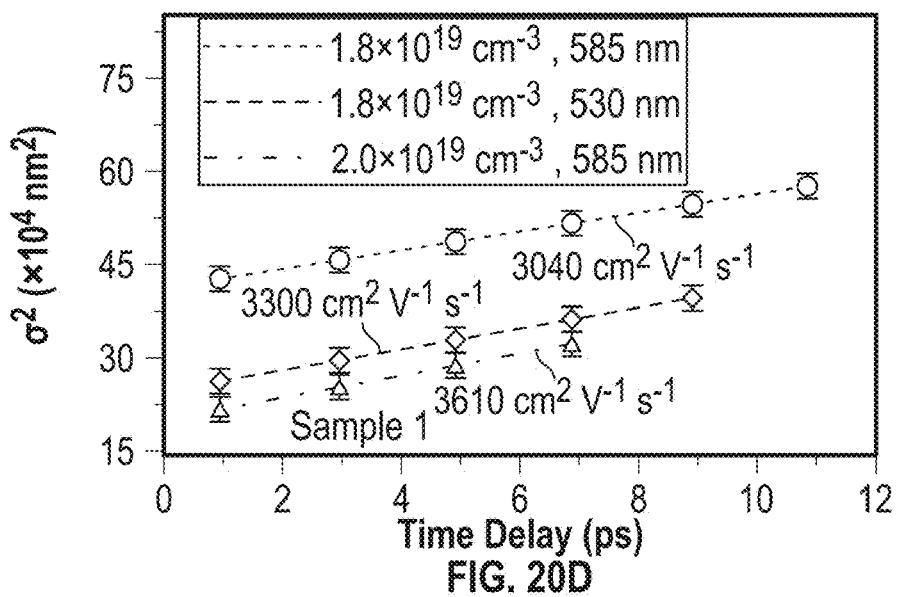
Figure 20E:
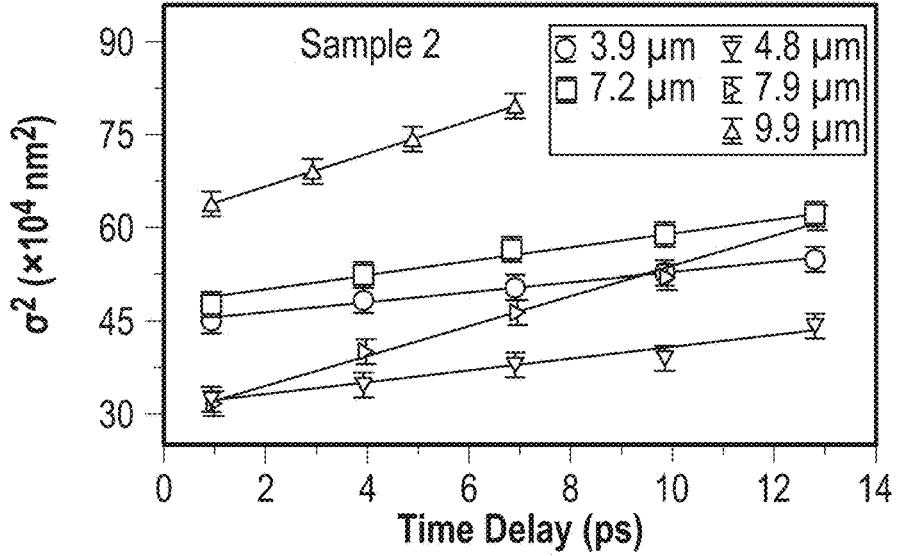
Figure 20F:
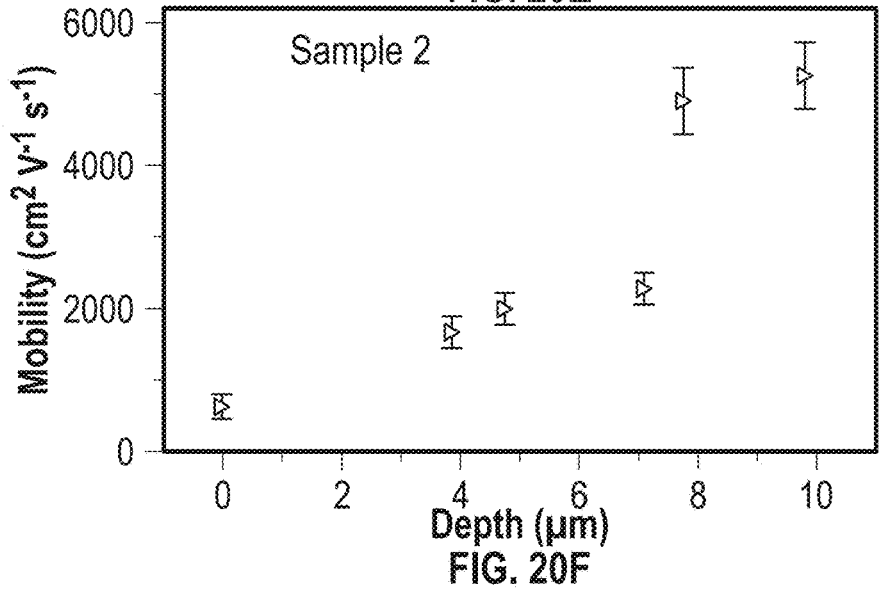
Figure 21A:
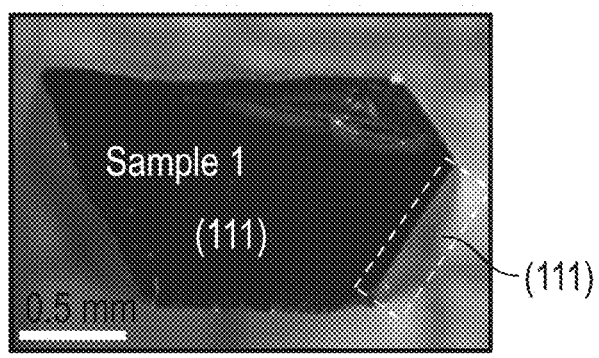
FIGS. 21A-21D depict structural characterization of c-BAs crystal.
Figure 21B:
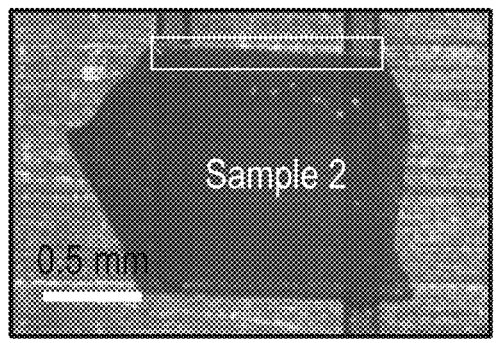
Figure 21C:
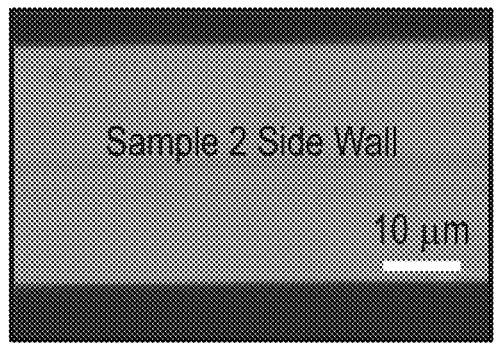
Figure 21D:
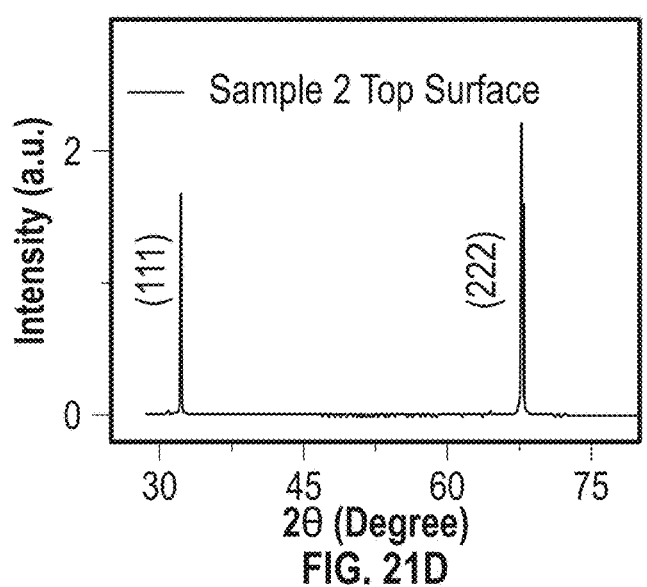
Figure 30:
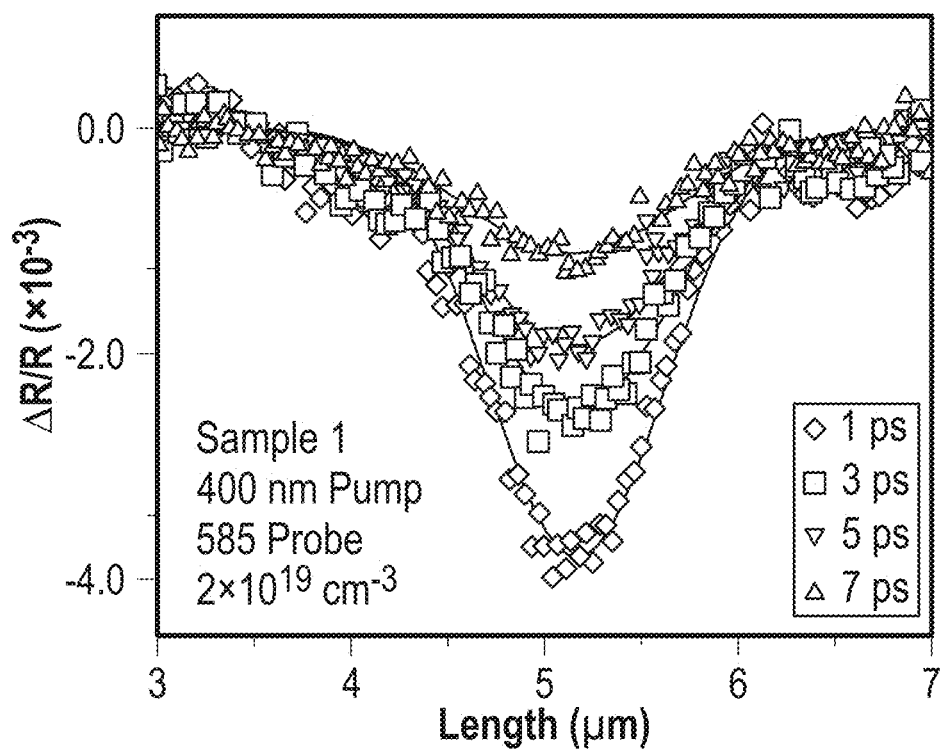
FIG. 30 depicts transient reflectivity microscopy with 400-nm pump and 585-nm probe; carrier distribution evolution on a same spot in FIG. 18 but with a 400-nm pump and 585-nm probe. Raw data was fitted by gaussian function.
Figure 31A:
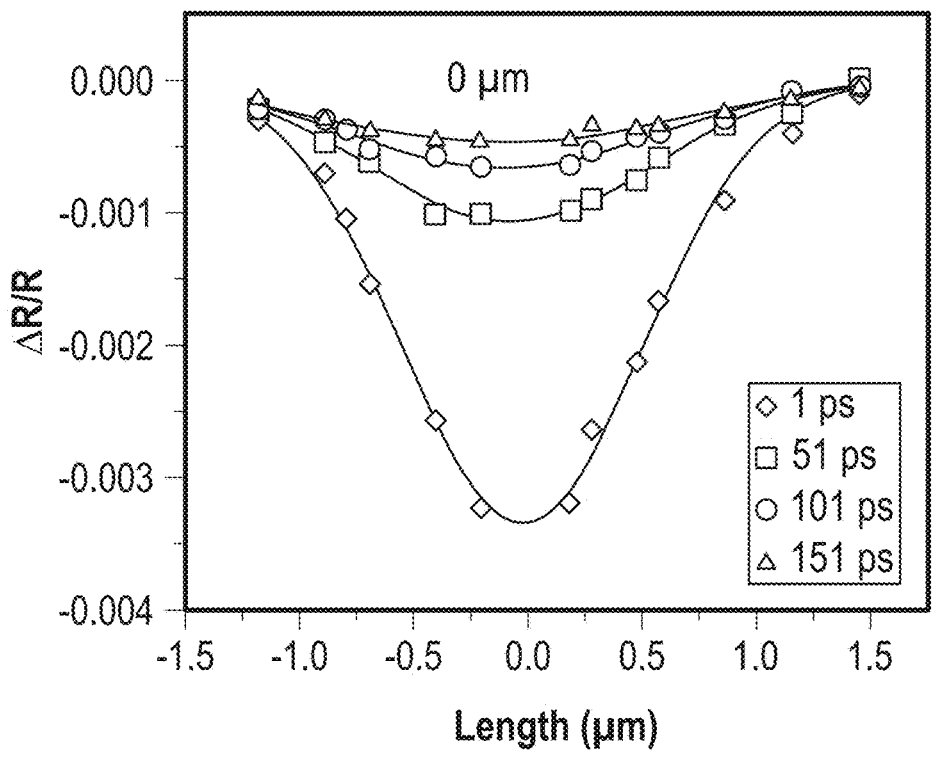
FIGS. 31A-31F depict carrier diffusion on the top surface and side wall of sample B at each of the six detection points.
Figure 31B:
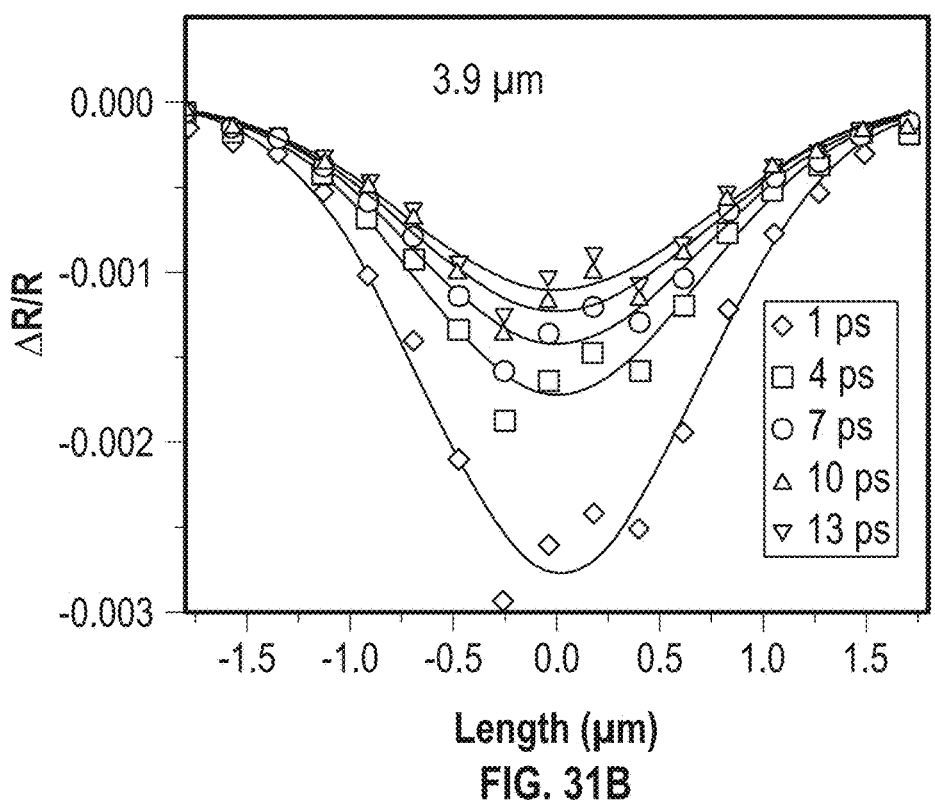
Figure 31C:
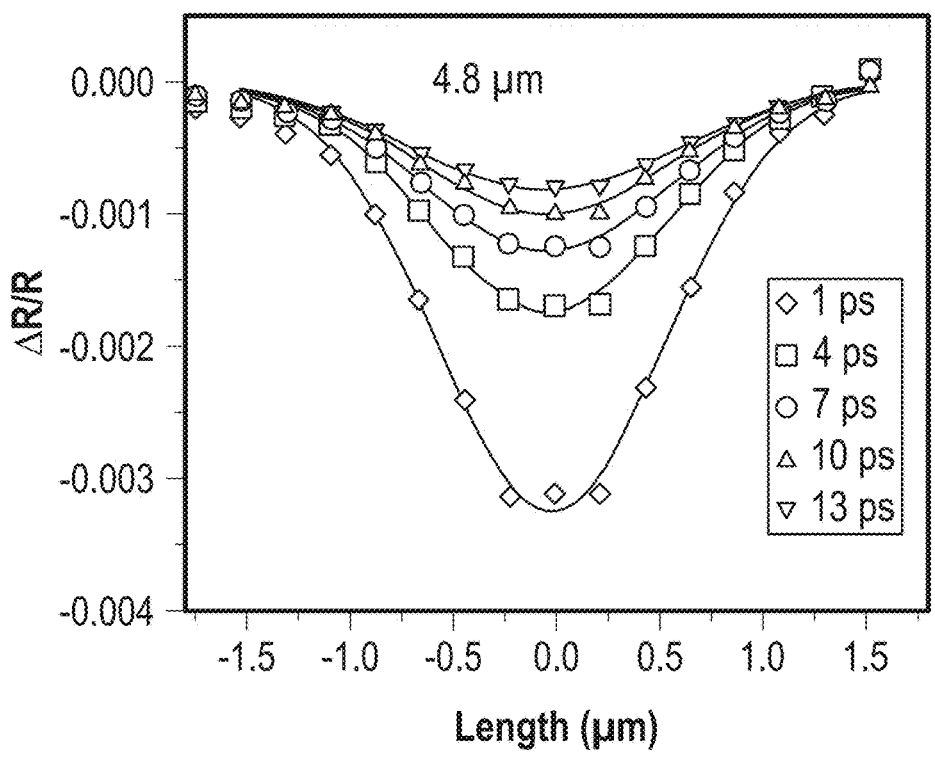
Figure 31D:
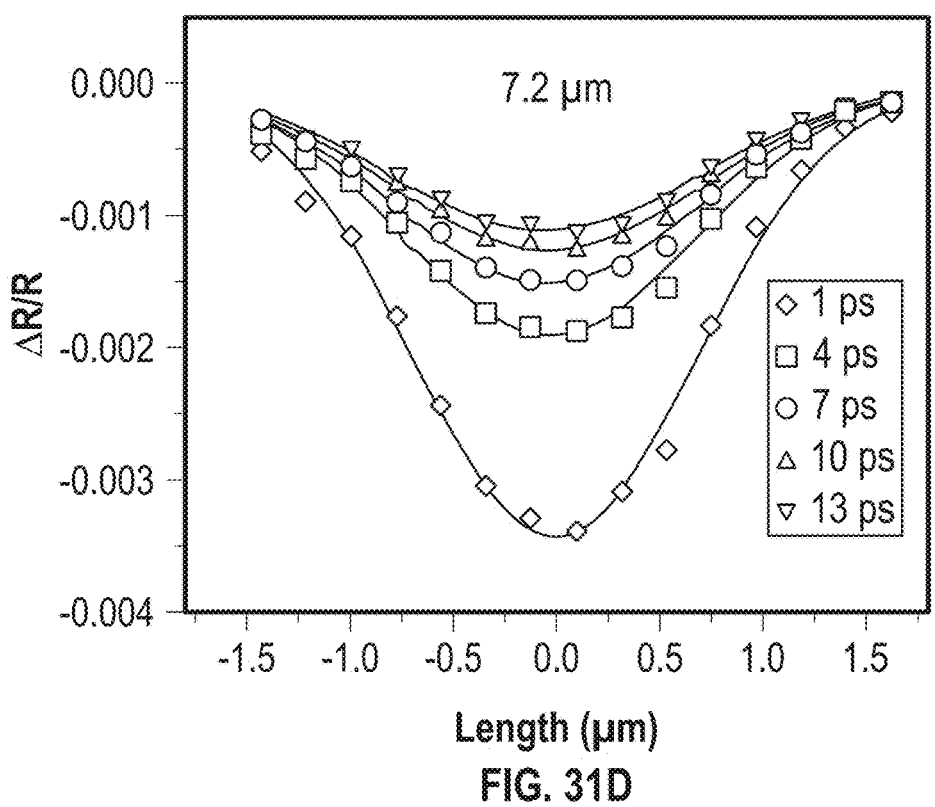
Figure 31E:
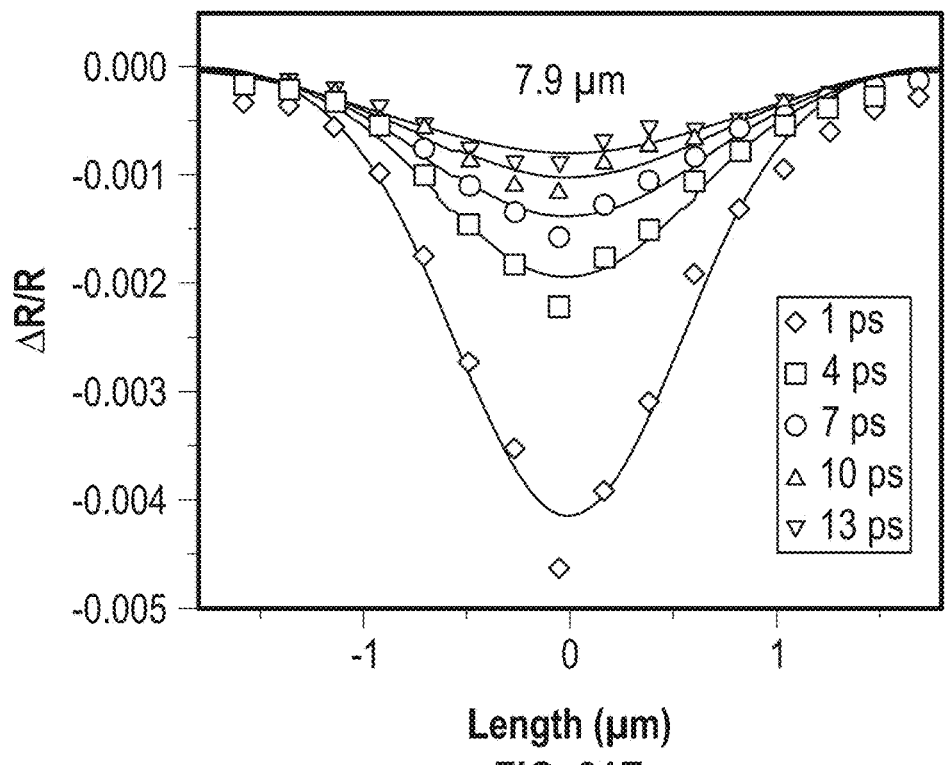
Figure 31F:
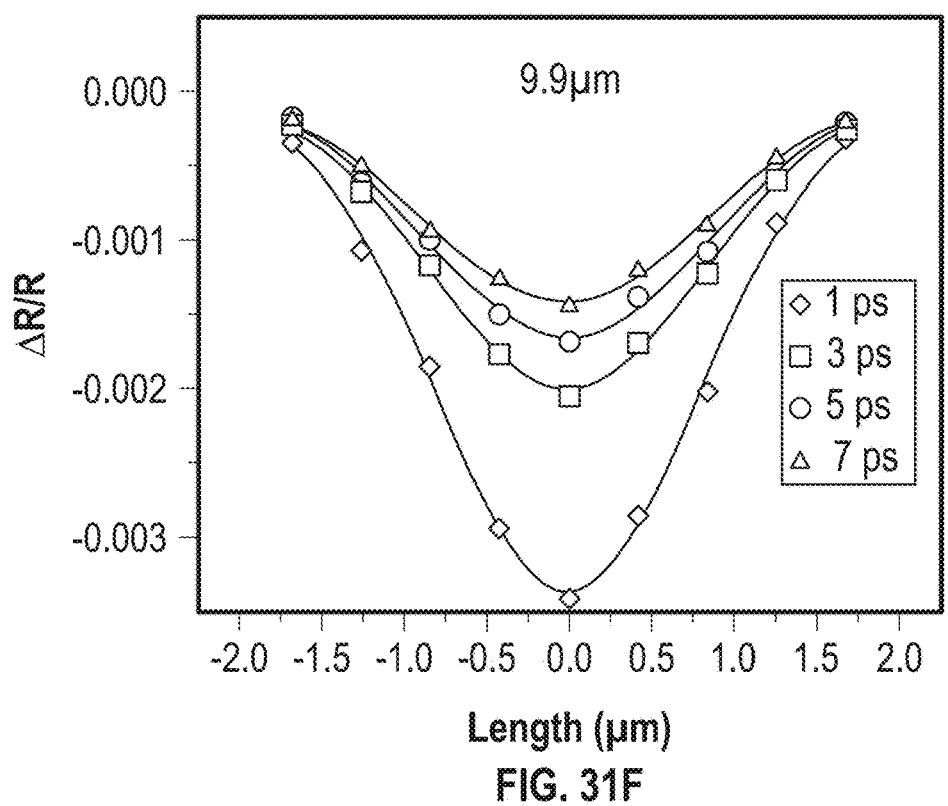

FIGS. 20A-20F depict transient reflectivity microscopy and carrier diffusion measured using a 400 nm pump and a 585 nm or 530 nm probe: FIG. 20A depicts representative pump-probe transient reflectivity curve from sample 1, in which the probe wavelength is 585 nm; FIG. 20B and FIG. 20C depict spatial profiles (dots) and Gaussian fits (curves) of transient reflectivity from a spot in sample 1 measured using 585 nm and 530 nm probes, respectively; FIG. 20D depicts evolution of the variances of carrier density distributions and carrier mobility from FIG. 20B and FIG. 20C and FIG. 30; FIG. 20E and FIG. 20F depict variance and ambipolar mobility results, respectively, for sample 2 at six locations corresponding to those shown in FIG. 19A and FIG. 19B.

Figure 27A:
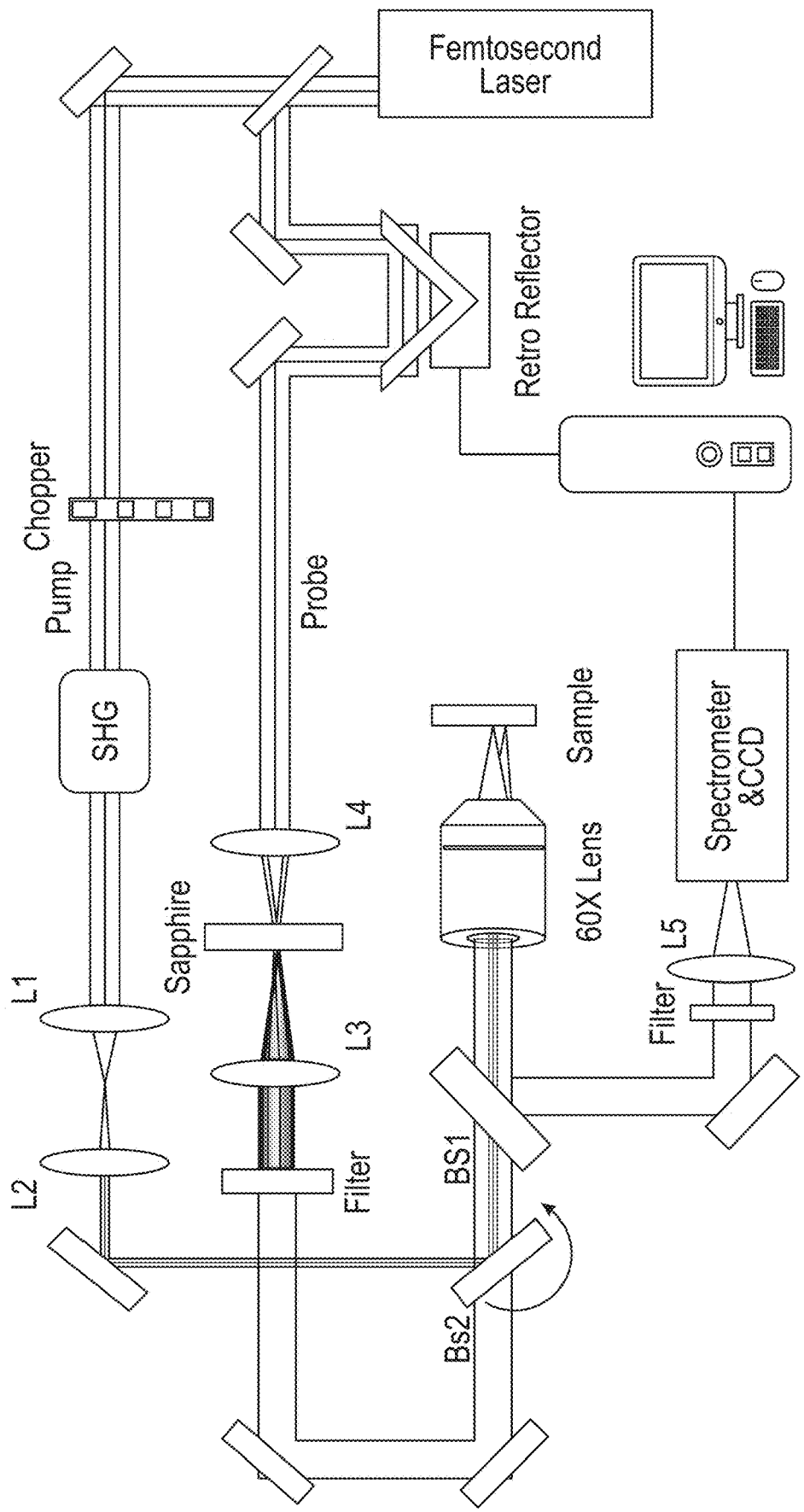
FIGS. 27A-27C depict setup of transient reflectivity scanning system.
Figure 27B:
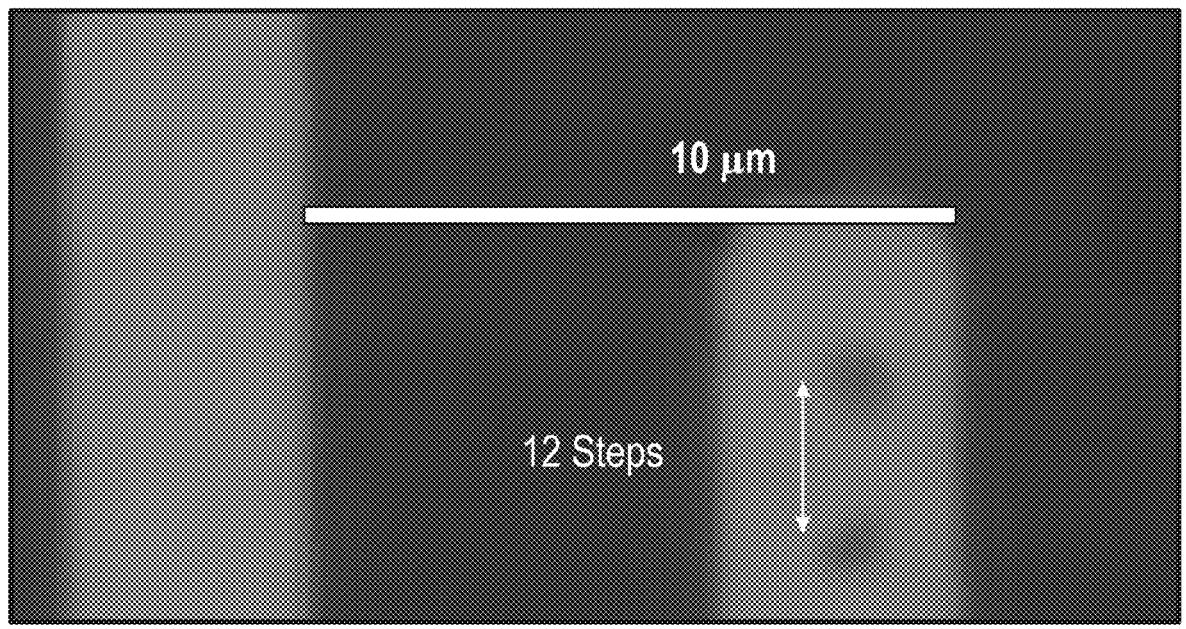
Figure 27C:
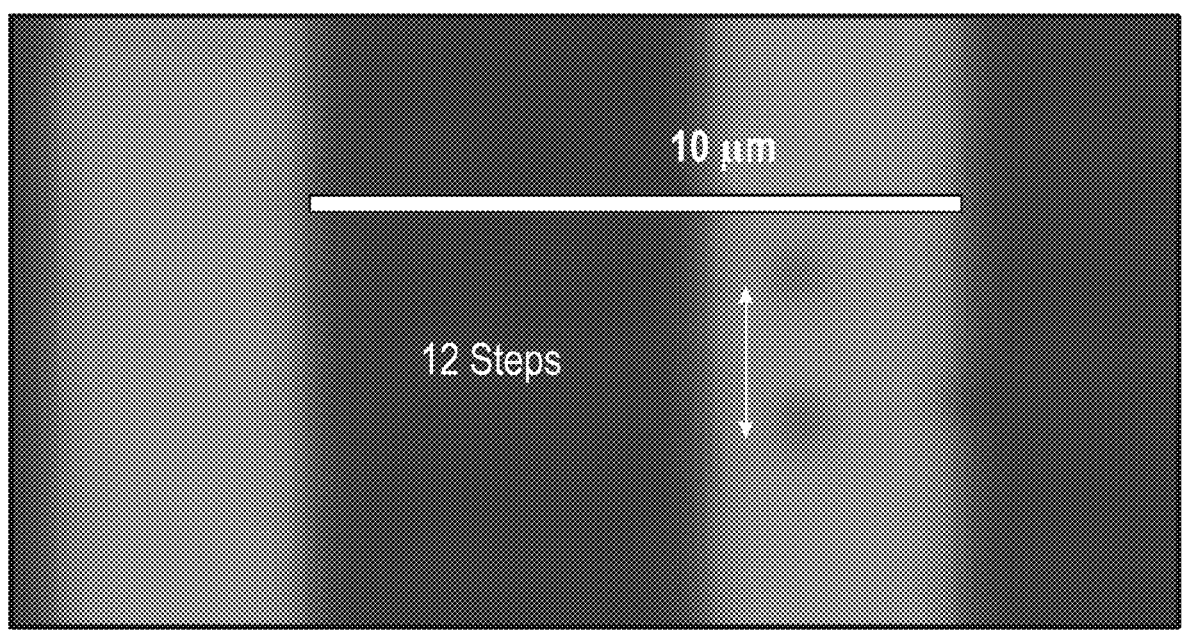
Figure 28C:
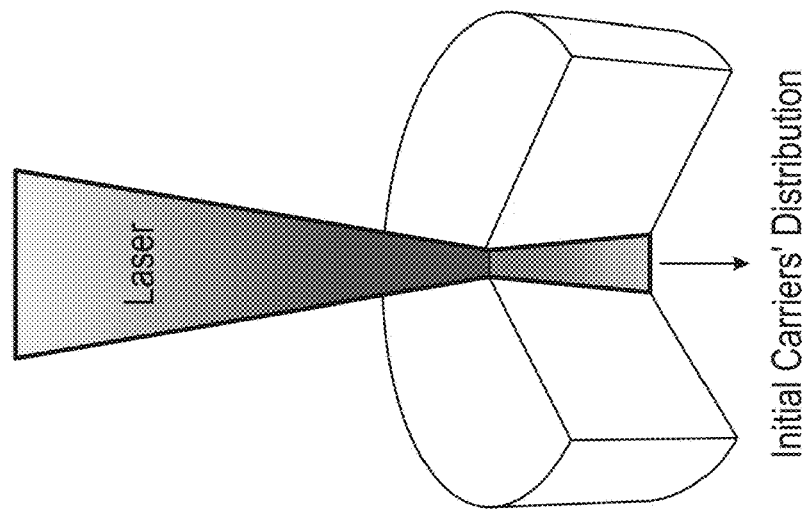
FIGS. 28A-28C depict pump-probe scanning transient reflectivity microscopy.
Figure 28B:
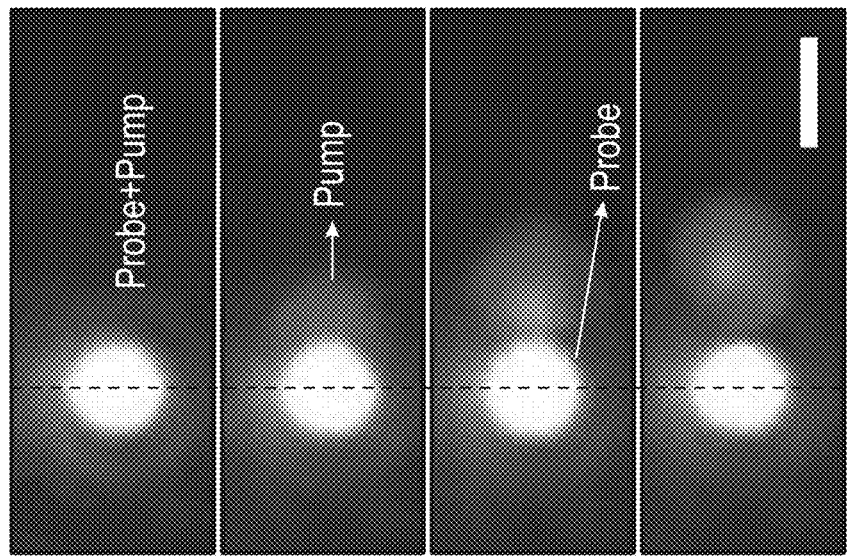
Figure 28A:
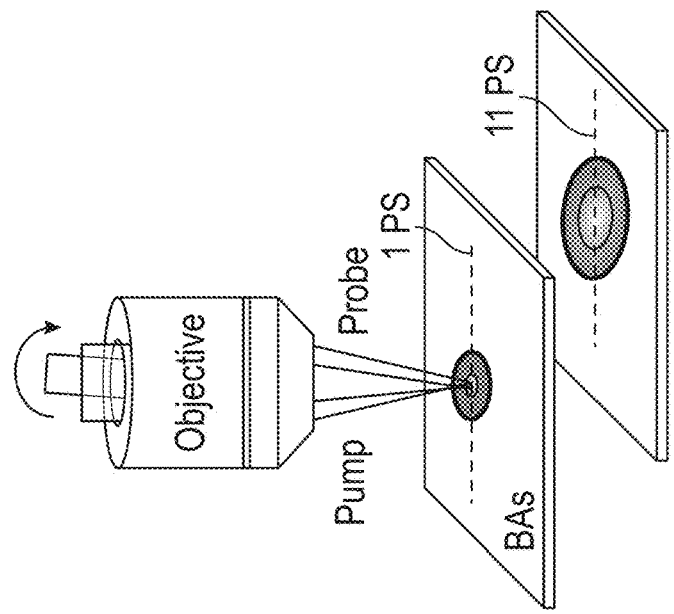

The high carrier mobility of c-BAs is enabled by its unique weak electron-phonon interaction and its phonon-phonon scattering, which should also enable the generation of high mobility hot carriers. To prove this, a 400 nm pulse was utilized as a pump, and a particular band (585 nm or 530 nm) selected with an optical filter from a white light continuum beam as a probe pulse (FIG. 27). A typical transient reflectivity curve of a probe (585 nm) from sample 1 is shown in FIG. 20A. Different from the single exponential decay previously observed when excited by a 600 nm pump (FIG. 18C), the dynamics of photo-excited carriers excited by the 400 nm pump consist of three exponential decays: a fast exponential decay with a ~1 ps lifetime, a slow decay of ~20 ps, and an even slower decay on the order of 1 ns. They correspond to rapid relaxation of high-energy photo-excited carriers, further relaxation of carriers to the conduction and valence band edges, and a combination of lattice heating and recombination/trapping of electrons and holes at the band edges, respectively, in good agreement with the theoretical prediction. To obtain the diffusion coefficient of the carriers in sample 1, a simpler method was used by varying the relative displacement between focused pump and probe beams along one direction (FIG. 27 and FIG. 28, discussed hereinbelow). The resulting spatial profiles of the reflectivity after 1 ps for probe wavelengths of 530 nm and 585 nm were plotted (FIG. 20B and FIG. 20C) and obtained an ambipolar diffusion coefficient of 80 cm$^2$s$^{-1}$ and an ambipolar mobility of ~3,200 cm$^2$V$^{-1}$s$^{-1}$ (FIG. 20D). Mobility of ~3,600 cm$^2$V$^{-1}$s$^{-1}$ was obtained from the same spot as that shown in FIG. 18 for sample 1. Unexpectedly, these values are much larger than the predicted ambipolar mobility of 1,680 cm$^2$V$^{-1}$s$^{-1}$.

Using the same 400 nm pump, the ambipolar mobility of sample 2 was also measured at six locations corresponding to those shown in FIG. 19A and FIG. 19B. The evolution of variance of carrier distribution at these spots is shown in FIG. 20E and FIG. 20F and FIG. 31. The differences in the initial values of the variances at 1 ps are due to the different spot sizes of the pump and probe beams in each measurement. The mobility clearly changes dramatically across the sidewall, with the highest mobility (5,200±600 cm$^2$V$^{-1}$s$^{-1}$) observed at a depth of 9.9 μm. Although local strain could result in such dramatic carrier mobility enhancement, no noticeable Raman shift was observed among these locations (FIG. 19B). Thus, the high ambipolar mobility is attributed to photo-excited hot carriers, which exhibit high carrier diffusion coefficient and mobility values.

Figure 32A:
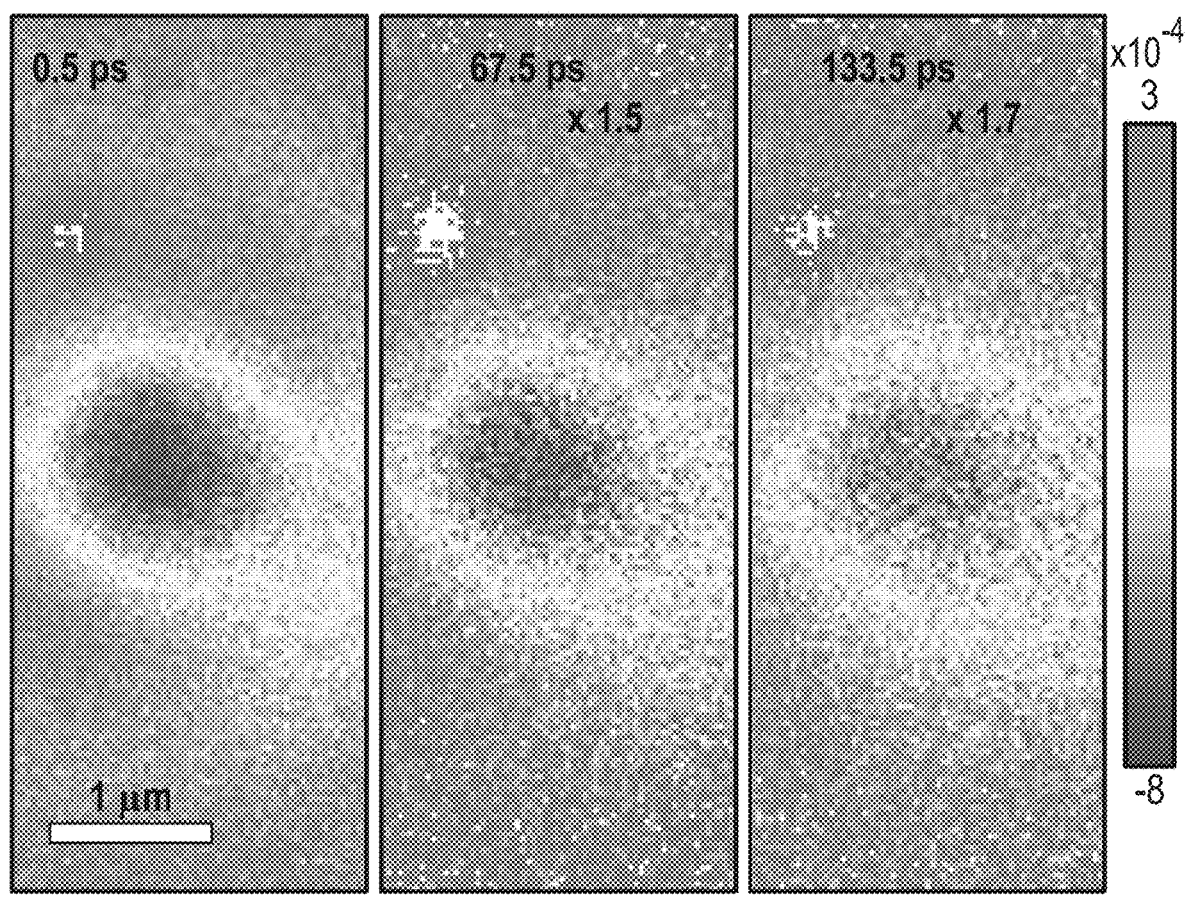
FIGS. 32A-32B depict carrier diffusion in a pristine silicon wafer.
Figure 32B:
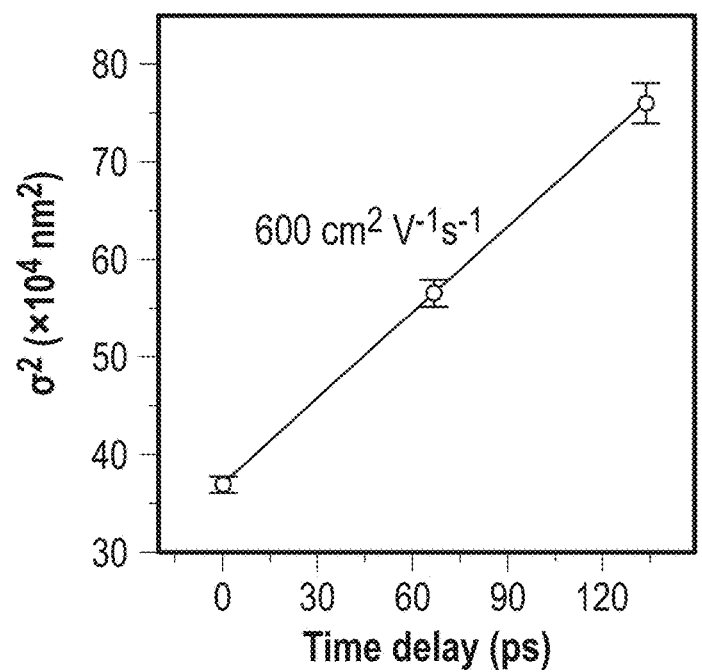
Figure 33A:
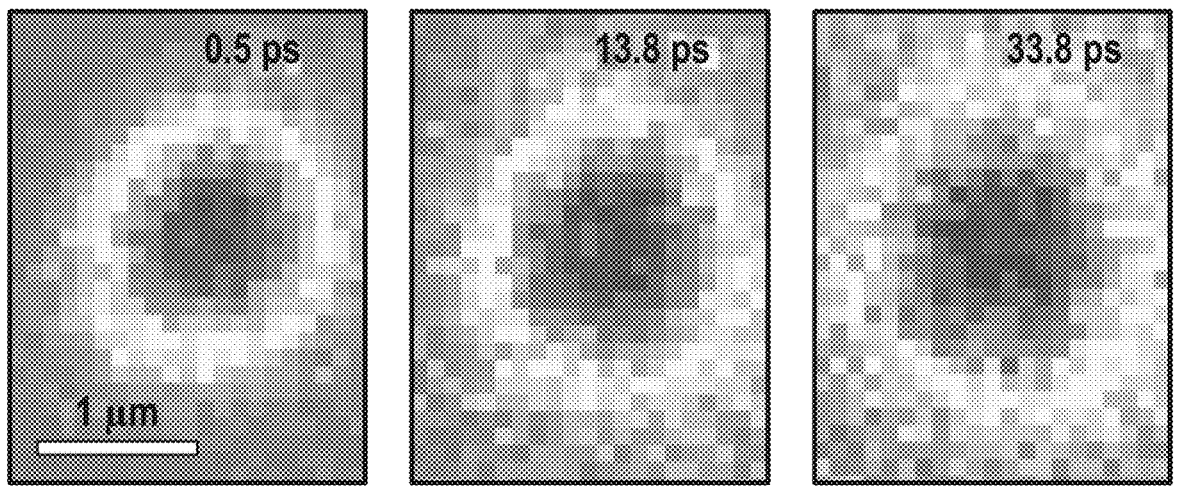
FIGS. 33A-33C depict carrier diffusion in a p-type silicon wafer with the carrier density of $1.5 \times 10^{19}$ cm$^{-3}$.
Figure 33B:
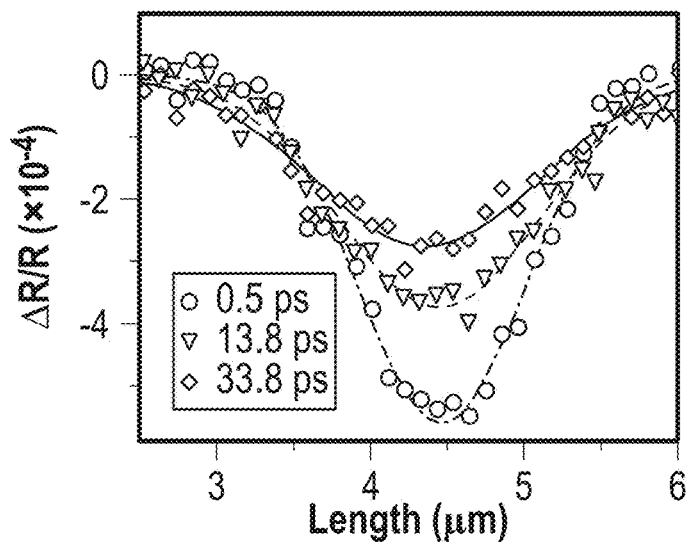
Figure 33C:
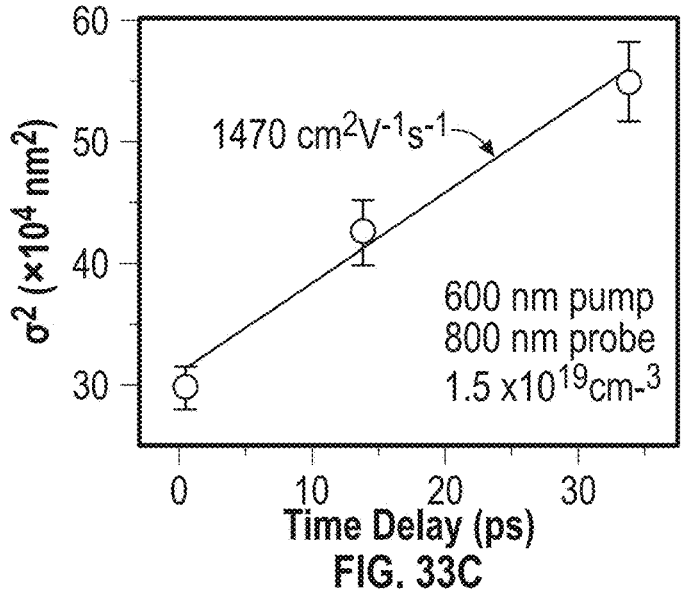

The position-dependent mobility on the sidewall of sample 2 reveals that p-type doping in c-BAs can significantly reduce its mobility. Heavy p-type doping on the (111) surface can be seen from the Fano line shape of the LO phonon at 700 cm$^{-1}$ and the higher background level around 1000 cm$^{-1}$ (FIG. 19B). This gradually increased doping level toward the (111) surface is further supported by the corresponding increased PL intensity. P-type doping will result in reduced carrier mobility due to the presence of ionized dopants (these dopants are already activated) and a lower electron mobility than hole mobility because minority carriers will dominate the carrier dynamics. The latter is supported by the observation of a higher ambipolar mobility in p-type silicon than in undoped silicon (FIG. 32 and FIG. 33, described further hereinbelow). Clearly, the enhanced PL intensity observed in the c-BAs samples disclosed herein indicates that p-type doping has only introduced shallow acceptors rather than nonradiative deep levels. Because hot carriers can also be generated by electrical injection and low-intensity light, both hot carriers and fully relaxed carriers can be utilized for high-speed optoelectronic devices and high-efficiency solar cells in conjunction with the high mobility of the band-edge carriers.

Materials and Methods for this Example 2
Structural Characterizations

1. X-ray diffraction (XRD) measurements were conducted using a Rigaku SmartLab X-ray diffractometer with a Cu Kα radiation source. A cubic boron arsenide (c-BAs) crystal was separated and mounted onto the goniometric stage with a particular surface facing upward. The diffractometer was operated at 45 kV and 180 mA.

2. Raman spectra were obtained using a confocal micro-Raman module (Institute of Semiconductors, CAS) coupled to a Horiba iHR550 imaging spectrometer and a 20× objective lens (Olympus). The background of the charge-coupled device (CCD) and the luminescence inside the spectrometer were deducted through a measurement without sample. High-resolution Raman spectra were obtained using a triple-stage spectrometer (Horiba T64000) with a resolution of 0.2 cm$^{-1}$. Both types of measurements used a 532-nm laser as the exciting source.

Transient Reflectivity

3. Transient reflectivity spectra of c-BAs were obtained using a modified commercial femtosecond pump-probe system (Helios, Ultrafast Systems). Second harmonic of the output of a 1 kHz amplified Ti:sapphire laser system (Astrella, Coherent) was used as the pump beam (400 nm, 80 fs). The probe beam was a white light continuum light spanning the 450-780 nm spectral region, which was created by focusing 0.1% of the 800 nm fundamental output onto a sapphire crystal (3.0 mm thick). The pump beam was modulated by a mechanical chopper at a frequency of 500 Hz. The reflected probe pulses were collected by photodiode arrays and recorded individually. A 20× objective lens (NIR, Mitutoyo) was used to focus the pump and collect the reflected probe beam.

Transient Reflectivity Mapping

4. The transient reflectivity microscopy is similar to a reported setup (Nature Materials 19, 56-62 (2020)), (FIG. 22). 800 nm pulses from a Coherent Astrella regenerative amplifier (80 fs, 1 kHz, 2.5 mJ per pulse) seeded by a Coherent Vitara-s oscillator (35 fs, 80 MHz) were used to pump an optical parametric amplifier (OPA, Coherent, OperA Solo) to generate excitation or detection pulses. For the 600 nm pump, 800 nm probe experiments, OPA was used to generate excitation pulse, whereas the fundamental 800 nm laser was used as the detection beam. For the 400 nm pump, 580 nm probe experiments, a β-Barium borate (BBO) crystal was used to convert partial of 800 nm laser to 400 nm, while OPA was used to generate detection pulse. Laser-induced reflection changes of the material at controllable time delays were probed by a CMOS detector (PL-D755MU-T, Pixelink) together with a motorized stage (DDS220/M, Thorlabs). The pump beam was sent collimated into the objective lens (UPLFLN, Olympus, 60×) while the probe beam was pre-focused before objective lens to achieve a widefield detection. Reflected probe beam from the sample was collected through objective lens and focused onto a CMOS detector by a 200 mm tube lens for imaging. A shot-to-shot measurement strategy has been implemented, i.e., pump beam is chopped to a frequency to half of the repetition rate of the laser source, and the reflected probe beam with and without pump excitation are recorded by the CMOS at every other pulse. Thus, the pump laser induced reflection change could be captured every two pulses and then averaged for more than 100000 times. A small fraction of the chopped pump beam was split and focused onto the CMOS as a reference signal to identify the sign of the signal.

Transient Reflectivity Scanning

5. Hot carrier diffusion was measured using a home-built transient reflectivity scanning system (FIG. 27), similar to a previous report (*Physical Review B* 86, 045406 (2012)). Briefly, a spatial-temporal scanning pump pulse was focused to excite the sample and another probe beam used to record the carrier diffusion dynamics. Second harmonic of the output pulses (800 nm, 1 kHz) of a Ti:sapphire laser system (Astrella, Coherent) was used as the pump beam. 0.1% of the fundamental laser was focused on a 3-mm sapphire to generate a supercontinuum white light. A portion of it, which was optically filtered to a region of 490-520 nm or 580-600 nm was used as the probe beam. A mechanical chopper was used to modulate the pump beam at 500 Hz. A mechanical translation stage was used to delay the probe with respect to the pump. The pump beam was focused onto the sample using an objective (UPLFLN, Olympus, 60×, NA=0.95, aperture=5 mm, f=3 mm) together with the probe beam. The reflected probe beam was detected by a photodiode array. A pair of mirrors coupled with step motor actuators (ZFS06, Thorlabs) was used to scan the pump beam relative to the probe beam in space to obtain the carrier diffusion dynamics.

6. Fitting Error Estimation

The diffusion raw data were fitted by a 2D gaussian function $$e^{-\frac{(x-x_0)^2+(y-y_0)^2}{2\sigma^2}}$$

over all the probe region or 1D gaussian fitting $$e^{-\frac{(y-y_0)^2}{2\sigma^2}}$$

along y axis. The evolution of the variance $\sigma^2=\sigma_0^2+2Dt$ was further linearly fitted to get the diffusivity D, thus the fitting error contains two parts: gaussian fitting error and the linear fitting error. In FIG. 22, 95% confidence interval are shown as scale bar. At 0.5 ps and 10.5 ps, it relates to ±3% and ±6% error, respectively, indicating a medium error of ±4.5%. Combining the linear fitting error of ±3%, the total error is ±7.5%. For the 1D slice fitting, the error is higher with the value of ~10% due to the less fitting points.

7. Hot Carriers Excited by 400 nm Laser

The relaxation process of hot carriers in BAs has been studied by first-principles calculations in previous literature (*Physical Review Letters* 119, 136602 (2017)). Based on the theoretical calculation of carrier relaxation in BAs, there exist two carrier cooling process: (1) t<1 ps, during which electron-phonon coupling domains the energy transfer from electrons to transverse optical (TO) and longitudinal optical (LO) phonons. (2) 1<t<10 ps, long-wavelength LO and TO phonons in BAs remain in near-thermal equilibrium with electrons, while transferring energy therefrom to acoustic modes via 3-phonon processes, through Klemens (decay to two acoustic phonons) and Ridley (decay to one optical and one acoustic phonons) mechanisms. probability of (2) process is very low compared to (1) due to the large acoustic-optical phonon band gap and extend to more than 10 ps. Thus, in the period of measurement within 10 ps with the excitation of 400 nm, hot carriers are likely to dominate the signal.

8. Auger Recombination's Influence on Carrier Diffusion

Figures 29A, 29B, 29C:
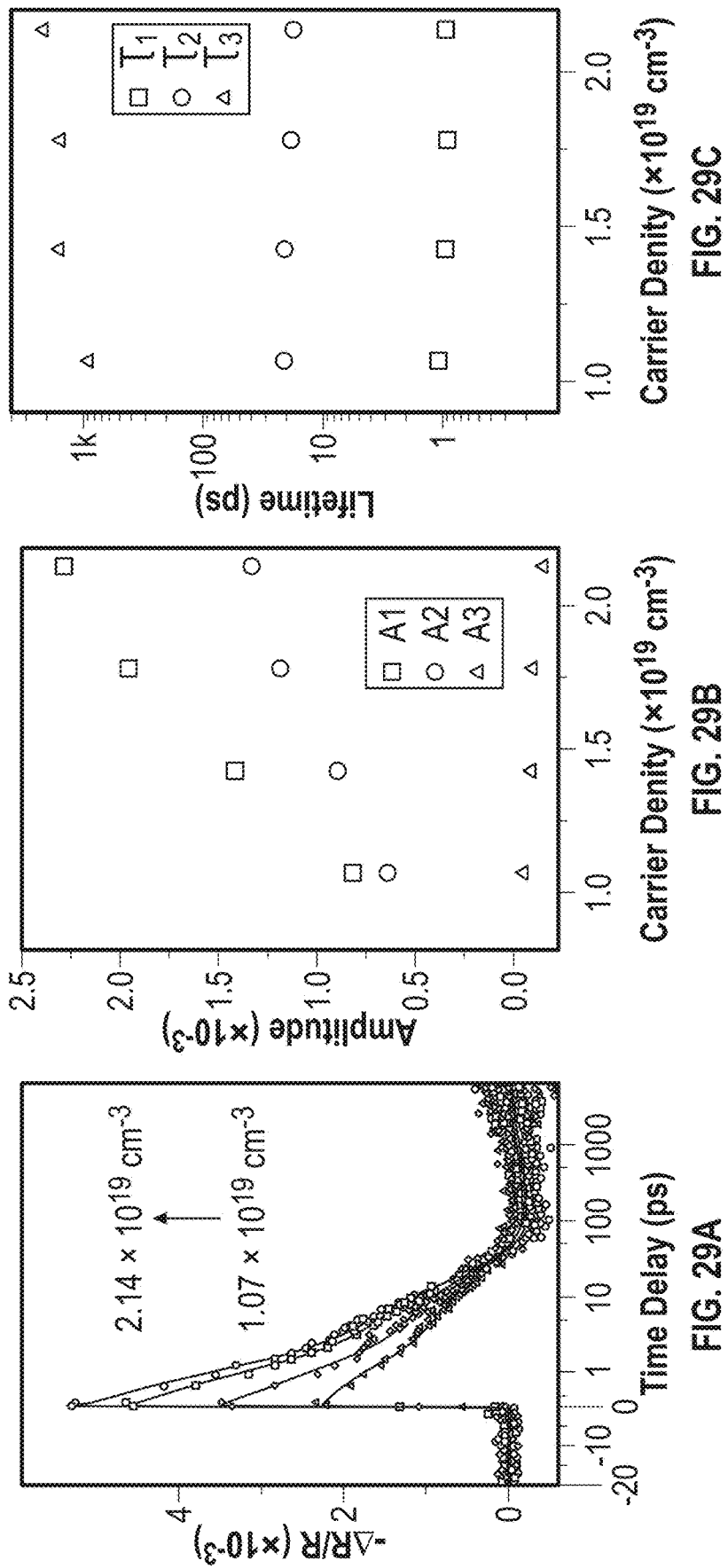
FIGS. 29A-29C depict estimation of Auger recombination contributions to carrier diffusion.

Power-dependent dynamics were measured with the probe wavelength of 585 nm to figure out whether nonlinear processes like Auger recombination have influence on the carrier diffusion excited by 400 nm laser. The dynamics for different carrier density are shown in FIG. 29. The carrier density varied from 1.07 to 2.14×10$^{19}$ cm$^{-3}$, and the transient reflection dynamics were fitted by tri-exponential fitting. A slow decay was found from 1.1 ps to 0.91 ps in lifetime $\tau_1$, from 21 ps to 17 ps (about 0.77 times) in lifetime $\tau_2$, and from 917 ps to 2111 ps in lifetime $\tau_3$, rather than a $3^{rd}$ decay relate to carrier density (dn/dt∝−$\gamma_{Auger}$n$^3$), indicating that the Auger recombination effect could be neglected here.

9. Surface Recombination's Influence on Carrier Diffusion

As reported by A. J. Sabbah and D. M. Riffe (*Journal of Applied Physics* 88, 6954-6956 (2000)). Surface recombination effect had been considered to have a significant impact in the investigation of carrier diffusion along the depth direction. However, here, only measured was the diffusion parallel to the surface, which will not be affected by the defect-induced carrier recombination according to previous review article (*Annual Review of Physical Chemistry* 71, 1-30 (2020)). As reported by Naomi S. Ginsberg et al., the diffusion equation with linear decay had been calculated analytically as follows.

The probability density distribution n along the surface is given by:

$$\frac{\partial n(x, y, z, t)}{\partial t} = D\left(\frac{\partial^2 n(x, t)}{\partial x^2} + \frac{\partial^2 n(y, t)}{\partial y^2} + \frac{\partial^2 n(z, t)}{\partial z^2}\right) - \frac{n(x, y, z, t)}{\tau} \quad (31)$$

where D is the diffusivity in the x and y direction and $\tau$ is the natural decay lifetime of the species, which is correspond to the carrier recombination induced by defects. If the initial distribution of energy carriers at t=0 was a $\delta$ function, the distribution at any later time t would be a Gaussian function of the form:

$$n(x, y, t)|_{\delta(t=0)} = e^{\left(-\frac{t}{\tau}\right)} \frac{1}{\left(\sqrt{4\pi Dt}\right)^3} \exp\left[-\frac{x^2 + y^2 + z^2}{4Dt}\right] \quad (32)$$

As shown in equation (32), the lifetime shorten part (1/$\tau$) could be separated from the carrier diffusion equation. Therefore, all positions across the carrier density profile decrease the same relative amount leading no effect on the carrier mobility considering the homogenous distributed traps.

10. Carrier Density Calculation

The carrier densities were calculated based on the power density considering the penetration depth and reflectivity of BAs. It follows the procedure described below.

I. Power of pump beam was measured with a Laser power meter (FieldMate, Coherent), an OD=1 density attenuator was preset to attenuate the pump laser during the transient reflection measurement. In the process of power measurement, the attenuator was removed to get a measurable value. The power after objective lens was measured directly and further divided by 10. Energy of single pulse was calculated by diving a repetition rate of 500 Hz. In FIG. 22, the power of laser beam is 0.05 W with the energy of single pulse of 0.1 nJ.

II. The number of photons was calculated by diving the energy of per pulse by the energy of single photons, which is 2.06 eV for 600 nm laser, about $3.3 \times 10^{-19}$ J. The energy of 0.1 nJ corresponds to $3 \times 10^8$ photons. Considering the reflectivity of 0.33 at 600 nm (*Appl. Phys. Lett.* 116, 141903 (2020)), the number of absorbed photons is $2 \times 10^8$.

Figure 25B:
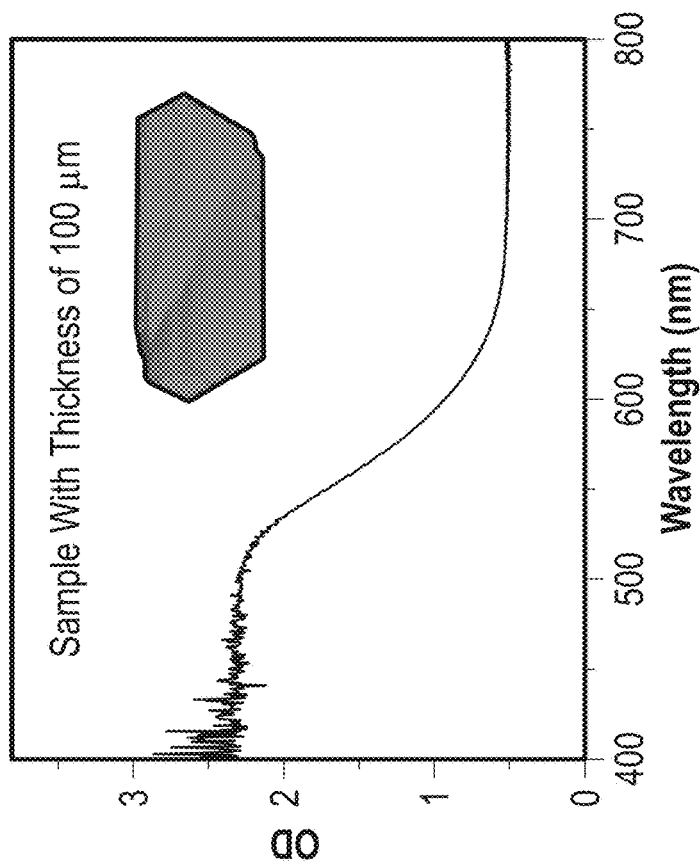
FIGS. 25A-25B depict carrier density measurement.
Figure 25A:
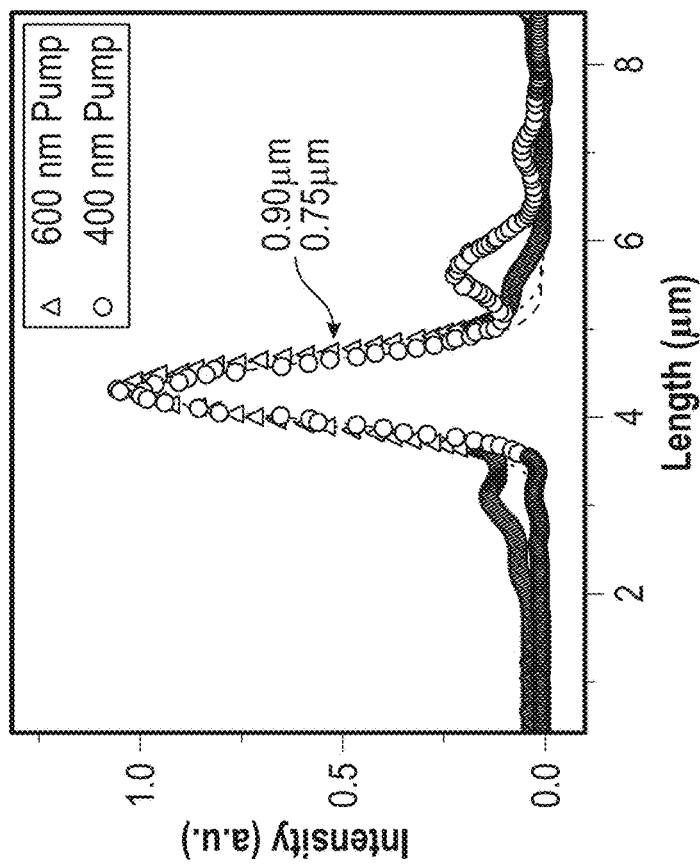

III. The diameter of the pump beam was measured in the CMOS just by removing the long-pass optical filter. Profile of the beam was fitted by a gaussian function, full width half maximum (FWHM) was used to calculate the photons distribution area (FIG. 25). The FWHM of 600 nm pump laser in FIG. 22 is 0.9 µm., corresponding to an area of 0.636 µm$^2$.

IV. Penetration depth was obtained from the absorption and reflectivity spectra of a sample with a known thickness of 100 um and a transmittance of $10^{-0.91}=0.127$ at 600 nm (FIG. 25). Reflectivity of 0.33 is reported by Bai et al. (*Appl. Phys. Lett.* 116, 141903 (2020)), thus the absorption coefficient is 0.127/(1−0.33)=0.1666. Considering Beer-Lambert law provides $e^{-\alpha \times 100 \ \mu m} = 0.1666$ and a penetration depth(1/$\alpha$) of 60 µm.

V. The carrier distribution was simplified to be a cylinder with the volume calculated to be the photons distribution area multiplied by the penetration depth, which is $0.636 \times 60$ µm$^3$=38.16 µm$^3$.

VI. Dividing the number of photons ($2 \times 10^8$) by the volume of carriers' distribution (38.16 µm$^3$), the carrier density of $5.2 \times 10^{18}$ cm$^{-3}$ is obtained. Photo-carriers conversion efficiency of 100% was estimated.

The other carrier density values in this Example 2 were also calculated with the same procedure.

Certain embodiments of the present disclosure may include some, all, or none of the above advantages and/or one or more other advantages readily apparent to those skilled in the art from the drawings, descriptions, and claims included herein. Moreover, while specific advantages have been enumerated above, the various embodiments of the present disclosure may include all, some, or none of the enumerated advantages and/or other advantages not specifically enumerated above.

The phrases "in an embodiment," "in embodiments," "in various embodiments," "in some embodiments," or "in other embodiments" may each refer to one or more of the same or different embodiments in accordance with the present disclosure. The phrases "in an aspect," "in aspects," "in various aspects," "in some aspects," or "in other aspects" may each refer to one or more of the same or different aspects in accordance with the present disclosure. A phrase in the form "A or B" means "(A), (B), or (A and B)." A phrase in the form "at least one of A, B, or C" means "(A); (B); (C); (A and B); (A and C); (B and C); or (A, B, and C)."

It should be understood that the foregoing description is only illustrative of the present disclosure. Various alternatives and modifications can be devised by those skilled in the art without departing from the disclosure. Accordingly, the present disclosure is intended to embrace all such alternatives, modifications, and variances. The embodiments described with reference to the attached drawing figures are presented only to demonstrate certain examples of the disclosure. Other elements, steps, methods, and techniques that are insubstantially different from those described above and/or in the appended claims are also intended to be within the scope of the disclosure.

ADDITIONAL DISCLOSURE

The following are non-limiting, specific embodiments in accordance with the present disclosure:

In a first embodiment, cubic boron arsenide (c-BAs) single crystals comprise an ambipolar mobility at room temperature, $\mu_a$, at one or more locations thereof that is greater than or equal to 1500, 1600, 1700, 1800, 1900, 2000, 2100, 2200, 2300, 2400, 2500, 2600, 3000, 4000, 5000, 6000, 7000, 8000, 9000, or 10000 cm$^2$V$^{-1}$s$^{-1}$, wherein the ambipolar mobility is defined as: $\mu_a = 2\mu_e\mu_h/(\mu_e+\mu_h)$, and/or a room temperature thermal conductivity at the one or more locations thereof that is greater than or equal to 1000 Wm$^{-1}$K$^{-1}$, wherein $\mu_e$ is electron mobility and $\mu_h$ is hole mobility.

A second embodiment can include the cubic boron arsenide of the first embodiment, wherein the single crystals have a thickness of greater than or equal to 0.1, 0.2, 0.3, 0.4, 0.5, 0.6, 0.7, 0.8, 0.9, 1, 2, 3, 4, 5, 6, 7, 8, 9, 10, 20, 30, 40, 50, 60, 70, 80, 90, 100, 200, 300, 400, 500, 600, 700, 800, 900, 1000, 2000, 3000, 4000, 5000, 6000, 7000, 8000, 9000, or 10000 micrometers (µm).

A third embodiment can include the cubic boron arsenide of the first or the second embodiment, wherein the hole mobility, $\mu_h$, is greater than or equal to 1000, 2000, 3000, 4000, 5000, 6000, 7000, 8000, 9000, 10000, or 20000 cm$^2$V$^{-1}$s$^{-1}$.

A fourth embodiment can include the cubic boron arsenide of any one of the first to third embodiments, wherein the electron mobility, $\mu_e$, is greater than or equal to 1000, 2000, 3000, 4000, 5000, 6000, 7000, 8000, 9000, or 10000 cm$^2$V$^{-1}$s$^{-1}$.

A fifth embodiment can include the cubic boron arsenide of any one of the first to fourth embodiments, wherein an ambipolar diffusion coefficient, $D_a$, at the one or more locations is greater than or equal to 40, 50, 60, 70, 80, 90, 100, 200, 300, 400, or 500 cm$^2$s$^{-1}$, wherein $D_a$ is determined as: $D_a=K_BT\mu_a/e$, wherein $K_B$ is the Boltzmann constant, e is the elementary charge, and T is the absolute temperature.

A sixth embodiment can include the cubic boron arsenide of any one of the first to fifth embodiments, comprising less than or equal to about 10$^{18}$ cm$^{-3}$ carriers (e.g., neutral impurities).

A seventh embodiment can include the cubic boron arsenide of any one of the first to fifth embodiments comprising less than or equal to about 10$^{16}$ cm$^{-3}$ carriers (e.g., charged impurities).

An eighth embodiment can include the cubic boron arsenide of any one of the first to seventh embodiments, wherein the room temperature thermal conductivity at the one or more locations is greater than or equal to 1000, 1100, 1200, 1300, 1400, 1500, 1600, 1700, 1800, 1900, 2000, 2100, 2200, 2300, 2400, 2500, or 2600 Wm$^{-1}$K$^{-1}$, and/or in a range of from 1000 to 2600 Wm$^{-1}$K$^{-1}$, from 1100 to 2000 Wm$^{-1}$K$^{-1}$ or from 1200 to 1500 Wm$^{-1}$K$^{-1}$.

A ninth embodiment can include the cubic boron arsenide of any one of the first to eighth embodiments, wherein the one or more locations comprise a corner facet and/or an interior/center of a sidewall perpendicular to a (111) growth surface of the crystal.

A tenth embodiment can include the cubic boron arsenide of any one of the first to ninth embodiments, wherein a bulk ambipolar mobility of the one or more crystals is greater than or equal to about 1000, 2000, 5000, or 10000 cm$^2$V$^{-1}$s$^{-1}$.

In an eleventh embodiment, a method of producing one or more cubic boron arsenide (c-BAs) single crystals, comprises: producing, during a first chemical vapor transport (CVT) process, single BAs crystals using a purified boron (B) source and a purified arsenic (As) source; and using at least a portion of the single BAs crystals or purified B and As to produce a c-BAs single crystal via a second CVT process, such that a number of nucleation centers is controlled during the second CVT process, wherein the one or more crystals have a room temperature, ambipolar mobility, $\mu_a$, at one or more locations thereof that is greater than or equal to 1500, 1600, 1700, 1800, 1900, 2000, 2100, 2200, 2300, 2400, 2500, 2600, 3000, 4000, 5000, 6000, 7000, 8000,9000, or 10000 cm$^2$V$^{-1}$s$^{-1}$, and/or a room temperature thermal conductivity at the one or more locations thereof that is greater than or equal to 1000 Wm$^{-1}$K$^{-1}$, wherein the ambipolar mobility is defined as: $\mu_a=2\mu_e\mu_h/(\mu_e+\mu_h)$, wherein $\mu_e$ is electron mobility and $\mu_h$ is hole mobility.

A twelfth embodiment can include the method of the eleventh embodiment further comprising: purifying a boron (B) source and an arsenic source to provide the purified B source and the purified As source.

A thirteenth embodiment can include the method of the eleventh embodiment, wherein the single BAs crystals have a lateral dimension of less than or equal to 0.1, 0.2, 0.3, 0.4, 0.5, 0.6, 0.7, 0.8, 0.9, 1, 2, 3, 4, 5, 6, 7, 8, 9, 10, 20, 30, 40, 50, 60, 70, 80, 90, 100, 200, 300, 400, 500, 600, 700, 800, 900. 1000, 2000, 3000, 4000, 5000, 6000, 7000, 8000, 9000, or 10000 micrometers (μm).

A fourteenth embodiment can include the method of any one of the eleventh or twelfth embodiments further comprising: increasing a CVT growth time during the second CVT process to increase the crystal size of the bulk c-BAs crystal.

A fifteenth embodiment can include the method of any one of the eleventh to fourteenth embodiments, wherein the bulk c-BAs crystal has a size sufficient for evaluation via transport measurement techniques.

A sixteenth embodiment can include the method of any one of the eleventh top fifteenth embodiments, wherein the bulk c-BAs crystal has a size of at least about 4×2×1 millimeters.

A seventeenth embodiment can include the method of any one of the eleventh to sixteenth embodiments, wherein the first CVT process comprises growing the single BAs crystals in a tube furnace with a temperature gradient for vapor transport.

An eighteenth embodiment can include the method of the seventeenth embodiment, wherein the first CVT process further comprises positioning the purified B source, the purified As source, and iodine (I$_2$) at a source side of a fused quartz tube and seed material at the other side of the tube, a seed side, to serve as seed crystals.

A nineteenth embodiment can include the method of the eighteenth embodiment, wherein the seed material comprises gallium arsenide (GaAs), boron nitride (BN), glass fiber, or a combination thereof.

A twentieth embodiment can include the method of any one of the eighteenth or nineteenth embodiments, wherein a ratio of arsenic to iodine (As:I) is from about 5:1 to about 50:1, or from about 5:1 to about 20:1.

A twenty first embodiment can include the method of any one of the eighteenth to twentieth embodiments further comprising: sealing the quartz tube under vacuum and placing the sealed quartz tube in the tube furnace.

A twenty second embodiment can include the method of the twenty first embodiment, wherein the vacuum comprises a pressure of less than or equal to 10$^{-4}$ Torr.

A twenty third embodiment can include the method of any one of the seventeenth to twenty second embodiments, wherein the tube furnace is a horizontal tube furnace.

A twenty fourth embodiment can include the method of any one of the seventeenth to twenty third embodiments, wherein the first CVT process further comprises: establishing and maintaining the temperature gradient by setting the seed side of the tube at a lower temperature zone of the furnace at a fixed temperature in a range of from about 650° C. to about 900° C. (e.g., 790° C.) and the source side at a higher temperature zone of the furnace at a fixed temperature in a range of from about 800° C. to 1000° C. (e.g., 890° C.).

A twenty fifth embodiment can include the method of the twenty fourth embodiment, wherein the second CVT process is the same as the first CVT process, except for the use of the single BAs crystals from the first CVT process at the source side of the sealed quartz tube in place of the purified boron source. Alternatively, in embodiments, a purified B source can be utilized.

A twenty sixth embodiment can include the method of the twenty fifth embodiment further comprising: optimizing seed crystal quality and distribution during the second growth period to obtain the bulk c-BAs crystals.

A twenty seventh embodiment can include the method of any one of the twenty fifth or twenty sixth embodiments, wherein the second CVT process comprises: removing single BAs crystals (e.g., from the seed side) after the first CVT process; cleaning the removed single BAs crystals; and selecting highest quality BAs crystals for positioning in (e.g., on the source side of) the quartz tube during the second CVT process.

A twenty eighth embodiment can include the method of the twenty seventh embodiment, wherein cleaning the BAs crystals comprises: washing with nitric acid, aqua regia, or both; and/or rinsing with an alcohol, deionized water, or both, wherein the washing, the rinsing, or both are adjusted to minimize a number of defects and/or impurities in the bulk c-BAs crystals.

A twenty ninth embodiment can include the method of any one of the twenty fifth to twenty eighth embodiments, wherein the first CVT process, the second CVT process, or both comprise a time duration of about 1-100 days.

A thirtieth embodiment can include the method of any one of the eleventh to twenty ninth embodiments, wherein the second CVT process comprises selecting less than about 5 of the single BAs crystals produced (e.g., on a seed side) during the first CVT process in (e.g., on a source side of) a quartz tube during the second CVT process.

A thirty first embodiment can include the method of the thirtieth embodiment, wherein the single BAs crystals (e.g., from the seed side of the quartz tube) that are utilized during the second CVT process are positioned a specific distance apart (e.g., on the source side of the quartz tube) for the second CVT process.

A thirty second embodiment can include the method of the thirty first embodiment, wherein two of the single BAs crystals (e.g., from the seed side of the quartz tube) obtained via the first CVT process are utilized (e.g., on the source side) during the second CVT process.

A thirty third embodiment can include the method of the thirty second embodiment, wherein the specific distance apart comprises about 0.5, 1, or 2 centimeters (cm).

A thirty fourth embodiment can include the method of any one of the eleventh to thirty third embodiments, wherein the first CVT process includes a first growth period for a first time duration, and/or the wherein second CVT process includes a second growth period for a second time duration.

A thirty fifth embodiment can include the method of the thirty fourth embodiment, wherein the first time duration, the second time duration, or both comprise from about one to about one hundred days (e.g., three weeks).

In a thirty sixth embodiment, a semiconductor, electronic or optoelectronic device comprises: cubic boron arsenide (c-BAs) comprising single crystals having a room temperature ambipolar mobility, $\mu_a$, at one or more locations thereof that is greater than or equal to about 1500, 1600, 1700, 1800, 1900, 2000, 2100, 2200, 2300, 2400, 2500, 2600, 3000, 4000, 5000, 6000, 7000, 8000, 9000, or 10000 $cm^2V^{-1}s^{-1}$, and/or a room temperature thermal conductivity at the one or more locations thereof that is greater than or equal to 1000 $Wm^{-1}K^{-1}$, wherein the ambipolar mobility is defined as: $\mu_a=2\mu_e\mu_h/(\mu_e+\mu_h)$, wherein $\mu_e$ is electron mobility and $\mu_h$ is hole mobility.

A thirty seventh embodiment can include the device of the thirty sixth embodiment, wherein the c-BAs is utilized in an electronics system of the device.

In a thirty eighth embodiment, a process comprises: utilizing BAs single crystals as recited or produced via any of the prior embodiments in an electronic or optoelectronic process, wherein the process has an increased performance (e.g., speed) and/or level of integration relative to a same process operated with silicon, due to the higher ambipolar mobility provided by the BAs single crystals relative to silicon.

While embodiments have been shown and described, modifications thereof can be made by one skilled in the art without departing from the spirit and teachings of this disclosure. The embodiments described herein are exemplary only, and are not intended to be limiting. Many variations and modifications of the embodiments disclosed herein are possible and are within the scope of this disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: R=Rl+k*(Ru−Rl), wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of broader terms such as comprises, includes, having, etc. should be understood to provide support for narrower terms such as consisting of, consisting essentially of, comprised substantially of, etc. When a feature is described as "optional," both embodiments with this feature and embodiments without this feature are disclosed. Similarly, the present disclosure contemplates embodiments where this "optional" feature is required and embodiments where this feature is specifically excluded. The term "about" can mean within ±10%.

Accordingly, the scope of protection is not limited by the description set out above but is only limited by the claims which follow, that scope including all equivalents of the subject matter of the claims. Each and every claim is incorporated into the specification as embodiments of the present disclosure. Thus, the claims are a further description and are an addition to the embodiments of the present disclosure. The discussion of a reference herein is not an admission that it is prior art, especially any reference that can have a publication date after the priority date of this application. The disclosures of all patents, patent applications, and publications cited herein are hereby incorporated by reference, to the extent that they provide exemplary, procedural, or other details supplementary to those set forth herein.

What is claimed is:

1. Cubic boron arsenide (c-BAs) single crystals having an ambipolar mobility at room temperature, $\mu_a$, at one or more locations thereof that is greater than or equal to 1500 $cm^2V^{-1}s^{-1}$, and a room temperature thermal conductivity at the one or more locations thereof that is greater than or equal to 1000 $Wm^{-1}K^{-1}$, wherein the ambipolar mobility is defined as:
$\mu_a=2\mu_e\mu_h/(\mu_e+\mu_h)$, wherein $\mu_e$ is electron mobility and $\mu_h$ is hole mobility;

wherein an ambipolar diffusion coefficient, $D_a$, at the one or more locations is greater than or equal to 40 cm²s⁻¹, wherein $D_a$ is determined as:

$$D_a = K_B T \mu_a / e,$$

wherein $K_B$ is the Boltzmann constant, e is the elementary charge, and T is the absolute temperature.

2. The c-BAs single crystals of claim 1 comprising less than or equal to $10^{18}$ cm⁻³ neutral impurities and/or comprising less than or equal to $10^{16}$ cm⁻³ charged impurities.

3. The c-BAs single crystals of claim 1, wherein the ambipolar mobility at the one or more locations is greater than or equal to 1700 cm²V⁻¹s⁻¹.

4. A method of producing one or more cubic boron arsenide (c-BAs) single crystals, the method comprising:
producing, during a first chemical vapor transport (CVT) process, single BAs crystals using a purified boron (B) source and a purified arsenic (As) source, wherein the purified B source comprises B with a purity of at least 99.9 weight percent (wt %), and wherein the purified As source comprises As with a purity of at least 99.9 wt %; and
using at least a portion of the single BAs crystals or purified B and As to produce a c-BAs single crystal via a second CVT process, such that a number of nucleation centers is controlled during the second CVT process,
wherein the c-BAs single crystal has a room temperature, ambipolar mobility, $\mu_a$, at one or more locations thereof that is greater than or equal to 1500 cm²V⁻¹s⁻¹, wherein the ambipolar mobility is defined as:
$\mu_a = 2\mu_e\mu_h/(\mu_e+\mu_h)$, wherein $\mu_e$ is electron mobility and $\mu_h$ is hole mobility,
wherein the c-BAs single crystal has a room temperature thermal conductivity at the one or more locations that is greater than or equal to 1000 Wm⁻¹K⁻¹, and
wherein the c-BAs single crystal has an ambipolar diffusion coefficient, $D_a$, at the one or more locations that is greater than or equal to 40 cm²s⁻¹, wherein $D_a$ is determined as:
$D_a = K_B T \mu_a / e$, wherein $K_B$ is the Boltzmann constant, e is the elementary charge, and T is the absolute temperature.

5. The method of claim 4 further comprising:
purifying a boron (B) source and an arsenic source to provide the purified B source and the purified As source.

6. The method of claim 4 further comprising: increasing a CVT growth time during the second CVT process to increase a crystal size of the c-BAs single crystal.

7. The method of claim 4, wherein the first CVT process comprises growing the single BAs crystals in a tube furnace with a temperature gradient for vapor transport.

8. The method of claim 7, wherein the first CVT process further comprises positioning the purified B source, the purified As source, and iodine (I₂) at a source side of a fused quartz tube and seed material at another side of the tube, a seed side, to serve as seed crystals.

9. The method of claim 7, wherein the first CVT process further comprises: establishing and maintaining the temperature gradient by setting the seed side of the tube at a lower temperature zone of the furnace at a fixed temperature in a range of from 650° C. to 900° C. and the source side at a higher temperature zone of the furnace at a fixed temperature in a range of from 800° C. to 1000° C.

10. The method of claim 9, wherein the second CVT process is the same as the first CVT process, except for the use of the single BAs crystals from the first CVT process at the source side of the sealed quartz tube in place of the purified boron source.

11. The method of claim 10, wherein the second CVT process comprises:
removing single BAs crystals after the first CVT process;
cleaning the removed single BAs crystals; and
selecting highest quality BAs crystals for positioning in the quartz tube during the second CVT process, wherein the highest quality BAs crystals have a fewest number of defects.

12. The method of claim 11, wherein cleaning the BAs crystals comprises:
washing with nitric acid, aqua regia, or both; and/or
rinsing with an alcohol, deionized water, or both,
wherein the washing, the rinsing, or both are adjusted to minimize a number of defects and/or impurities in the bulk c-BAs crystals.

13. The method of claim 4 wherein the second CVT process comprises selecting less than five of the single BAs crystals produced during the first CVT process on a source side of a quartz tube during the second CVT process.

14. A semiconductor, electronic or optoelectronic device comprising: cubic boron arsenide (c-BAs) comprising single crystals having a room temperature ambipolar mobility, $\mu_a$, at one or more locations thereof that is greater than or equal to 1500 cm²V⁻¹s⁻¹, a room temperature thermal conductivity at the one or more locations that is greater than or equal to 1000 Wm⁻¹K⁻¹, and an ambipolar diffusion coefficient, $D_a$, at the one or more locations is greater than or equal to 40 cm²s⁻¹,
wherein the ambipolar mobility is defined as:
$\mu_a = 2\mu_e\mu_h/(\mu_e+\mu_h)$, wherein $\mu_e$ is electron mobility and $\mu_h$ is hole mobility, and
wherein $D_a$ is determined as:
$D_a = K_B T \mu_a / e$, wherein $K_B$ is the Boltzmann constant, e is the elementary charge, and T is the absolute temperature.

15. The device of claim 14, wherein the c-BAs is utilized in an electronics system of the device.

16. A process comprising:
utilizing c-BAs as recited in claim 1 in an electronic or optoelectronic process, wherein the process has an increased performance and/or level of integration relative to a same process operated with silicon, due to the higher ambipolar mobility provided by the c-BAs relative to an ambipolar mobility of silicon.

17. The c-BAs single crystals of claim 1, having a thickness of greater than or equal to 0.1 micrometers (μm).

18. The c-BAs single crystals of claim 1, wherein the hole mobility, $\mu_h$, is greater than or equal to 1000 cm²V⁻¹s⁻¹.

19. The c-BAs single crystals of claim 1, wherein the electron mobility, $\mu_e$, is greater than or equal to 1000 cm²V⁻¹s⁻¹.

* * * * *